(12) United States Patent
Arai et al.

(10) Patent No.: US 10,868,037 B2
(45) Date of Patent: Dec. 15, 2020

(54) NON-VOLATILE SEMICONDUCTOR MEMORY DEVICE

(71) Applicant: TOSHIBA MEMORY CORPORATION, Tokyo (JP)

(72) Inventors: Fumitaka Arai, Mie (JP); Masakazu Goto, Mie (JP); Masaki Kondo, Mie (JP); Keiji Hosotani, Mie (JP); Nobuyuki Momo, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/502,877

(22) Filed: Jul. 3, 2019

(65) Prior Publication Data
US 2020/0303400 A1    Sep. 24, 2020

(30) Foreign Application Priority Data

Mar. 18, 2019 (JP) .................. 2019-050305

(51) Int. Cl.

| | | |
|---|---|---|
| G11C 16/06 | (2006.01) | |
| H01L 27/11582 | (2017.01) | |
| G11C 16/04 | (2006.01) | |
| G11C 16/26 | (2006.01) | |
| H01L 27/1157 | (2017.01) | |
| H01L 27/11573 | (2017.01) | |
| G11C 16/10 | (2006.01) | |

(Continued)

(52) U.S. Cl.
CPC .... *H01L 27/11582* (2013.01); *G11C 16/0483* (2013.01); *G11C 16/10* (2013.01); *G11C 16/26* (2013.01); *H01L 27/1157* (2013.01); *H01L 27/11573* (2013.01); *G11C 11/5621* (2013.01); *H01L 27/11565* (2013.01)

(58) Field of Classification Search
CPC ......... H01L 27/11582; H01L 27/11573; H01L 27/1157; H01L 27/11565; G11C 16/26; G11C 16/0483; G11C 16/10; G11C 11/5621
USPC ..................................... 365/185.21
See application file for complete search history.

(56) References Cited

U.S. PATENT DOCUMENTS

| | | | |
|---|---|---|---|
| 6,480,419 B2 * | 11/2002 | Lee .............. | G11C 16/10 365/185.18 |
| 7,697,343 B2 * | 4/2010 | Tang ............. | G11C 16/26 365/185.25 |
| 8,654,579 B2 | 2/2014 | Kim et al. | |

(Continued)

FOREIGN PATENT DOCUMENTS

| | | |
|---|---|---|
| JP | 2013-183086 A | 9/2013 |
| JP | 2018-157208 A | 10/2018 |
| TW | 201711206 A | 3/2017 |

*Primary Examiner* — Tha-O H Bui
(74) *Attorney, Agent, or Firm* — Foley & Lardner LLP

(57) ABSTRACT

According to one embodiment, a semiconductor memory device includes: a first interconnecting layer; a first signal line; a first memory cell that stores first information between the first interconnecting layer and the first signal line; second to fourth interconnecting layers provided above the first interconnecting layer; fifth to seventh interconnecting layers disposed apart from the second to fourth interconnecting layers; a second signal line coupled to the first signal line; a third signal line coupled to the first and second signal lines and the sixth interconnecting layer; and, first to fifth transistors.

20 Claims, 45 Drawing Sheets

(51) Int. Cl.
  *G11C 11/56* (2006.01)
  *H01L 27/11565* (2017.01)

(56) References Cited

U.S. PATENT DOCUMENTS

| | | |
|---|---|---|
| 8,766,446 B2 | 7/2014 | Kuge et al. |
| 9,190,156 B2 * | 11/2015 | Sako ............... G11C 16/24 |
| 9,443,907 B2 | 9/2016 | Rabkin et al. |
| 9,502,431 B2 | 11/2016 | Sakuma et al. |
| 9,780,170 B2 | 10/2017 | Ota et al. |
| 9,786,683 B1 | 10/2017 | Sakuma et al. |
| 9,792,996 B1 * | 10/2017 | Date ............... G11C 16/08 |
| 10,043,808 B1 | 8/2018 | Tezuka et al. |
| 10,056,150 B2 | 8/2018 | Ikeda et al. |
| 2009/0268522 A1 * | 10/2009 | Maejima ......... G11C 16/0483 365/185.11 |
| 2015/0262670 A1 | 9/2015 | Hosono |

* cited by examiner

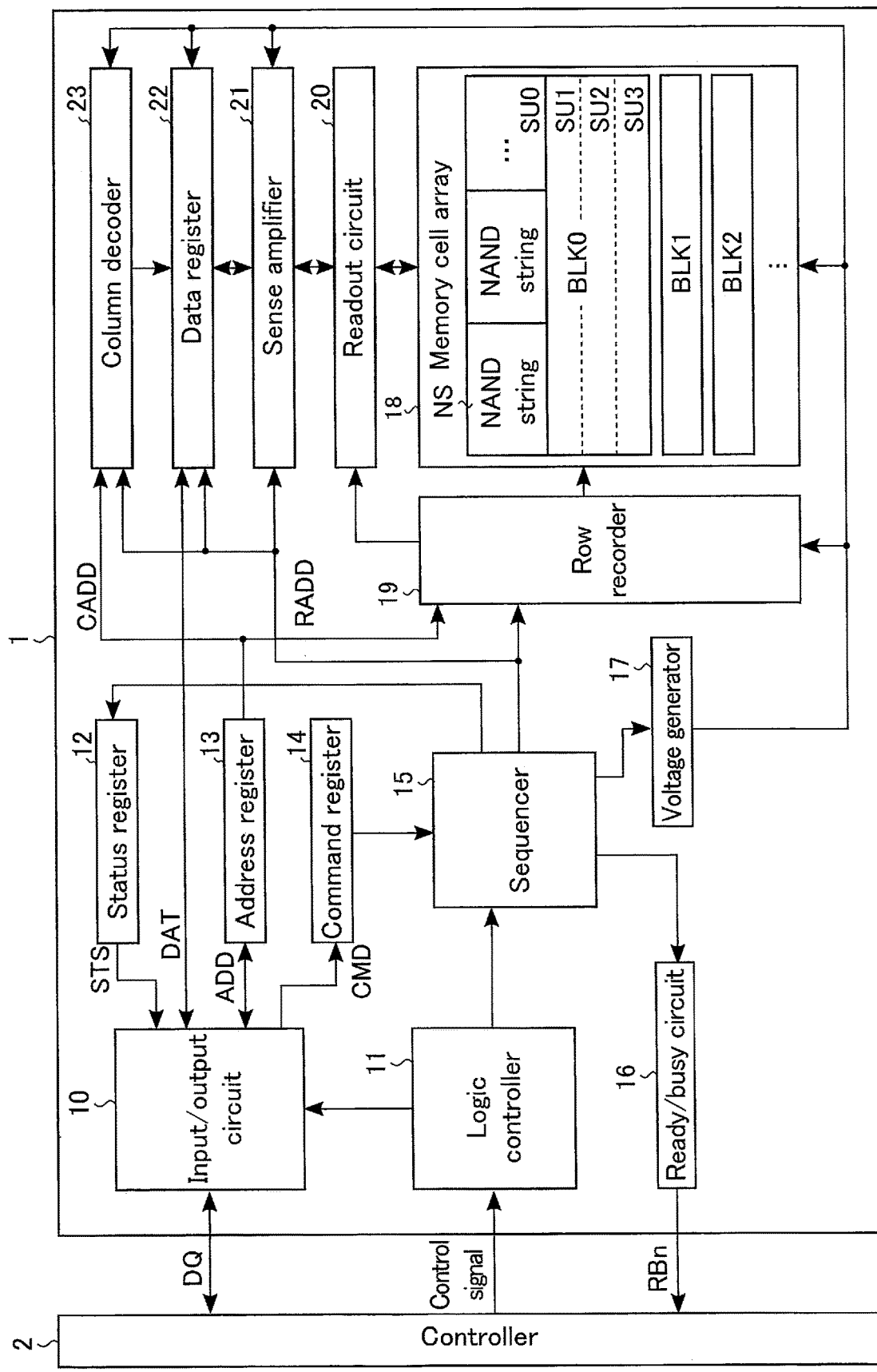
F I G. 1

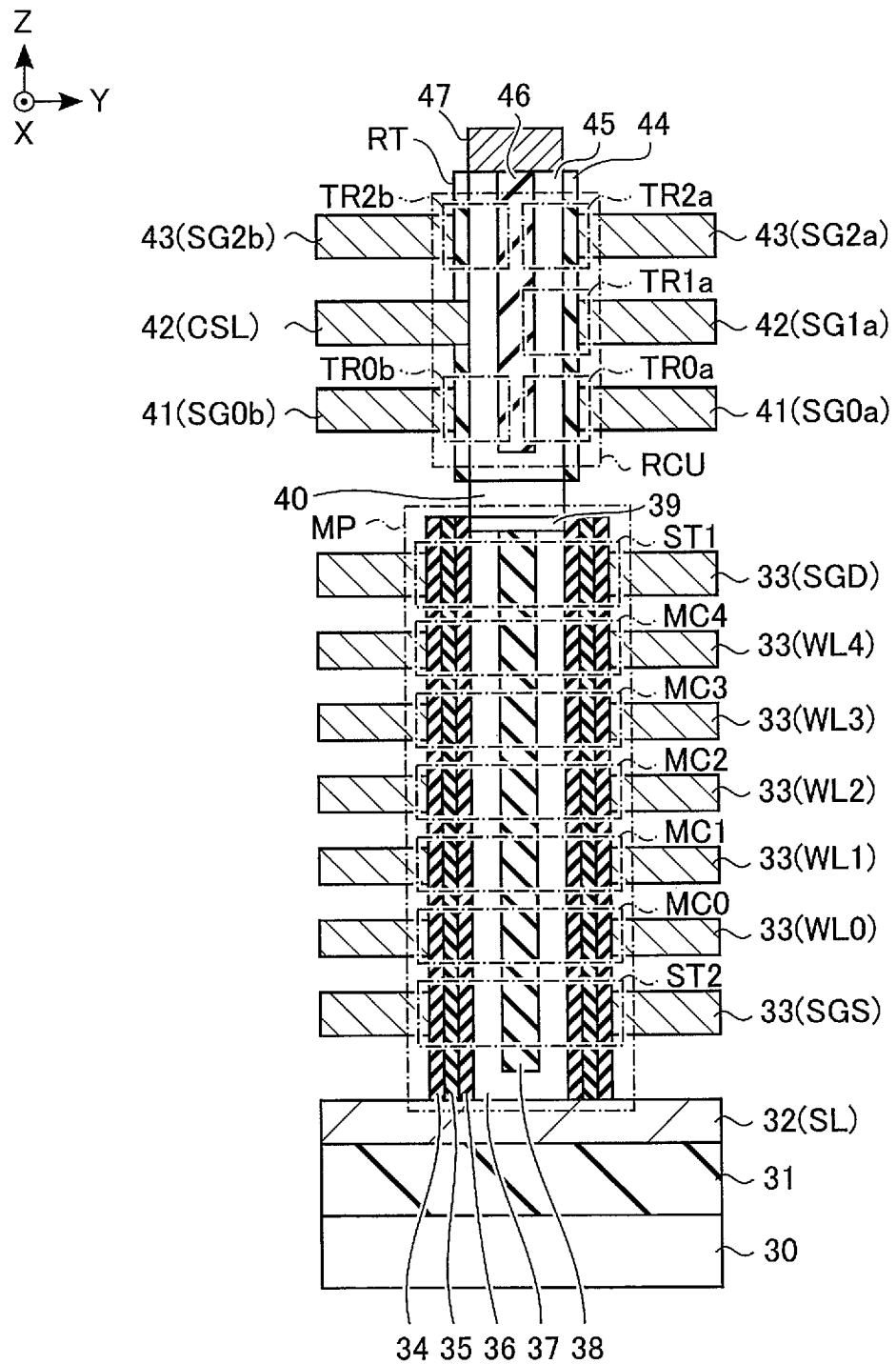
F I G. 3

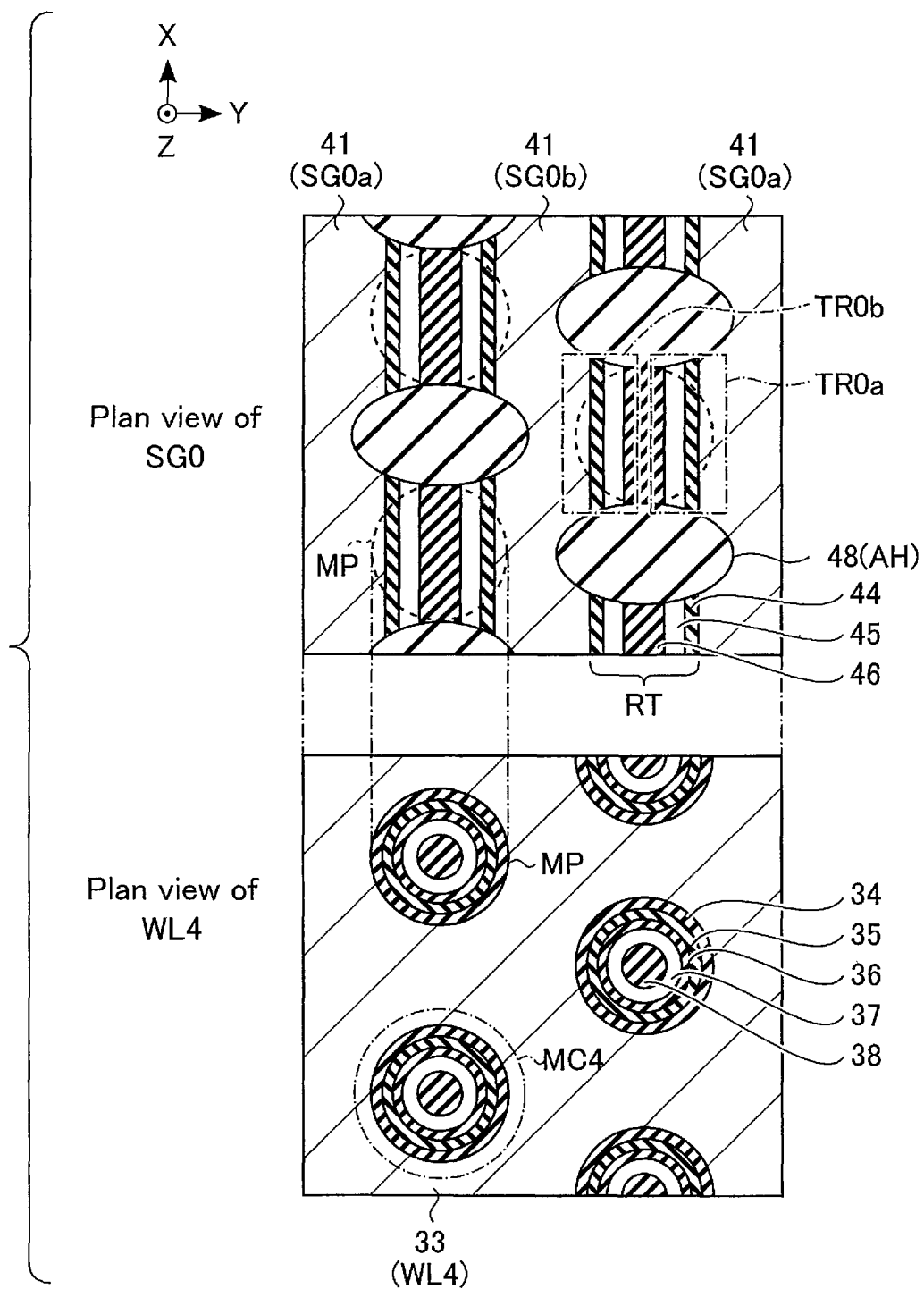
F I G. 4

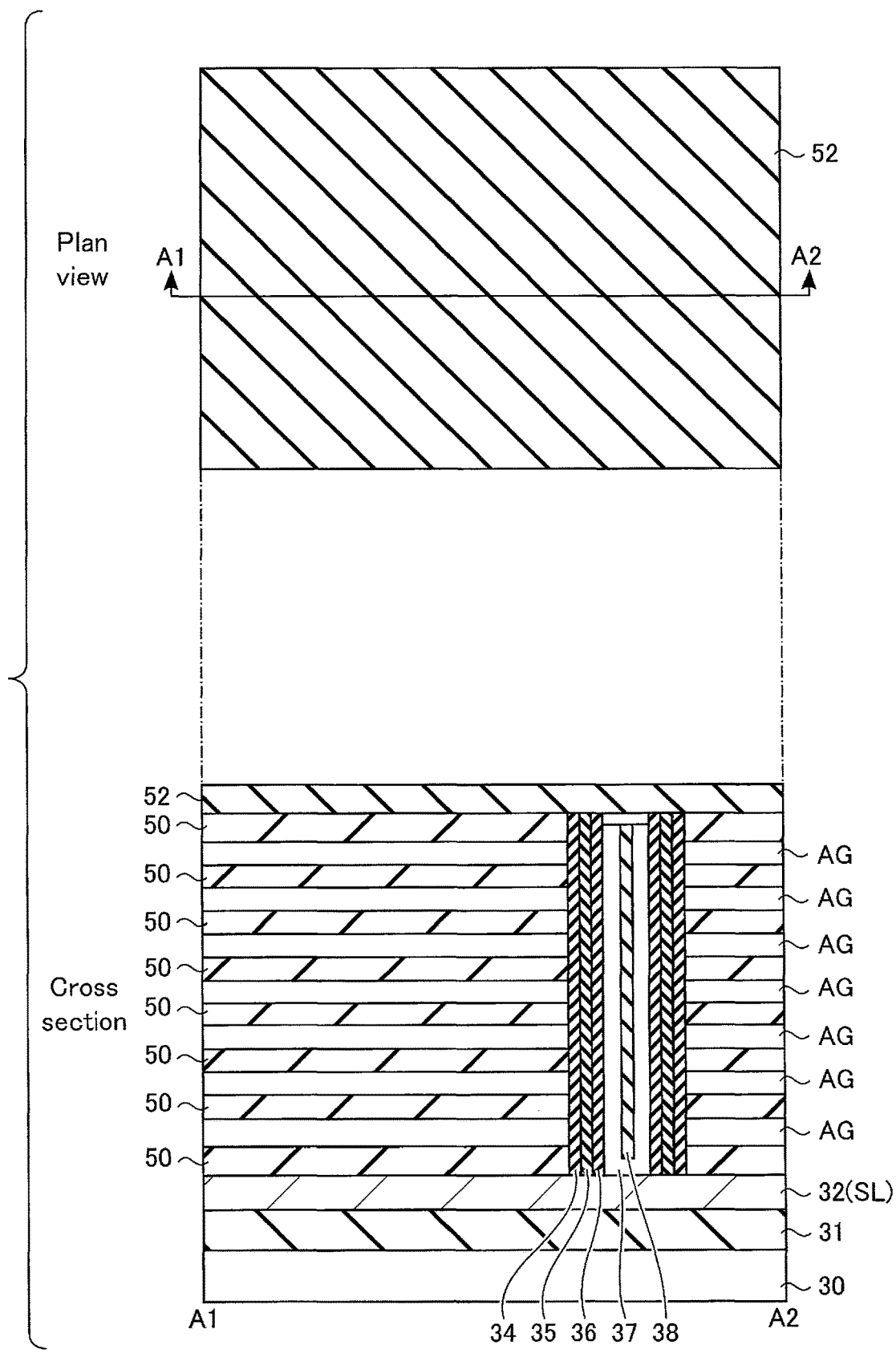
F I G. 8

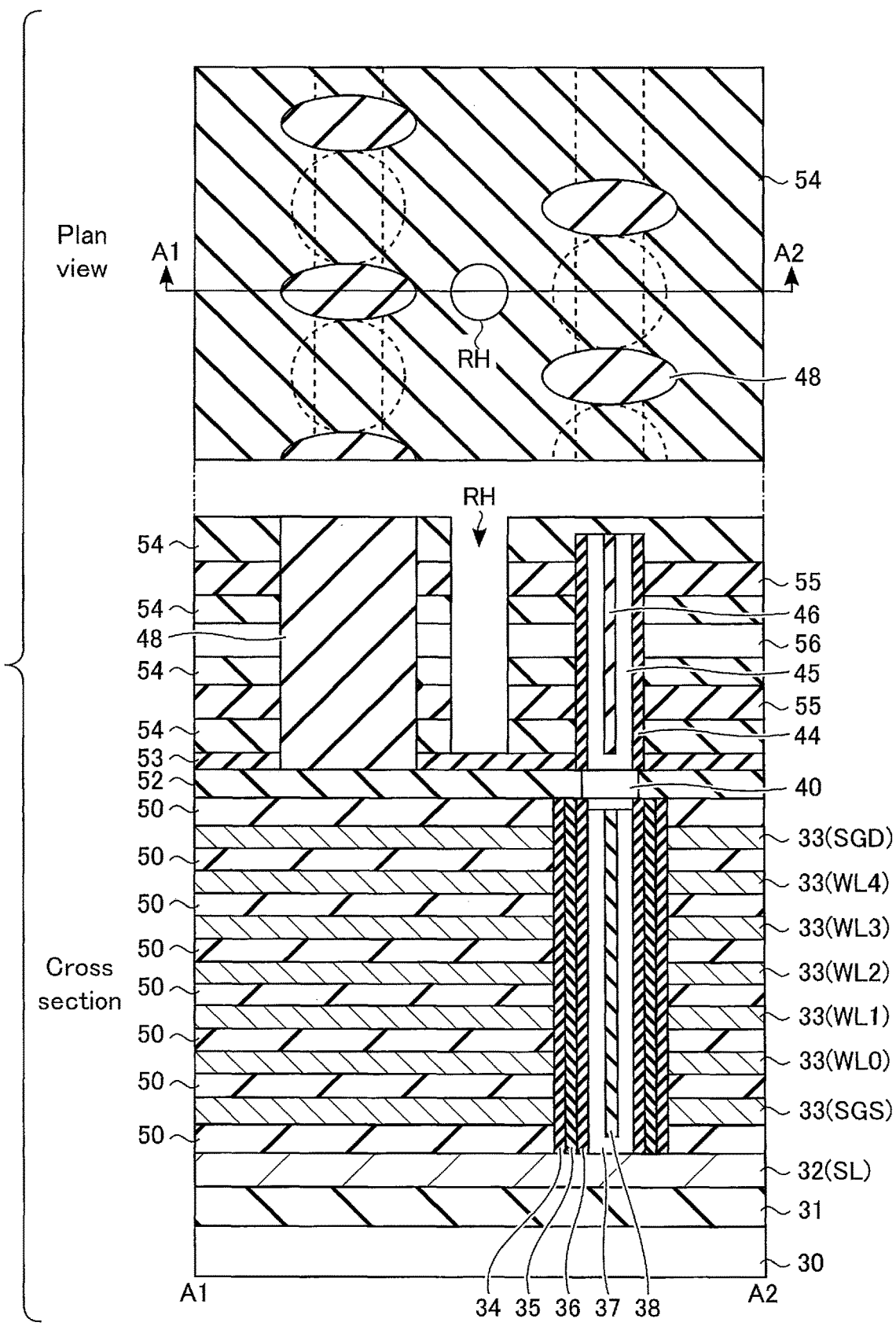
F I G. 13

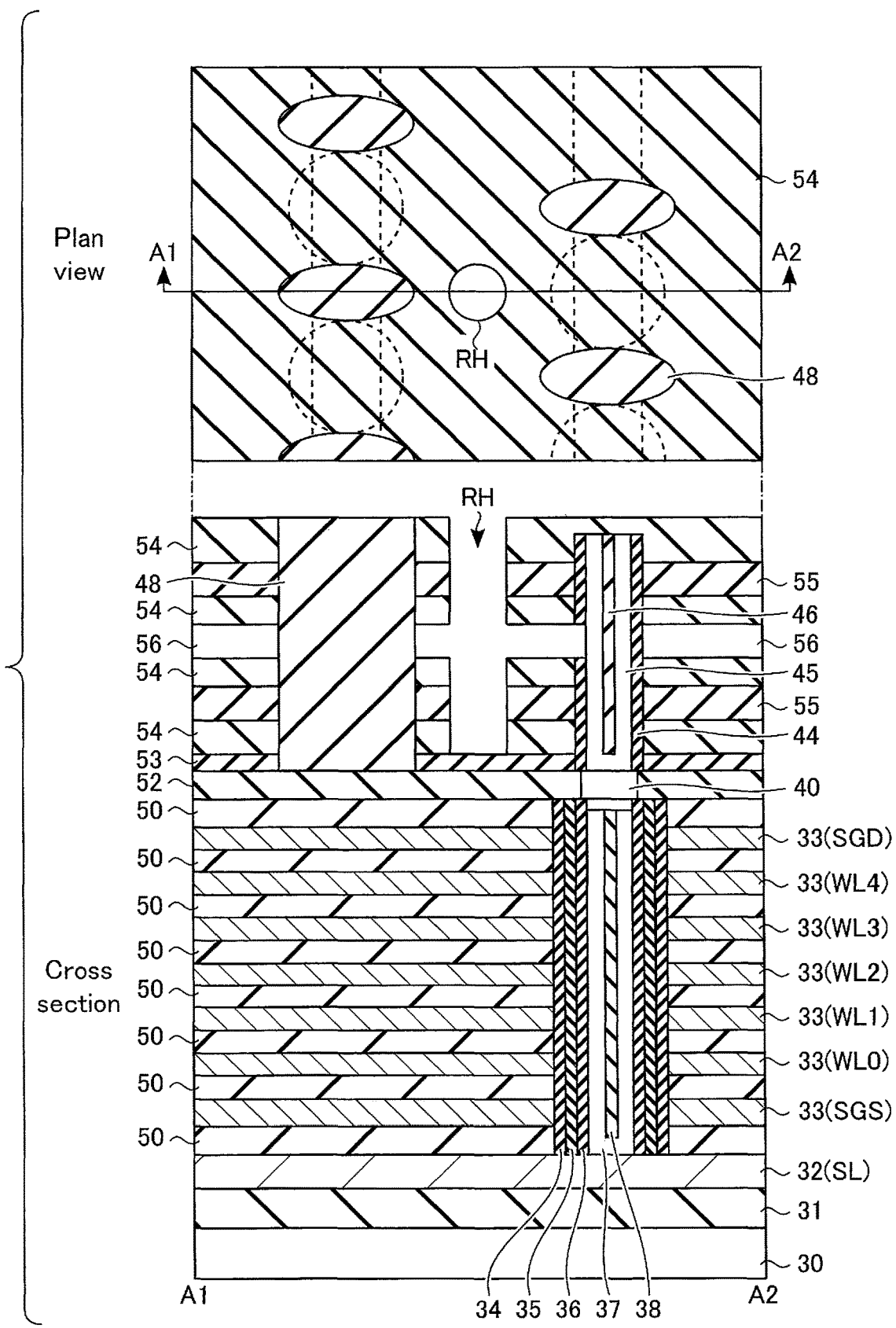
F I G. 14

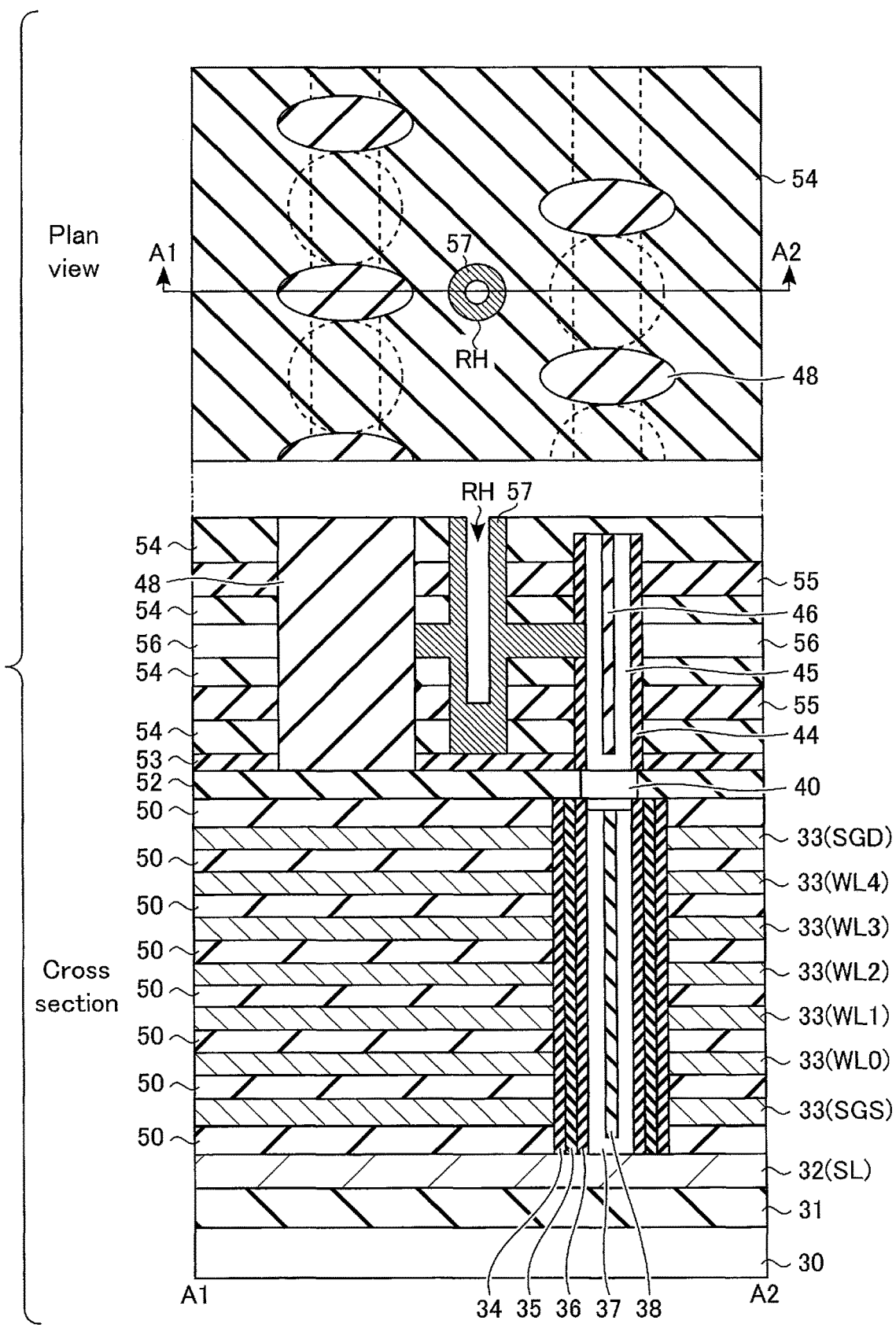
F I G. 15

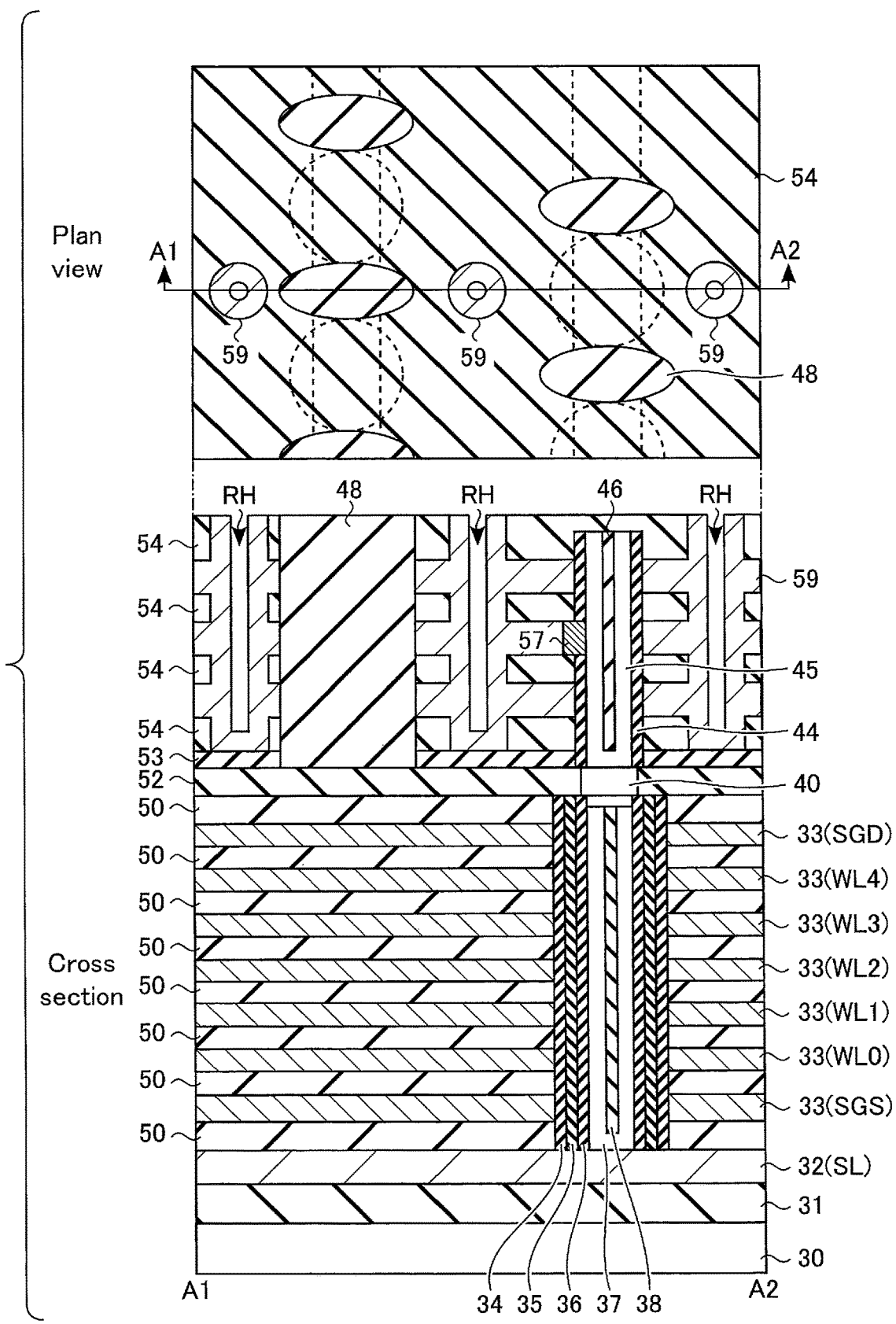
F I G. 21

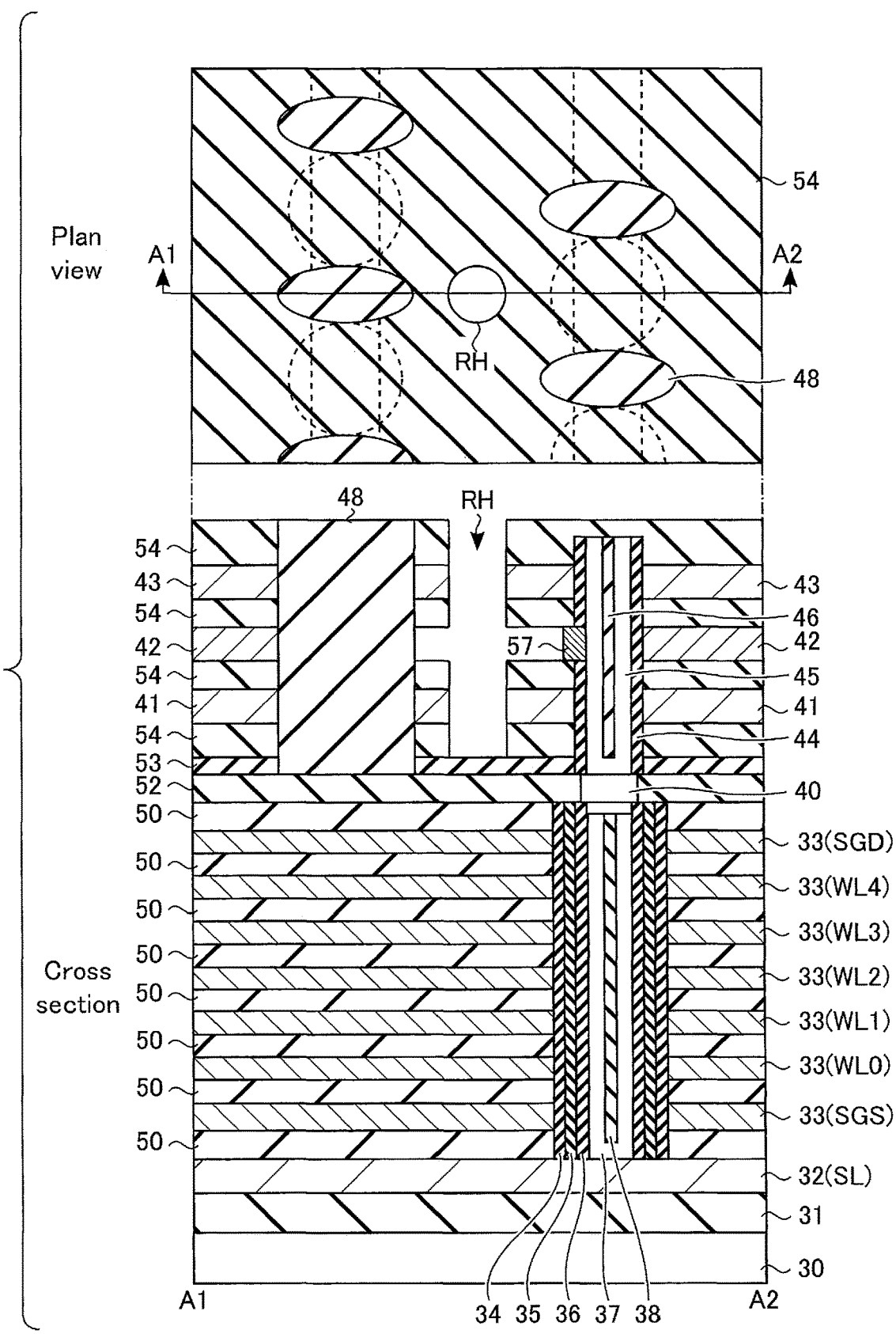
F I G. 29

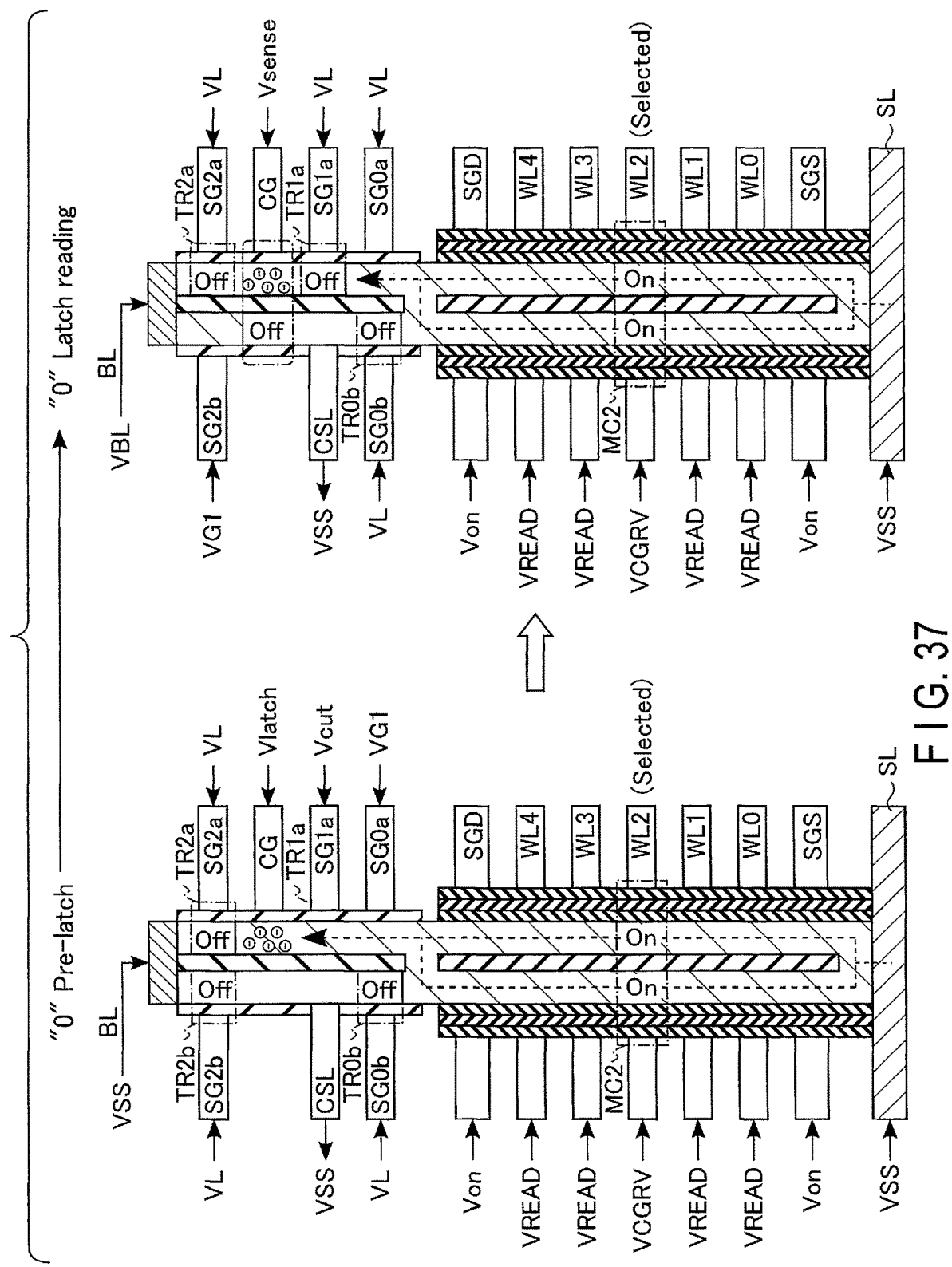
F I G. 37

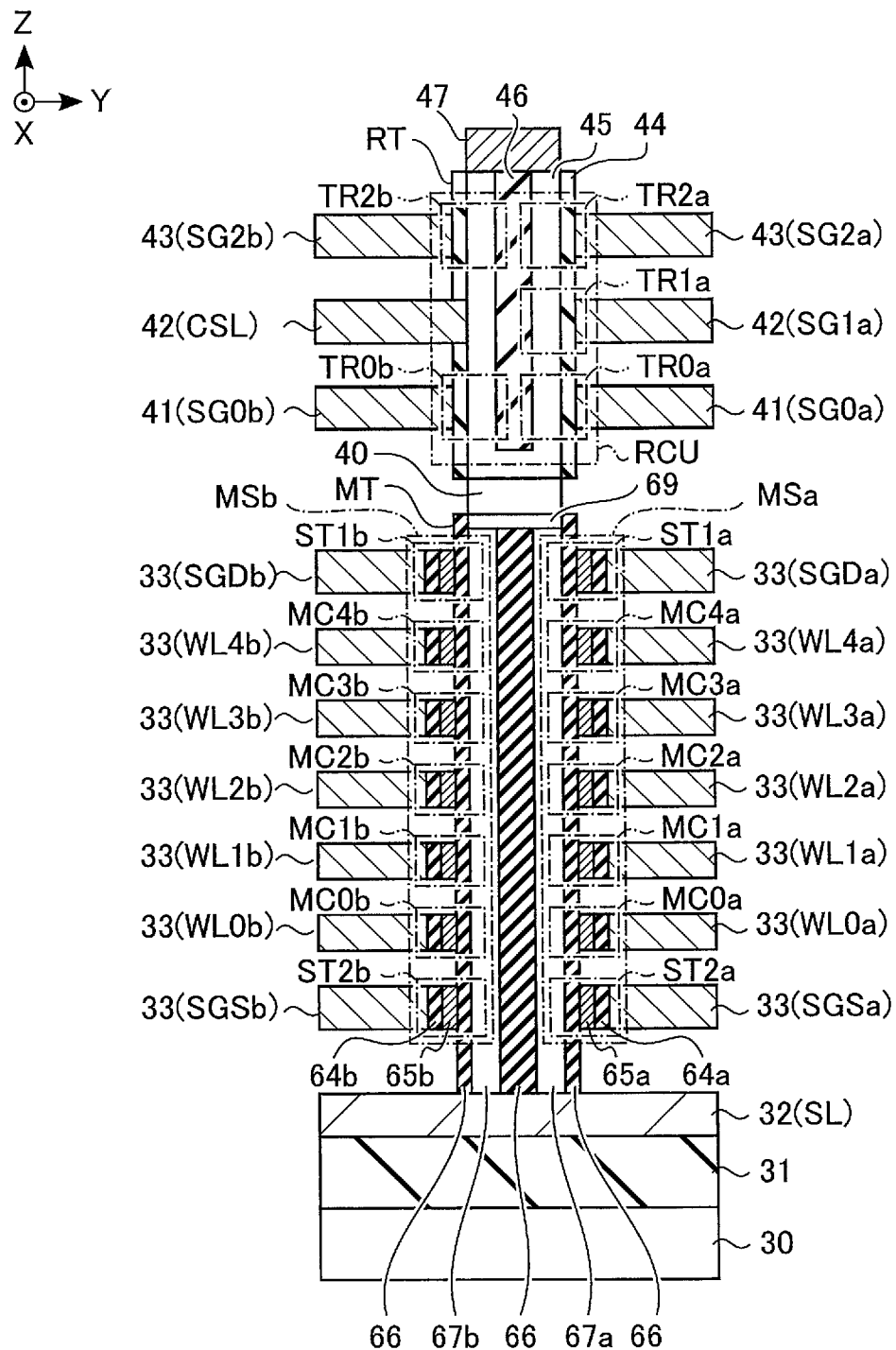
F I G. 39

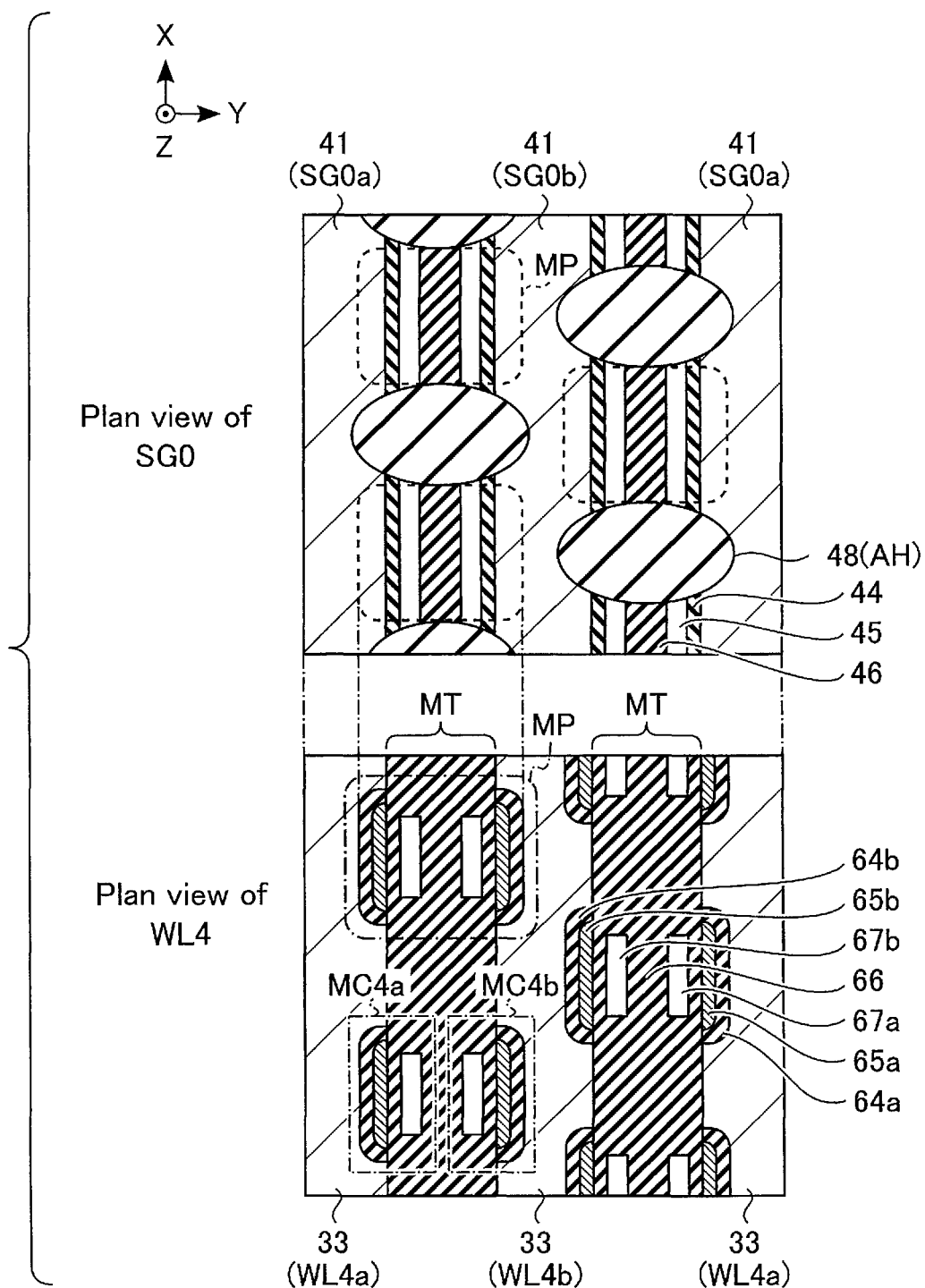
F I G. 40

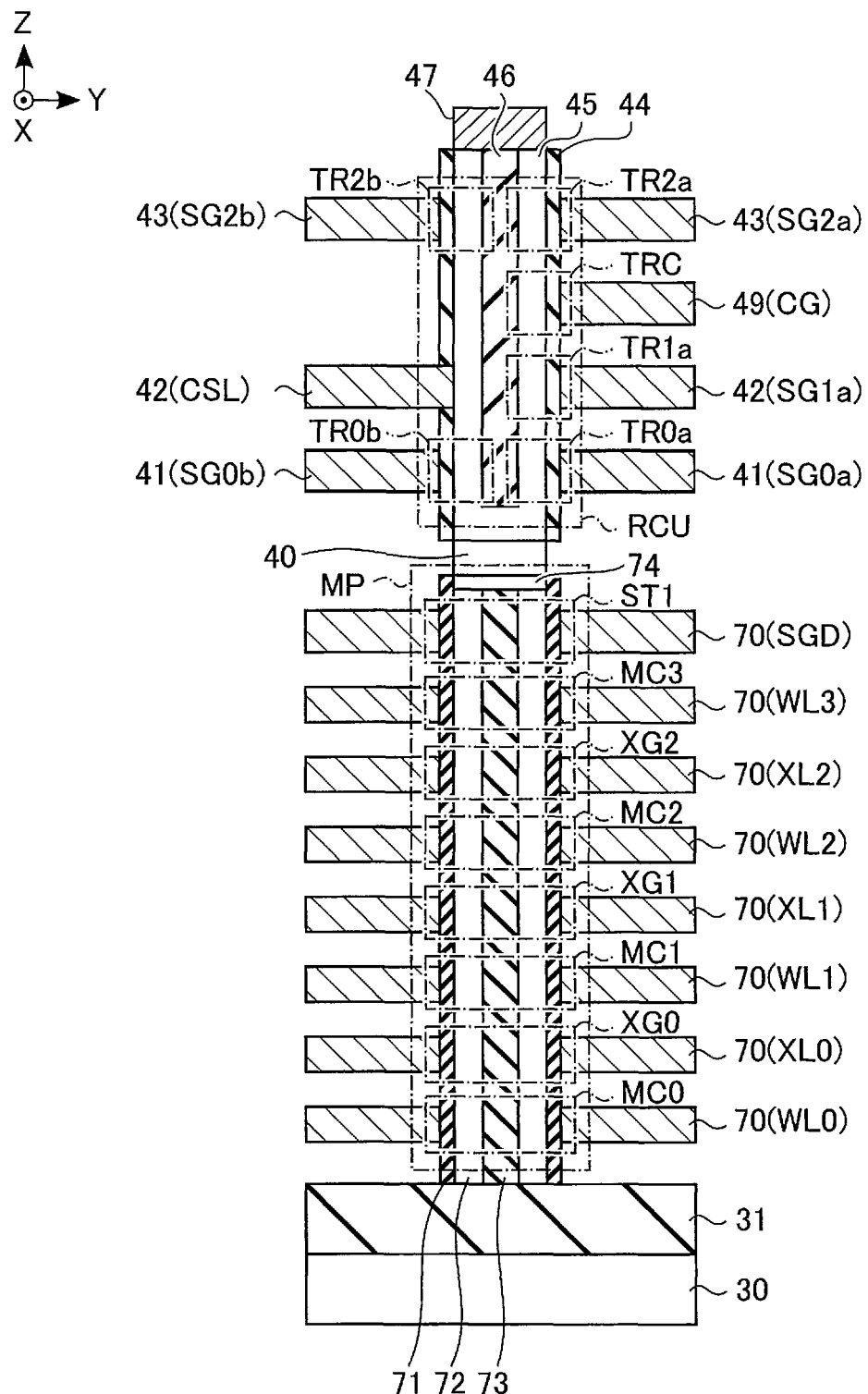
F I G. 44

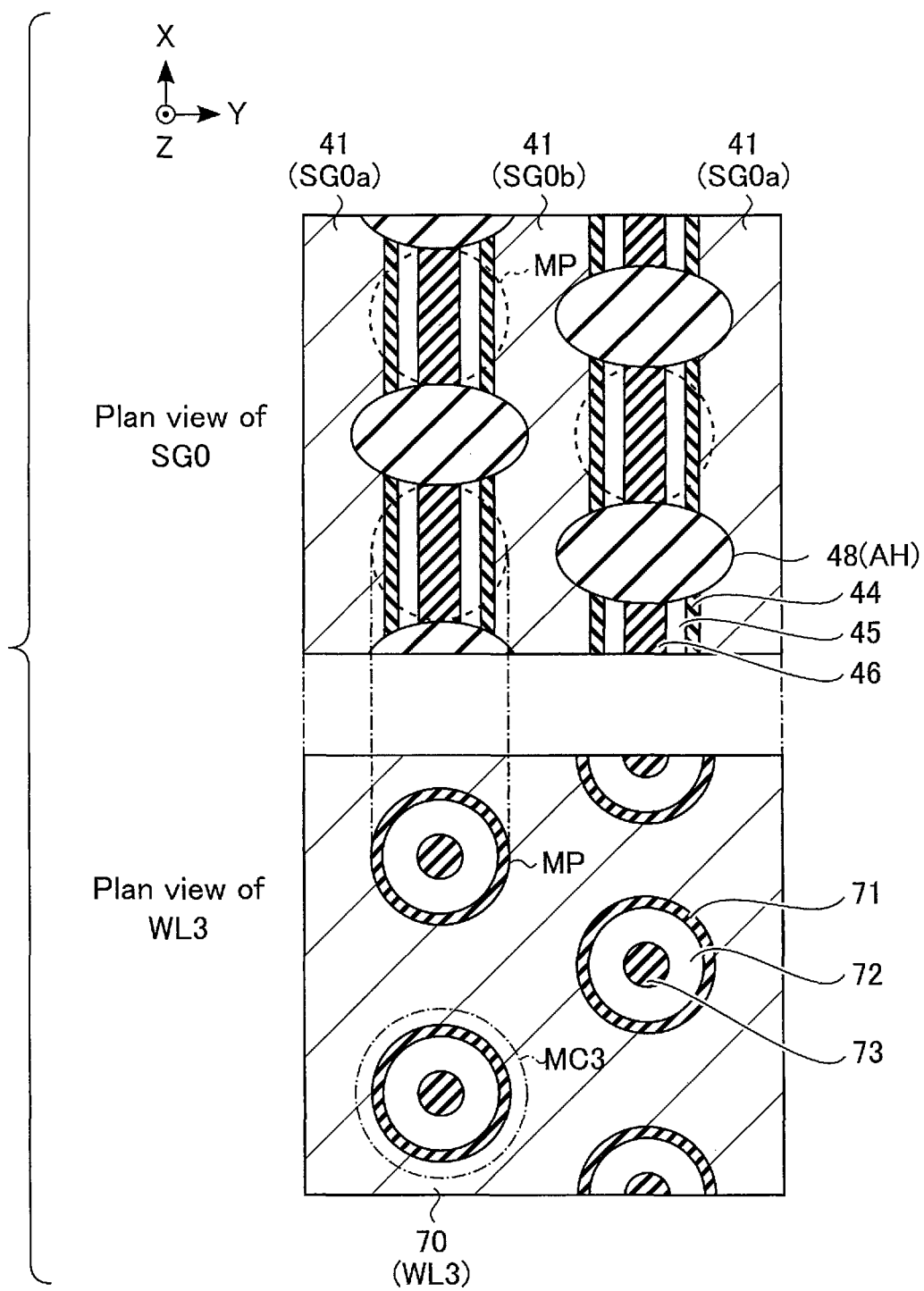
F I G. 45

NON-VOLATILE SEMICONDUCTOR MEMORY DEVICE

CROSS-REFERENCE TO RELATED APPLICATIONS

This application is based upon and claims the benefit of priority from Japanese Patent Application No. 2019-050305, filed Mar. 18, 2019, the entire contents of which are incorporated herein by reference.

FIELD

Embodiments described herein relate generally to a semiconductor memory device.

BACKGROUND

In recent years, the amount of data handled by information terminals, the Internet, clouds, and the like has been explosively increasing. Along with this, it is required to increase the capacity of memory devices and to reduce bit costs.

An ideal memory device is a high speed, high storage density and low bit cost non-volatile semiconductor memory device. At present, there is no memory device that meets all the requirements, and thus a memory device suitable for the application is provided to the user.

BRIEF DESCRIPTION OF THE DRAWINGS

FIG. 1 is a general view of a semiconductor memory device according to a first embodiment;

FIG. 3 is a cross-sectional view of a memory cell array and a readout circuit unit included in the semiconductor memory device according to the first embodiment;

FIG. 4 is a plan view of a memory cell array and a readout circuit unit included in the semiconductor memory device according to the first embodiment;

FIGS. 7 to 22 are views illustrating manufacturing processes of a memory cell array and a readout circuit unit included in a semiconductor memory device according to a first example of a second embodiment;

FIGS. 23 to 31 are views illustrating manufacturing processes of a memory cell array and a readout circuit unit included in a semiconductor memory device according to a second example of the second embodiment;

FIG. 37 illustrates a "0" reading operation of the semiconductor memory device according to the fourth embodiment;

FIG. 39 is a cross-sectional view of the memory cell array and the readout circuit unit included in the semiconductor memory device according to the fifth embodiment;

FIG. 40 is a plan view of the memory cell array and the readout circuit unit included in the semiconductor memory device according to the fifth embodiment;

FIG. 44 is a cross-sectional view of a memory cell array and a readout circuit unit included in a semiconductor memory device according to a sixth embodiment; and FIG. 45 is a plan view of the memory cell array and the readout circuit unit included in the semiconductor memory device according to the sixth embodiment.

DETAILED DESCRIPTION

Figure 2:
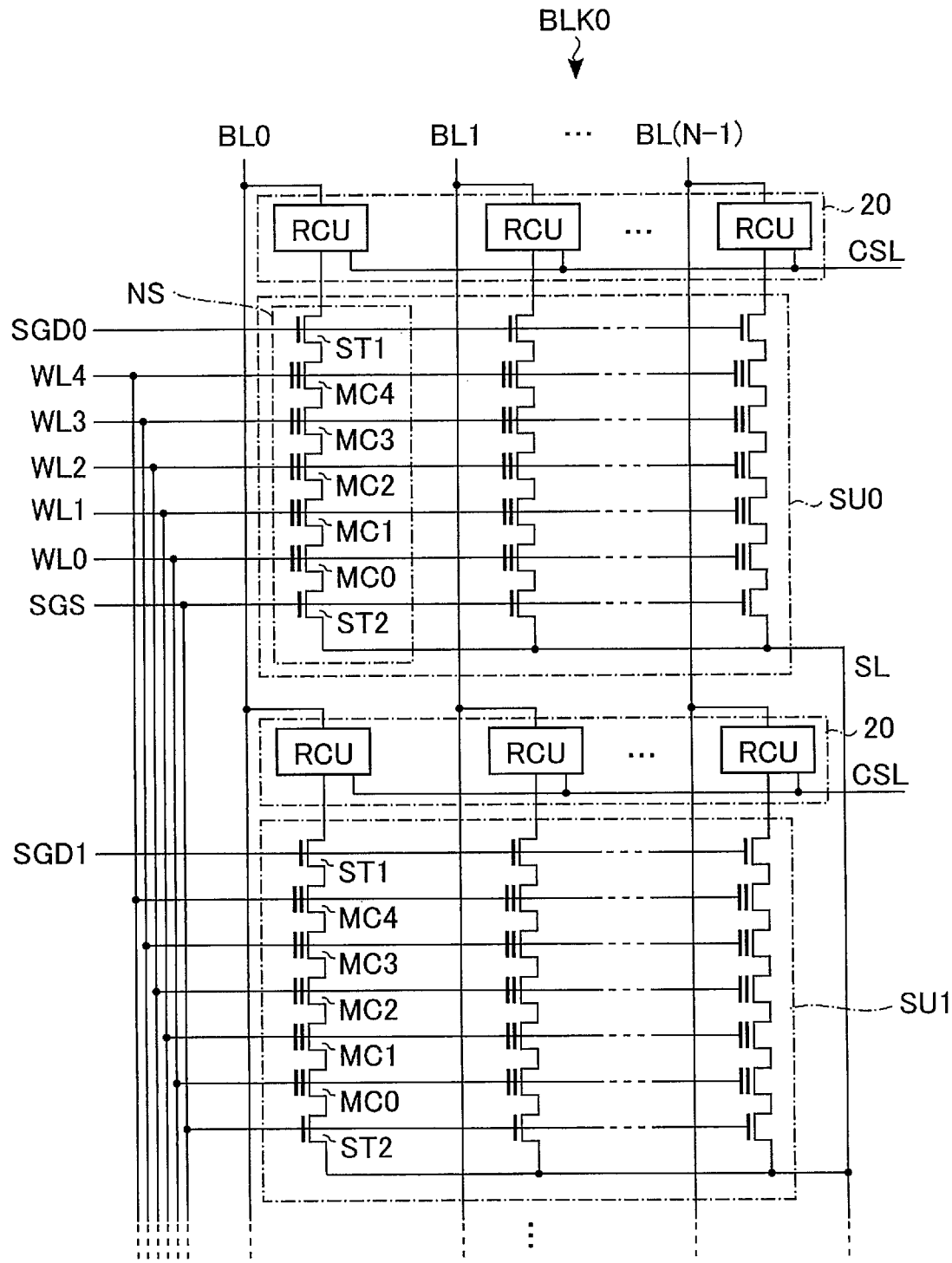
FIG. 2 is a circuit diagram of a memory cell array provided in the semiconductor memory device according to the first embodiment.

In general, according to one embodiment, a semiconductor memory device includes: a first interconnecting layer extending in a first direction; a first signal line extending in a second direction intersecting the first direction and perpendicular to a substrate; a first memory cell that stores first information between the first interconnecting layer and the first signal line; a second interconnecting layer provided above the first interconnecting layer and extending in the first direction; a third interconnecting layer provided above the second interconnecting layer and extending in the first direction; a fourth interconnecting layer provided above the third interconnecting layer and extending in the first direction; a fifth interconnecting layer disposed apart from the second interconnecting layer in a third direction intersecting the first and second directions and extending in the first direction; a sixth interconnecting layer disposed apart from the third interconnecting layer in the third direction and extending in the first direction; a seventh interconnecting layer disposed apart from the fourth interconnecting layer in the third direction and extending in the first direction; a second signal line provided above the first signal line, coupled to the first signal line, disposed between the second interconnecting layer and the fifth interconnecting layer, between the third interconnecting layer and the sixth interconnecting layer, and between the fourth interconnecting layer and the seventh interconnecting layer, and extending in the second direction; a third signal line provided above the first signal line signal line, coupled to the first and second signal lines and the sixth interconnecting layer, and disposed between the second signal line and the fifth interconnecting layer, between the second signal line and the sixth interconnecting layer, and between the second signal line and the seventh interconnecting layer, and extending in the second direction, a first transistor including the second interconnecting layer and the second signal line; a second transistor including the third interconnecting layer and the second signal line, a third transistor including the fourth interconnecting layer and the second signal line; a fourth transistor including the fifth interconnecting layer and the third signal line, and a fifth transistor including the seventh interconnecting layer and the third signal line.

1. First Embodiment

A semiconductor memory device according to a first embodiment will be described. In the present embodiment, a case of using a three-dimensionally stacked NAND flash memory as a semiconductor memory device will be described.

1.1 Configuration

1.1.1 Configuration of Semiconductor Memory Device

First, an example of a general configuration of a semiconductor memory device 1 will be described with reference to FIG. 1. It should be noted that in the example of FIG. 1, although parts of coupling among blocks are indicated by arrow lines, the coupling between the blocks is not limited thereto.

As illustrated in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a readout circuit 20, a sense amplifier 21, a data register 22, and a column decoder 23.

The input/output circuit 10 controls the input/output of a signal DQ with an external controller 2. The signal DQ includes, for example, data DAT, an address ADD, and a command CMD. More specifically, the input/output circuit 10 transmits the data DAT received from the external controller 2 to the data register 22, transmits the address ADD to the address register 13, and transmits the command CMD to the command register 14. Further, the input/output circuit 10 transmits the status information STS received from the status register 12, the data DAT received from the data register 22, the address ADD received from the address register 13 and the like to the external controller 2.

The logic controller 11 receives various control signals from the external controller 2. Then, the logic controller 11 controls the input/output circuit 10 and the sequencer 15 in accordance with the received control signals.

The status register 12 temporarily holds status information STS in, for example, a writing operation, a reading operation, and an erasing operation, and notifies the external controller 2 whether the operation has terminated normally.

The address register 13 temporarily holds the received address ADD. Then, the address register 13 transfers a row address RADD to the row decoder 19 and transfers a column address CADD to the column decoder 23.

The command register 14 temporarily stores the received command CMD and transfers it to the sequencer 15.

The sequencer 15 controls the general operation of the semiconductor memory device 1. More specifically, the sequencer 15, in accordance with the received command CMD, controls, for example, the status register 12, the ready/busy circuit 16, the voltage generator 17, the row decoder 19, the readout circuit 20, the sense amplifier 21, the data register 22, and the column decoder 23 and the like, and executes a writing operation, a reading operation, an erasing operation, and the like.

The ready/busy circuit 16 transmits a ready/busy signal RBn to the external controller 2 in accordance with the operating state of the sequencer 15.

The voltage generator 17, in accordance with control of the sequencer 15, generates voltages required for the writing operation, the reading operation, and the erasing operation, and supplies the generated voltages as, for example, to the memory cell array 18, the row decoder 19, the sense amplifier 21, and the data register 22 and the column decoder 23 and the like. The row decoder 19 applies the voltage supplied from the voltage generator 17 to the readout circuit 20 and memory cell transistors in the memory cell array 18. The sense amplifier 21 applies the voltage supplied from the voltage generator 17 to the readout circuit 20 and the memory cell transistor in the memory cell array 18 via the readout circuit 20.

The memory cell array 18 includes a plurality of blocks BLK (BLK0, BLK1, BLK2, . . . ) including a plurality of non-volatile memory cell transistors (hereinafter also referred to as "memory cells") associated with rows and columns. Each block BLK includes a plurality of (four in the present embodiment) string units SU (SU0 to SU3) which are a set of NAND strings NS in which memory cell transistors are coupled in series. It should be noted that the number of blocks BLK, the string units SU, and NAND strings NS in the memory cell array 18 may be selected as desired. Details of the memory cell array 18 will be described later.

The row decoder 19 decodes the row address RADD. The row decoder 19 applies required voltages to the memory cell array 18 based on a decoded result.

The readout circuit 20 supplies the voltage applied from the sense amplifier 21 to the memory cell array 18 in the writing operation. Further, in the case of the reading operation, the readout circuit 20 switches the coupling with the sense amplifier 21 in accordance with the data read from memory cell array 18. The readout circuit 20 includes a plurality of readout circuit units corresponding to the plurality of NAND strings NS. Details of the readout circuit unit will be described later.

The sense amplifier 21 senses data in accordance with the coupled state with the readout circuit 20 in the reading operation. In other words, the sense amplifier 21 reads data from the memory cell array 18 via the readout circuit 20. Then, the sense amplifier 21 transmits the read data to the data register 22. The sense amplifier 21 transmits writing data to the memory cell array 18 via the readout circuit 20 during the writing operation.

The data register 22 includes a plurality of latch circuits (not illustrated). The latch circuits temporarily hold writing data or read data.

The column decoder 23 decodes the column address CADD, for example, during the writing operation, the reading operation, and the erasing operation, and selects the latch circuit in the data register 22 in accordance with the decoded result.

1.1.2 Circuit Configuration of Memory Cell Array

Next, an example of the circuit configuration of the memory cell array 18 will be described with reference to FIG. 2. The example of FIG. 2 illustrates a block BLK0, but the configurations of the other blocks BLK are also the same.

As illustrated in FIG. 2, the block BLK0 includes a plurality of string units SU. Each of the string units SU includes a plurality of NAND strings NS. Each of the NAND strings NS includes, for example, five memory cell transistors MC (MC0 to MC4) and selection transistors ST1 and ST2. The memory cell transistor MC includes a control gate and a charge storage layer, and holds data in a non-volatile manner. Hereinafter, when one of the memory cell transistors MC0 to MC4 is not limited, it is referred to as a memory cell transistor MC.

It should be noted that the memory cell transistor MC may be a MONOS type using an insulating film as the charge storage layer, or may be an FG type using a conductive layer as the charge storage layer. Hereinafter, in the present embodiment, the MONOS type will be described as an example. The number of memory cell transistors MC is not limited to five, and may be eight, sixteen, thirty-two, sixty-four, ninety-six, one-hundred twenty-eight, etc., and the number is not limited. Further, one or more selection transistors ST1 and ST2 may be provided in each of the NAND strings NS.

In the NAND string NS, respective current paths are coupled in series to the selection transistor ST2, the memory cell transistors MC0 to MC4, and the selection transistor ST1 in this order. A drain of the selection transistor ST1 is coupled to a corresponding readout circuit unit RCU. Further, a source of the selection transistor ST2 is coupled to a source line SL.

Control gates of the memory cell transistors MC0 to MC4 of the NAND strings NS in the same block BLK are commonly coupled to different word lines WL0 to WL4, respectively. More specifically, for example, control gates of a plurality of memory cell transistors MC0 in block BLK0 are commonly coupled to word line WL0. The word lines WL0 to WL4 are coupled to the row decoder 19.

The gates of the plurality of selection transistors ST1 in the same string unit SU are commonly coupled to a selection gate line SGD. More specifically, the gates of selection transistors ST1 in the string unit SU0 are commonly coupled to a selection gate line SGD0. The gates of the selection transistors ST1 in the string unit SU1 are commonly coupled to a selection gate line SGD1. The selection gate line SGD is coupled to the row decoder 19.

The gates of the plurality of selection transistors ST2 in the block BLK are commonly coupled to a selection gate line SGS. The selection gate line SGS is coupled to the row decoder 19. It should be noted that the gates of the selection transistors ST2 may be coupled to different selection gate lines SGS for each of the string units SU.

The drains of the plurality of selection transistors ST1 in the block BLK are coupled to different readout circuit units RCU. The plurality of readout circuit units RCU corresponding to one string unit SU are commonly coupled to, for example, a cell source line CSL. The plurality of readout circuit units RCU corresponding to one string unit SU are coupled to different bit lines BL (BL0 to BL (N−1), where N is a natural number of 2 or higher). In other words, the plurality of NAND strings NS in the string unit SU are coupled to different bit lines BL via different readout circuit units RCU. The bit lines BL are coupled to the sense amplifier 21. Further, one NAND string NS of each string unit SU in the block BLK is commonly coupled to one bit line BL via the corresponding readout circuit unit RCU.

The sources of the selection transistors ST2 in the plurality of blocks BLK are commonly coupled to the source line SL.

In other words, the string unit SU is a set of NAND strings NS each coupled to different bit lines BL via different readout circuit units RCU and coupled to the same selection gate line SGD. The block BLK is a set of a plurality of string units SU sharing the word lines WL. The memory cell array 18 is a set of a plurality of blocks BLK sharing the bit line BL.

1.1.3 Cross-Sectional Configuration of Readout Circuit Unit and Memory Cell Array Next, an example of the cross-sectional configuration of the readout circuit unit RCU and the memory cell array 18 will be described with reference to FIG. 3. It should be noted that in the example of FIG. 3, a part of an interlayer insulating film is omitted.

First, the cross-sectional configuration of the memory cell array 18 will be described.

As illustrated in FIG. 3, an insulating layer 31 is formed on a semiconductor substrate 30. For example, a silicon oxide film ($SiO_2$) is used for the insulating layer 31. It should be noted that a circuit such as the row decoder 19 or the sense amplifier 21 may be provided in a region where the insulating layer 31 is formed, that is, between the semiconductor substrate 30 and an interconnecting layer 32.

The interconnecting layer 32 functioning as a source line SL is formed on the insulating layer 31. The interconnecting layer 32 is made of a conductive material. As the interconnecting layer 32, for example, an n-type semiconductor, a p-type semiconductor, or a metal material is used.

Above the interconnecting layer 32, seven layers of interconnecting layers 33 functioning as the selection gate line SGS, the word lines WL0 to WL4, and the selection gate line SGD are layered from the lower layer separately in a Z direction perpendicular to the semiconductor substrate 30. The interconnecting layers 33 extend in the X direction which is parallel to the semiconductor substrate 30 and intersects the Z direction.

The interconnecting layers 33 are made of a conductive material. As the interconnecting layers 33, for example, an n-type semiconductor, a p-type semiconductor, or a metal material is used. A case where a stacking structure of titanium nitride (TiN) and tungsten (W) is used as the interconnecting layers 33 will be described below. TiN has a function as a barrier layer for preventing a reaction between W and $SiO_2$ when depositing W by, for example, chemical vapor deposition (CVD), or an adhesion layer for improving the adhesion of W.

A memory pillar MP whose bottom surface reaches the interconnecting layer 32 through the seven interconnecting layers 33 is formed. One memory pillar MP corresponds to one NAND string NS. The memory pillar MP includes a block insulating film 34, a charge storage layer 35, a tunnel insulating film 36, a semiconductor layer 37, a core layer 38, and a cap layer 39.

More specifically, a hole corresponding to the memory pillar MP is formed so that the bottom surface reaches the interconnecting layer 32 through the interconnecting layers 33. The block insulating film 34, the charge storage layer 35, and the tunnel insulating film 36 are sequentially layered on the side surfaces of the holes. The semiconductor layer 37 is formed such that the side surface is in contact with the tunnel insulating film 36 and the bottom surface is in contact with the interconnecting layer 32. The semiconductor layer 37 is a region in which the channels of the selection transistor ST2, the memory cell transistors MC0 to MC4, and the selection transistor ST1 are formed. Therefore, the semiconductor layer 37 functions as a signal line that couples current paths of the selection transistor ST2, the memory cell transistors MC0 to MC4, and the selection transistor ST1. Further, in the memory pillar MP, the core layer 38 whose side surface and bottom surface are in contact with the semiconductor layer 37 is provided. On the semiconductor layer 37 and the core layer 38, the cap layer 39 whose side surface is in contact with the tunnel insulating film 36 is formed.

An insulating material is used as the block insulating film 34. The insulating material may be, for example, a layered structure of Hf (Si) Ox/SiO$_2$/Hf (Si) Ox using hafnium (Hf) and SiO$_2$, or may be SiO$_2$. Hf (Si) Ox may or may not contain Si in HfOx. For example, a silicon nitride film (SiN) is used as the charge storage layer 35. For example, SiO$_2$ or silicon oxynitride (SiON) is used as the tunnel insulating film 36. For example, polysilicon is used as the semiconductor layer 37 and the cap layer 39. For example, SiO$_2$ is used as the core layer 38.

The memory pillar MP and five interconnecting layers 33 functioning respectively as word lines WL0 to WL4 constitute the memory cell transistors MC0 to MC4, respectively. In the same manner, the memory pillar MP and the interconnecting layers 33 functioning as the selection gate line SGD constitute the selection transistor ST1. The memory pillar MP and the interconnecting layer 33 functioning as the selection gate line SGS constitute the selection transistor ST2.

A semiconductor layer 40 is formed on the cap layer 39. The readout circuit unit RCU is formed on the semiconductor layer 40. For example, polysilicon is used as the semiconductor layer 40. It should be noted that the cap layer 39 may be omitted.

Next, the cross-sectional configuration of the readout circuit unit RCU will be described.

The readout circuit unit RCU includes, for example, five transistors TR (TR0a, TR1a, TR2a, TR0b, and TR2b). The transistors TR0a, TR1a, and TR2a are stacked above the semiconductor layer 40, and their current paths are coupled in series. In the same manner, the transistors TR0b and TR2b are stacked above the semiconductor layer 40, and their current paths are coupled in series. In the example of FIG. 3, in the readout circuit unit RCU, the transistors TR0a, TR1a, and TR2a are provided on the right side of the drawing, and the transistors TR0b and TR2b are provided on the left side of the drawing.

The sources of the transistors TR0a and TR0b are coupled to the semiconductor layer 40. The drains of the transistors TR2a and TR2b are coupled to a conductive layer 47 provided on the readout circuit unit RCU. The source of the transistor TR2b and the drain of the transistor TR0b are coupled to the cell source line CSL. The cell source line CSL is coupled to, for example, the row decoder 19.

The gates of the transistors TR0a, TR1a, TR2a, TR0b, and TR2b are coupled to selection gate lines SG0a, SG1a, SG2a, SG0b, and SG2b, respectively. The selection gate lines SG0a, SG1a, SG2a, SG0b, and SG2b are coupled to the row decoder 19. The selection gate lines SG0a and SG0b are formed in the same layer. The cell source line CSL and a selection gate line SG1a are formed in the same layer. The selection gate lines SG2a and SG2b are formed in the same layer.

More specifically, above the interconnecting layer 33, the interconnecting layers 41 to 43 extending in the X direction are separately layered in the Z direction. The interconnecting layers 41 to 43 are made of a conductive material. For example, a p-type semiconductor, a metal material, or the like is used as the interconnecting layers 41 and 43. Also, for example, an n-type semiconductor is used as the interconnecting layer 42.

A readout circuit unit RCU which penetrates the interconnecting layers 41 to 43 and whose bottom surface is in contact with the semiconductor layer 40 is formed. The readout circuit unit RCU separates the interconnecting layers 41 to 43 in the Y direction. For example, in the example of FIG. 3, the interconnecting layers 41 to 43 formed on the right side of the drawing with respect to the readout circuit unit RCU function as the selection gate lines SG0a, SG1a, and SG2a, respectively. The interconnecting layers 41 to 43 formed on the left side of the drawing with respect to the readout circuit unit RCU function as the selection gate line SG0b, the cell source line CSL, and the selection gate line SG2b.

The readout circuit unit RCU includes, for example, an insulating layer 44, a semiconductor layer 45, and an insulating layer 46. More specifically, a trench RT corresponding to the readout circuit unit RCU is formed extending in the X direction, and the insulating layer 44 is formed on a side surface of the trench RT. The insulating layer 44 functions as a gate insulating film of the transistors TR0a, TR1a, TR2a, TR0b, and TR2b. The semiconductor layer 45 is formed with the side surface in contact with the insulating layer 44 and the bottom surface in contact with the semiconductor layer 40. Then, an insulating layer 46 extending in the X direction is formed with the side surface and the bottom surface in contact with the semiconductor layer 45. The semiconductor layer 45 is a region in which channels of the transistors TR0a, TR1a, TR2a, TR0b, and TR2b are formed. In other words, the semiconductor layer 45 functions as a signal line coupling in series the current paths of the transistors TR0a, TR1a and TR2a, and a signal line coupling in series the current paths of the transistors TR0b and TR2b. Therefore, in order to separate the current paths (signal lines) of the transistors TR0a, TR1a, and TR2a from the current paths (signal lines) of the transistors TR0b and TR2b, the portion excluding the vicinity of the bottom of the semiconductor layer 45 (at least a portion upward of the bottom surface of the interconnecting layer 41) is separated into two parts in the X direction by the insulating layer 46.

The material of the insulating layers 44 and 46 is selected from SiO$_2$, SiN, SiON, a high dielectric constant material (for example, aluminum oxide, hafnium oxide or zirconium oxide) or the like. The insulating layers 44 and 46 may be a mixture film or a laminated film of these materials. Hereinafter, a case where SiO$_2$ is used as the insulating layers 44 and 46 will be described.

The semiconductor layer 45 is selected from, for example, polycrystalline silicon (Si), polycrystalline germanium (Ge), polycrystalline silicon germanium (SiGe), an oxide semiconductor, and a two-dimensional semiconductor material (for example, MoS2 or WSe2). It should be noted that a laminated film including at least two of films made of these materials, for example, a laminated film of silicon and germanium, or a laminated film of a plurality of two-dimensional semiconductor materials may be used for the semiconductor layer 45. Examples of the material of the oxide semiconductor include an oxide such as indium (In), gallium (Ga), zinc (Zn), tin (Sn), and a mixture (compound) of these oxides. For example, the material of the oxide semiconductor is InGaZnO, InGaSnO, or the like. Hereinafter, in the present embodiment, a case where an oxide semiconductor is used as the semiconductor layer 45 will be described.

For example, a band gap of the oxide semiconductor is approximately three times larger than the band gap of silicon. For example, the band gap of InGaZnO is about 3.5 eV. Therefore, the leak of electrons due to interband tunneling between the conduction band and the valence band in the oxide semiconductor is negligible. Therefore, for example, when the transistors TR0a and TR2a are in an OFF state, the charge of the transistor TR1a is held in the semiconductor layer 45 (oxide semiconductor) and is not released to the memory pillar MP or the bit line BL.

The interconnecting layers 41 to 43 functioning as selection gate lines SG0a, SG1a, SG2a, SG0b, and SG2b are not in contact with semiconductor layer 45, but interconnecting layer 42 functioning as cell source line CSL is in contact with semiconductor layer 45.

A conductive layer 47 is formed on the semiconductor layer 45 and the insulating layer 46. Conductive layer 47 is electrically coupled to the bit line BL. The conductive layer 47 is made of a conductive material. For example, an n-type semiconductor is used as the conductive layer 47.

It should be noted that the semiconductor layer 37 of the memory pillar MP and the semiconductor layer 45 of the readout circuit unit RCU are coupled via the semiconductor layer 40 (and the cap layer 39). Therefore, for example, the Y-direction diameter of the semiconductor layer 37 and the Y-direction width of the semiconductor layer 45 may be the same or different.

1.1.4 Planar Configuration of Readout Circuit Unit and Memory Cell Array

Next, planar configurations of the readout circuit unit RCU and the memory cell array 18 will be described with reference to FIG. 4. FIG. 4 illustrates the upper surfaces of the selection gate lines SG0a and SG0b and the upper surface of the word line WL4 in the XY plane parallel to the semiconductor substrate 30.

First, the upper surface of the word line WL4 (hereinafter, referred to as "WL4 plane") will be described.

As illustrated in FIG. 4, memory pillars MP penetrating through the word line WL4 (interconnecting layer 33) are staggered in two rows in the X direction. The block insulating film 34, the charge storage layer 35, the tunnel insulating film 36, and the semiconductor layer 37 are sequentially layered on the side surface of the memory pillar MP, and the core layer 38 is formed inside the semiconductor layer 37. In the example of FIG. 4, the region including the word line WL4 and the memory pillar MP constitutes the memory cell transistor MC4.

Next, upper surfaces of selection gate lines SG0a and SG0b (hereinafter, referred to as "SG0 plane") will be described.

The selection gate lines SG0a (interconnecting layer 41) and the selection gate lines SG0b (interconnecting layer 41) extending in the X direction are spaced apart from each other in the Y direction and alternately arranged. Between the selection gate lines SG0a and SG0b, a plurality of readout circuit units RCU and a plurality of holes AH are alternately arranged along the X direction. The readout circuit unit RCU is formed above the memory pillar MP. The insulating layers 44 are respectively formed on the two side surfaces of the trench RT corresponding to the readout circuit unit RCU in the Y direction. Inside the trench RT, two semiconductor layers 45 extending in the X direction so as to be in contact with the two insulating layers 44 are formed. Furthermore, the insulating layer 46 is formed between the two semiconductor layers 45. In other words, the insulating layer 44 and the semiconductor layer 45 are separated into two parts in the Y direction, respectively. In the example of FIG. 4, a region including the selection gate line SG0a and the insulating layer 44 and the semiconductor layer 45 formed on the side surface of the trench RT facing the selection gate line SG0a constitutes the transistor TR0a. In the same manner, a region including selection gate line SG0b and insulating layer 44 and semiconductor layer 45 formed on the side surface of trench RT facing selection gate line SG0b constitutes the transistor TR0b.

The holes AH are provided to separate the readout circuit unit RCU in the X direction. Therefore, the length (width) of the hole AH in the Y direction is longer than the length (width) of the trench RT in the Y direction, that is, of the readout circuit unit RCU. The inside of the hole AH is filled with the insulating layer 48. For example, $SiO_2$ is used as the insulating layer 48.

1.2 Writing Operation

Figure 5:
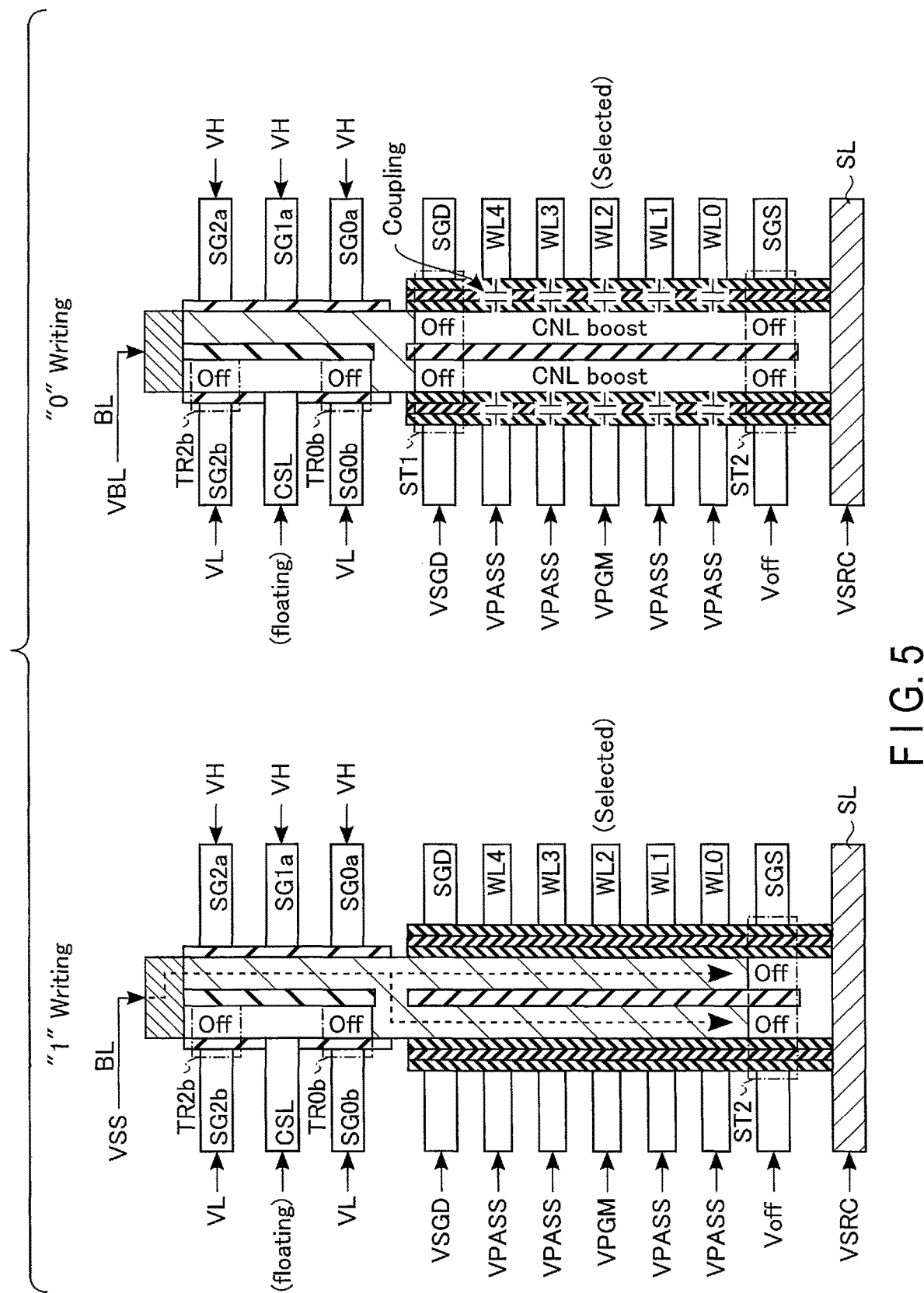
FIG. 5 is a diagram illustrating a writing operation of the semiconductor memory device according to the first embodiment.

Next, the writing operation will be described with reference to FIG. 5. FIG. 5 illustrates an example of the voltage of each interconnect during the writing operation.

The writing operation is an operation of raising the threshold voltage of the memory cell transistor MC (or maintaining the threshold voltage by inhibiting the injection) by injecting charges into the charge storage layer 35. Data is allocated to memory cell transistor MC in accordance with the level of the threshold voltage. In the following, the memory cell transistor MC can hold 1-bit data, and a state where the threshold voltage is higher than the read voltage is allocated to "1" data, and a state where the threshold voltage is lower than the read voltage is allocated to "0" data. It should be noted that the memory cell transistor MC may be capable of holding two or more bits of data.

Hereinafter, in the present embodiment, the operation of increasing the threshold voltage in the writing operation is referred to as "1" writing operation. On the other hand, the operation for maintaining the threshold voltage is referred to as "0" writing operation.

As illustrated in FIG. 5, in the case of the writing operation, a voltage VH is applied to the selection gate lines SG0a, SG1a, and SG2a of the readout circuit unit RCU. Voltage VH is a voltage that turns ON the corresponding transistor TR. For example, a power supply voltage VDD may be used as the voltage VH. Accordingly, the transistors TR0a, TR1a, and TR2a are turned ON, and the bit line BL and the memory pillar MP are electrically coupled. Further, a voltage VL is applied to selection gate lines SG0b and SG2b. The voltage VL is lower than voltage VH and the threshold voltage of the corresponding transistor, and turns the corresponding transistor TR into the OFF state. For example, when an oxide semiconductor is used for the semiconductor layer 45, the transistor TR may function as a normally on type. In this case, the voltage VL is a negative voltage in order to turn the transistor TR into the OFF state. Also, the voltage VSS may be used as the voltage VL. Accordingly, the transistors TR0b and TR2b are turned into the OFF state. Therefore, cell source line CSL is not electrically coupled to bit line BL and memory pillar MP. For example, cell source line CSL is in a floating state.

For example, a ground voltage VSS is applied to the bit line BL corresponding to the "1" writing operation. Further, the voltage VBL is applied to the bit line BL corresponding to the "0" writing operation. The voltage VBL is a voltage higher than the voltage VSS.

In the memory pillar MP, a voltage VSGD is applied to the selection gate line SGD. The selection transistor ST1 whose current path is applied with the voltage VSS in the "1" writing operation is turned ON by applied the voltage VSGD. On the other hand, the selection transistor ST1 whose current path is applied with the voltage VBL in the "0" writing operation is turned into the OFF-state by applied the voltage VSGD. For example, assuming that the threshold voltage of the selection transistor ST1 is Vt_stg, the voltage VSGD, the voltage VSS, and the voltage VBL have a relationship of VSS<(VSGD−Vt_stg)<VBL.

A voltage Voff is applied to the selection gate line SGS. The voltage Voff is a voltage that turns the corresponding selection transistor ST1 or ST2 into the OFF state. Accordingly, the selection transistor ST2 is turned into the OFF state.

Voltage VSRC is applied to source line SL. For example, the voltage VSRC is higher than the voltage VSS and lower than the voltage VBL.

In this state, for example, when the word line WL2 is selected (hereinafter referred to as "selected word line"), a program voltage VPGM is applied to the selected word line WL2, and a voltage VPASS is applied to non-selected word lines WL0, WL1, WL3 and WL4. The voltage VPASS is a voltage for turning ON the memory cell transistor MC regardless of the threshold voltage of the memory cell transistor MC. For example, the voltage VPASS is higher than the voltage VH. The voltage VPGM is higher than the voltage VPASS.

In the memory pillar MP corresponding to the "1" writing operation, the selection transistor ST1 is in the ON state. Therefore, the potential of the channel of the memory cell transistor MC is maintained at VSS. Therefore, a potential difference (VPGM−VSS) between the control gate and the channel is increased. As a result, charges are injected into the charge storage layer 35, and the threshold voltage of the memory cell transistor MC2 rises.

In the memory pillar MP corresponding to the "0" writing operation, the selection transistors ST1 and ST2 are in a cutoff state. Therefore, the channel is brought into a floating state, and the channel potential rises due to capacitive coupling between the channel and the word line WL (reference numeral "CNL boost" in FIG. 5). Therefore, the potential difference between the control gate and the channel is reduced. As a result, since only little charges are injected into the charge storage layer 35, the threshold voltage of the memory cell transistor MC2 is maintained.

1.3 Reading Operation

Figure 6:
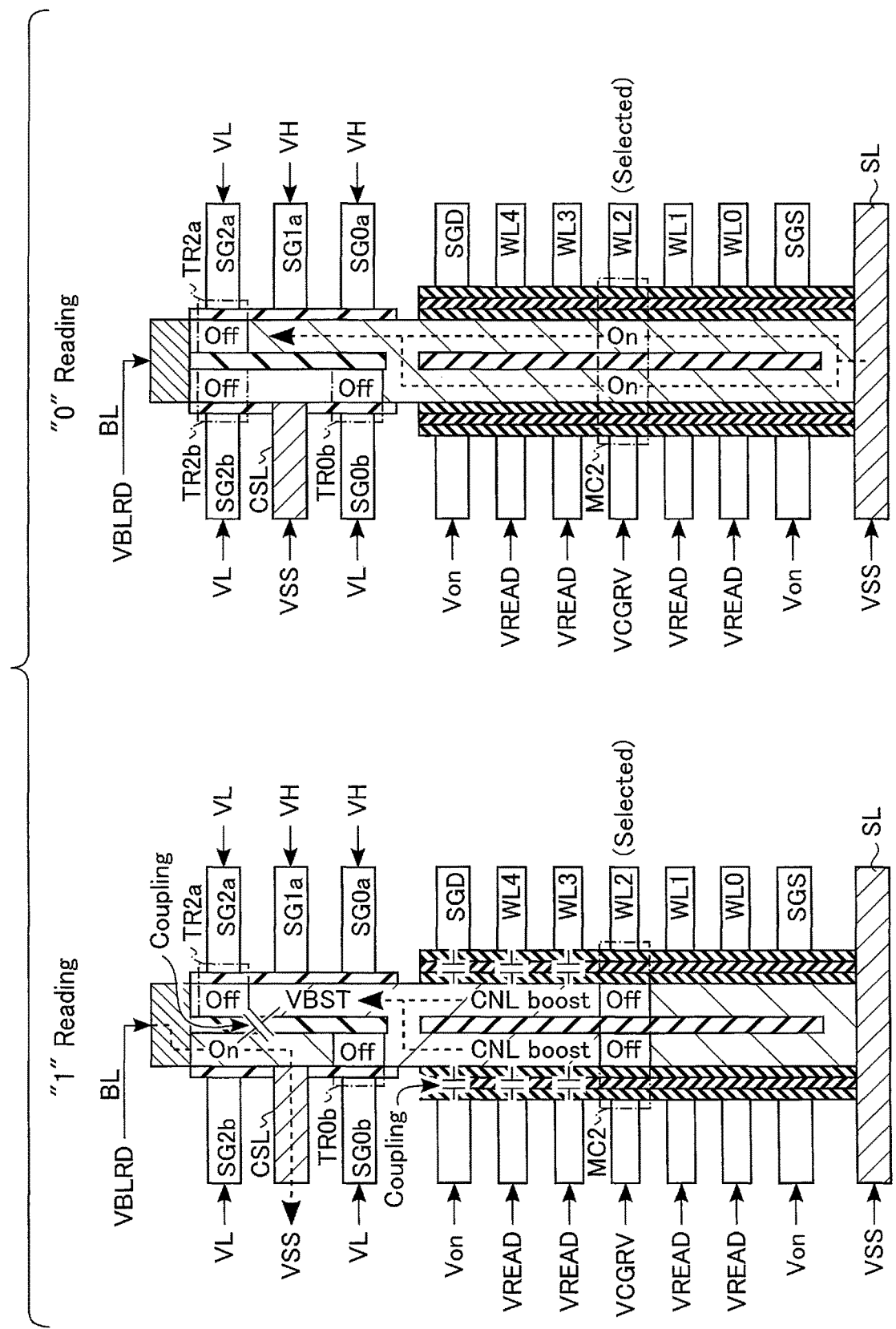
FIG. 6 is a diagram illustrating a reading operation of the semiconductor memory device according to the first embodiment.

Next, the reading operation will be described with reference to FIG. 6. FIG. 6 illustrates an example of the voltage of each interconnect during the reading operation. Hereinafter, in the present embodiment, the operation of reading "0 data" is referred to as ""0" reading operation". On the other hand, the operation of reading "1" data is referred to as ""1" reading operation".

As illustrated in FIG. 6, in the case of the reading operation, a voltage VBLRD is applied to the bit line BL. The voltage VBLRD is higher than the voltage VSS. Further, for example, the voltage VSS is applied to the source line SL.

The voltage VL is applied to the selection gate lines SG0b, SG2a, and SG2b of the readout circuit unit RCU. Accordingly, the transistors TR0b, TR2a, and TR2b are turned into the OFF state. By turning the transistors TR0b and TR2a into the OFF state, the bit line BL and the memory pillar MP are not electrically coupled. In addition, the voltage VH is applied to selection gate lines SG0a and SG1a. Accordingly, the transistors TR0a and TR1a are turned ON. Also, the voltage VSS is applied to the cell source line CSL.

In memory pillar MP, a voltage Von is applied to the selection gate lines SGD and SGS. The voltage Von is a voltage that turns ON the corresponding selection transistor ST1 or ST2. Accordingly, the selection transistors ST1 and ST2 are turned ON.

For example, when the word line WL2 is selected, a read voltage VCGRV is applied to the selected word line WL2, and a voltage VREAD is applied to the non-selected word lines WL0, WL1, WL3 and WL4. The voltage VCGRV is a voltage set in accordance with the threshold voltage level of memory cell transistor MC, and is, for example, a voltage higher than voltage VL and lower than voltage VH. The voltage VREAD is a voltage higher than voltage VH and voltage VCGRV. The voltage VREAD is a voltage for turning ON the memory cell transistor MC regardless of the threshold voltage of the memory cell transistor MC.

In the memory pillar MP corresponding to the "1" reading operation, the threshold voltage of the memory cell transistor MC2 is higher than the voltage VCGRV. Therefore, the memory cell transistor MC2 is turned into the OFF state. The channels of memory cell transistors MC3 and MC4 and selection transistor ST1 are brought into a floating state, and the channel potential rises due to capacitive coupling with the word lines WL3 and WL4 and selection gate line SGD. In the readout circuit unit RCU, a voltage VBST caused by the rise of the channel potential is applied to the channel of the transistor TR1a. Then, capacitive coupling between the channel of the transistor TR1a and the channel of the transistor TR2b causes the voltage at the back gate of the transistor TR2b to rise, and the transistor TR2b is turned ON. As a result, bit line BL and cell source line CSL are electrically coupled, and a current flows from the bit line BL to cell source line CSL.

In the memory pillar MP corresponding to the "0" reading operation, the threshold voltage of the memory cell transistor MC2 is lower than the voltage VCGRV. Therefore, the memory cell transistor MC2 is turned ON. Since the memory cell transistors MC0 to MC4 and the selection transistors ST1 and ST2 are turned ON, the voltage VSS of the source line SL is applied to the channel of the transistor TR1a in the readout circuit unit RCU. In this case, the voltage of the back gate of the transistor TR2b does not rise, and the transistor TR2b is maintained in the OFF state. As a result, the bit line BL and cell source line CSL are not electrically coupled. In other words, almost no current flows from the bit line BL to the cell source line CSL.

The sense amplifier 21 reads data of the memory cell transistor MC by detecting a reading current flowing from the bit line BL to the cell source line CSL in the reading operation.

1.4 Effects of Present Embodiment

With the configuration according to the present embodiment, a semiconductor memory device capable of improving the reliability can be provided. This effect will be described in detail below.

For example, in the reading operation, when a reading current flows from the bit line BL to the source line SL via the memory pillar MP, the reading current fluctuates depending on channel resistance of the memory pillar MP. For example, with the miniaturization of the memory pillar MP or the increase in the number of memory cell transistors MC coupled in series in the memory pillar MP, the channel resistance of the memory pillar MP tends to increase. Therefore, the reading current flowing through the memory pillar MP is reduced. Then, since it becomes difficult for the sense amplifier 21 to detect the reading current, the possibility of erroneous reading increases, and the reading time tends to increase.

On the other hand, in the configuration according to the present embodiment, the semiconductor memory device 1 includes the readout circuit unit RCU corresponding to the memory pillar MP. The readout circuit unit RCU can set the coupling between the bit line BL and the cell source line CSL provided in the readout circuit unit RCU in accordance with the data of the memory cell transistor MC. Therefore, during the reading operation, the sense amplifier 21 can read data of the memory cell transistor MC by detecting a reading current flowing from the bit line BL to the cell source line CSL. Since the influence of the channel resistance of the memory pillar MP, that is, the influence of the structure of the memory cell array 18, the decrease in the reading current flowing through the bit line BL can be suppressed. Therefore, the semiconductor memory device can suppress erroneous reading and improve the reliability. In addition, since the semiconductor memory device can suppress an increase in reading time, the processing capacity can be improved.

2. Second Embodiment

Next, a second embodiment will be described. In the second embodiment, two examples of the method of manufacturing the readout circuit unit RCU and the memory cell array 18 will be described. Points different from the first embodiment will be mainly described below.

2.1 First Example

First, a first example will be described using FIG. 7 to FIG. 22. The examples of FIG. 7 to FIG. 22 illustrate a plan view of the readout circuit unit RCU and a cross-sectional view taken along a line A1-A2 of the plan view. In the following, a case where a method of forming a structure corresponding to the interconnecting layer 33 of the memory cell array 18 as a sacrificial layer, and then replacing the sacrificial layer with a conductive material to form the interconnecting layer 33 (hereinafter referred to as "replacement") is applied will be described. Further, in this example, a case where the interconnecting layers 41 and 43 are formed by replacement in the readout circuit unit RCU will be described.

Figure 7:
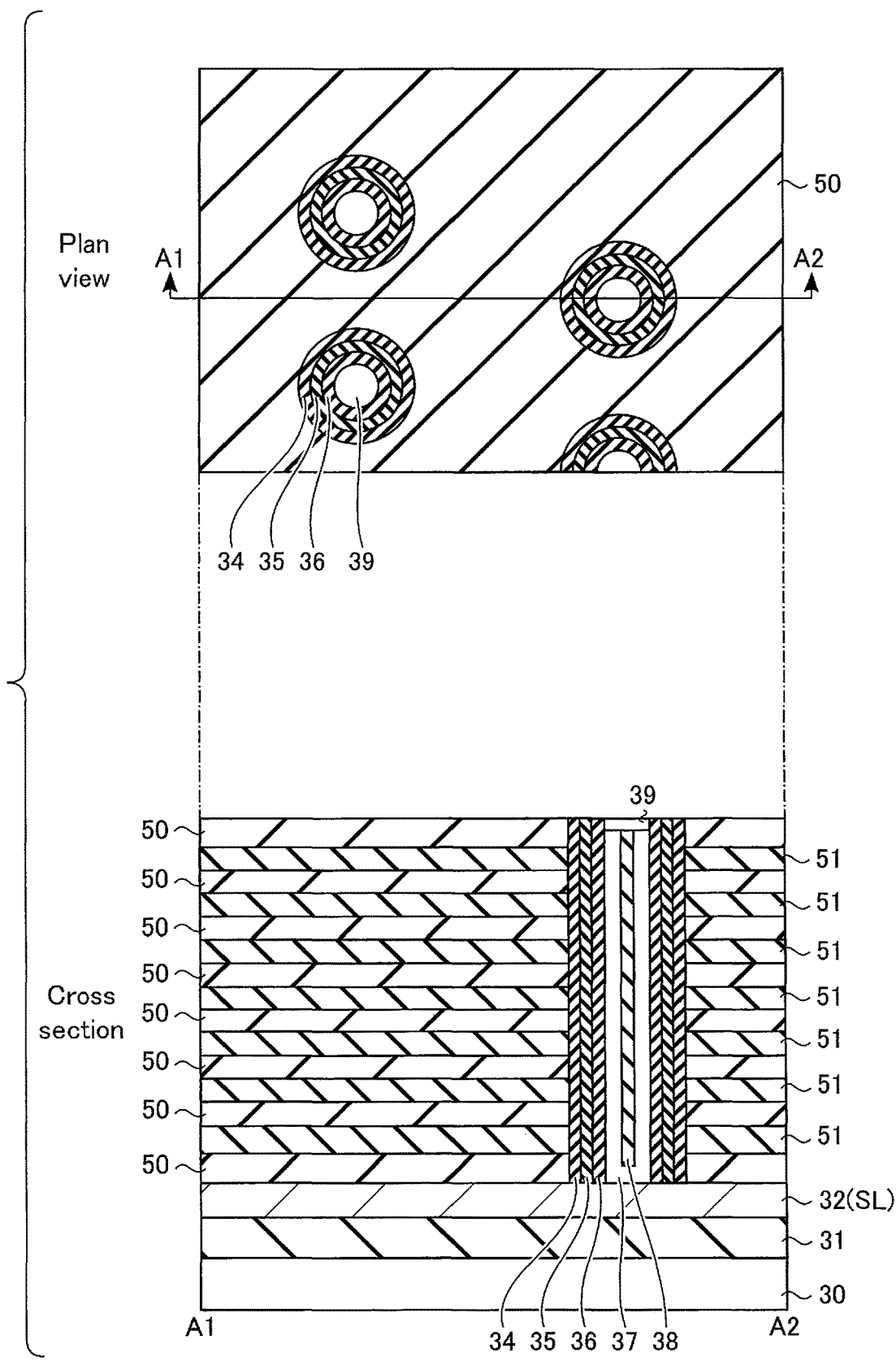

As illustrated in FIG. 7, after the insulating layer 31 and the interconnecting layer 32 are formed on the semiconductor substrate 30, eight insulating layers 50 and seven sacrificial layers 51 corresponding to the interconnecting layer 33 are alternately layered. For example, $SiO_2$ is used as the insulating layers 50. For example, SiN is used as the sacrificial layers 51. It should be noted that the sacrificial layers 51 are not limited to SiN. The sacrificial layers 51 may be, for example, made of a material that can obtain a sufficient wet etching selectivity with respect to the insulating layers 50.

Next, the memory pillar MP whose bottom surface reaches the interconnecting layer 32 is formed. More specifically, the insulating layers 50 and the sacrificial layers 51 are processed to form holes corresponding to the memory pillar MP. Next, the block insulating film 34, the charge storage layer 35, and the tunnel insulating film 36 are sequentially layered, and the block insulating film 34, the charge storage layer 35, and the tunnel insulating film 36 at the bottom of the hole and on the uppermost insulating layer 50 are removed. Next, the semiconductor layer 37 and the core layer 38 are sequentially layered to fill the inside of the hole. Next, the semiconductor layer 37 and the core layer 38 on the uppermost insulating layer 50 are removed. At this time, parts of the semiconductor layer 37 and the core layer 38 are etched in the upper part of the hole. Then, a cap layer 39 is formed to fill the upper portion of the hole.

As illustrated in FIG. 8, after forming the insulating layer 52 (for example, $SiO_2$), the sacrificial layers 51 are removed to form a voids AG. More specifically, for example, a slit (not illustrated) of which the bottom surface reaches the interconnecting layer 32, and from which seven sacrificial layers 51 are exposed, is formed on the side surface. Next, when the sacrificial layers 51 are made of SiN, the sacrificial layers 51 exposed from the side surface of the slit is etched by wet etching using phosphoric acid ($H_3PO_4$) to form the voids AG.

Figure 9:
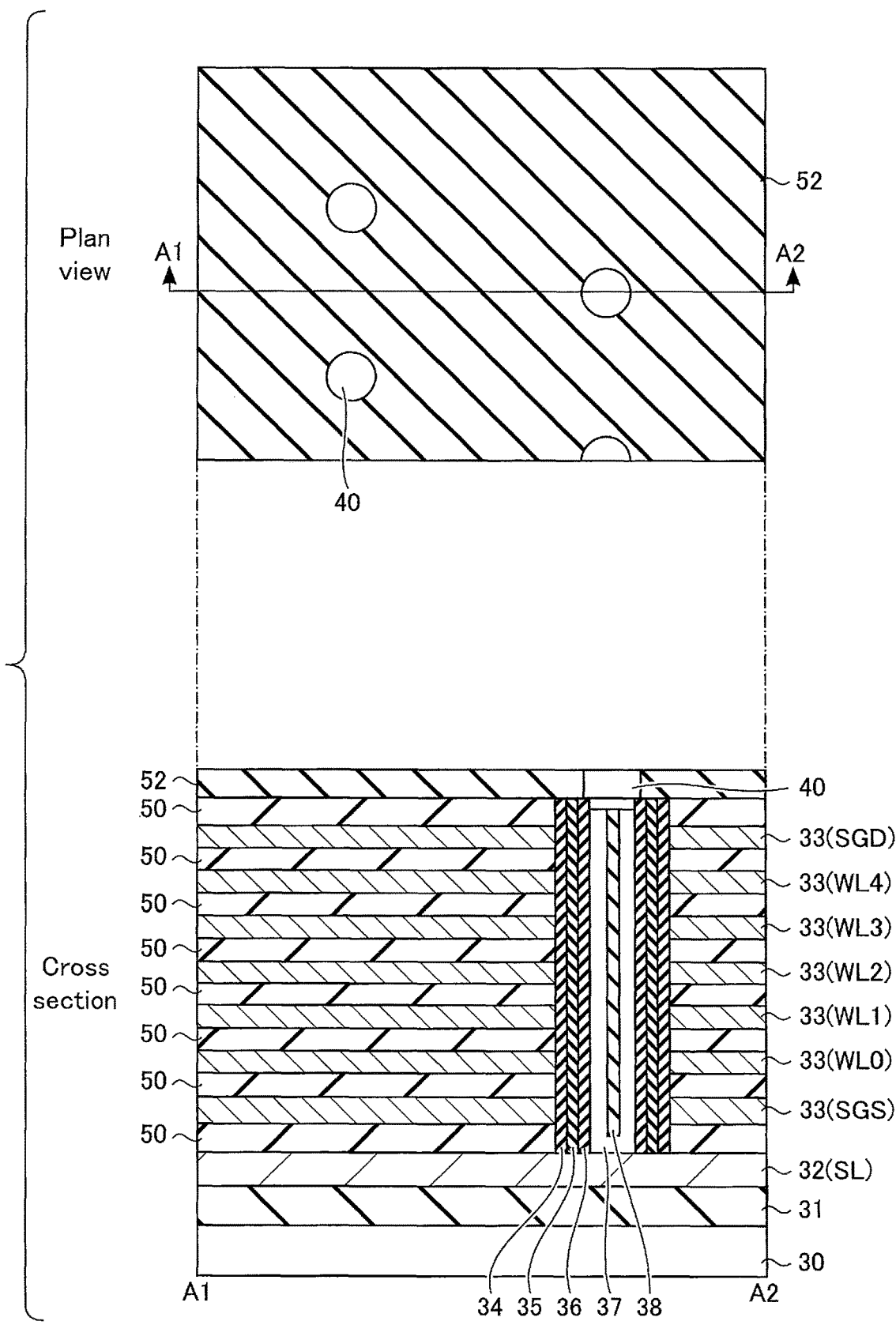

As illustrated in FIG. 9, TiN and W are sequentially deposited to fill the voids AG. Next, the interconnecting layer 33 is formed by removing W and TiN in the slit and on the insulating layers 52. Next, the slit is filled with $SiO_2$, for example.

Thereafter, the semiconductor layer 40 is formed on the cap layer 39.

Figure 10:
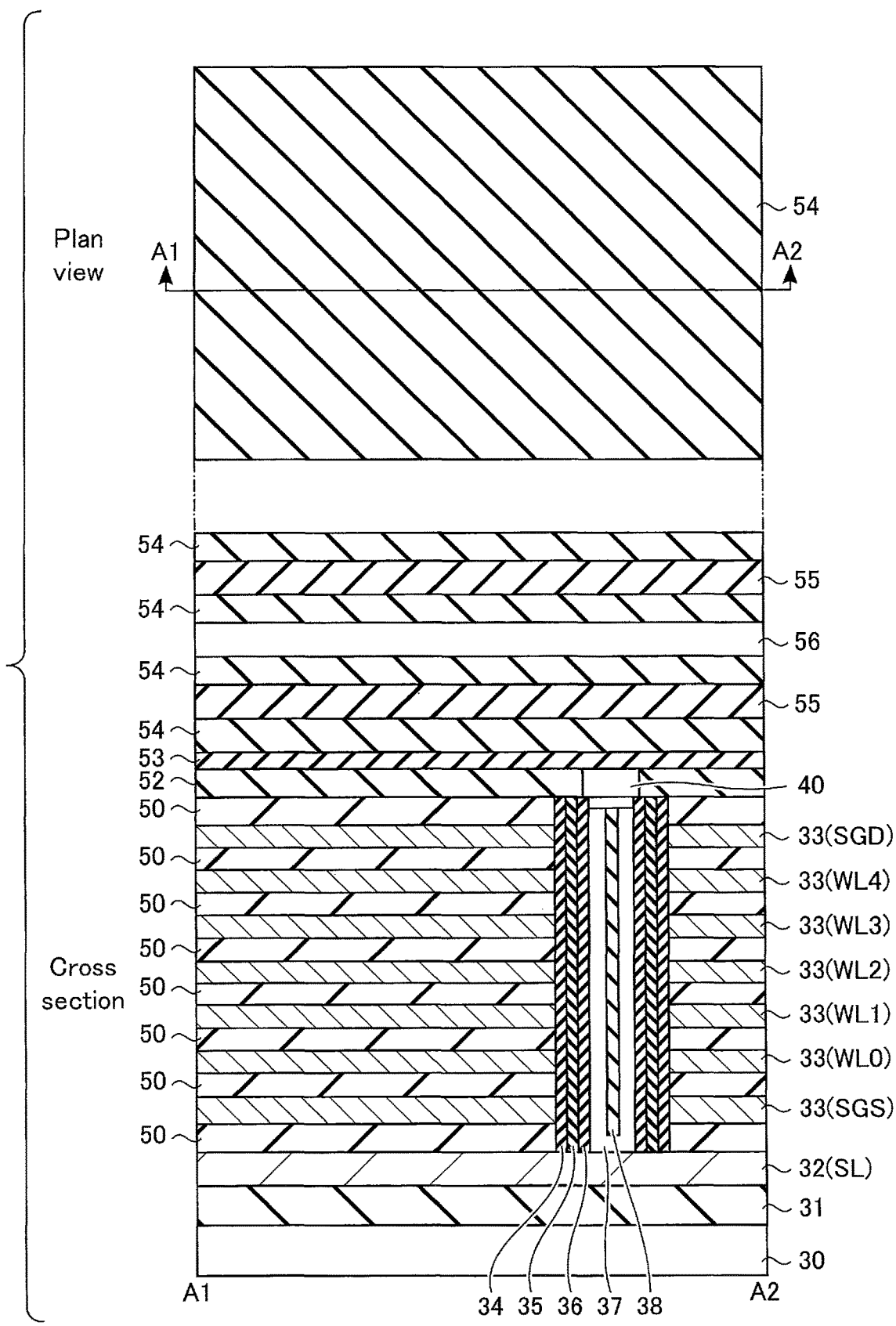

As illustrated in FIG. 10, an insulating layer 53 is formed on the insulating layer 52. The insulating layer 53 functions as an etching stopper at the time of forming the trench RT. Next, an insulating layer 54, a sacrificial layer 55, an insulating layer 54, a semiconductor layer 56, an insulating layer 54, a sacrificial layer 55, and an insulating layer 54 are sequentially layered on the insulating layer 53. The sacrificial layers 55 correspond to the interconnecting layers 41 and 43. The semiconductor layer 56 corresponds to the interconnecting layer 42.

As the insulating layer 53, for example, aluminum oxide is used. It should be noted that the insulating layer 53 may be any material that can obtain an etching selectivity with the insulating layer 54, the sacrificial layer 55, and the semiconductor layer 56. For example, $SiO_2$ is used as the insulating layer 54. For example, SiN is used as the sacrificial layer 55. For example, amorphous silicon is used as the semiconductor layer 56.

Figure 11:
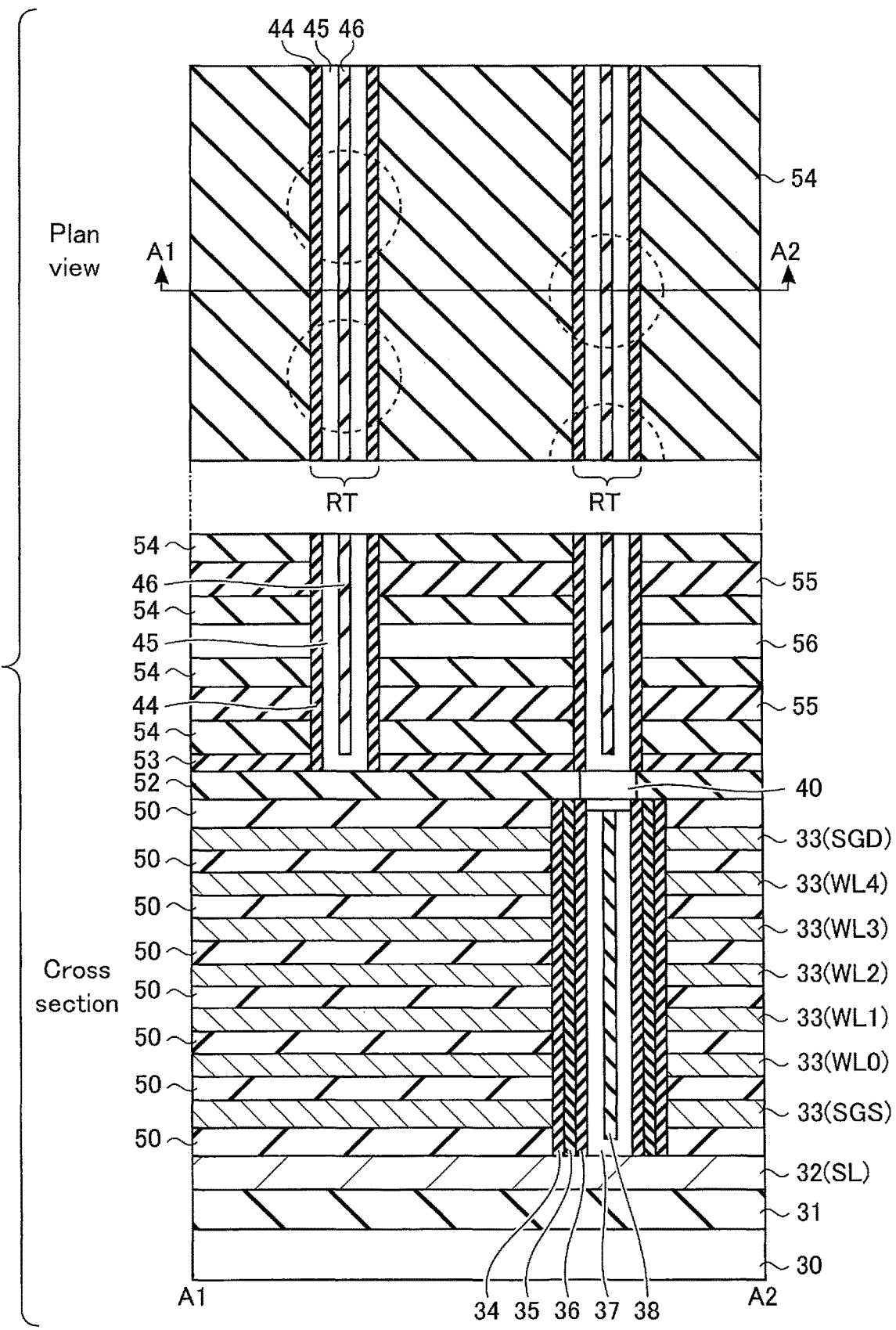

As illustrated in FIG. 11, the trench RT whose bottom surface reaches the semiconductor layer 40 is formed. More specifically, the insulating layers 53 and 54, the sacrificial layer 55, and the semiconductor layer 56 are processed to form a trench RT. Next, after the insulating layer 44 is formed, the insulating layer 44 at the bottom of the trench RT and on the uppermost insulating layer 54 is removed. Next, the semiconductor layer 45 and the insulating layer 46 are sequentially layered to fill the inside of the trench RT. Next, the semiconductor layer 45 and the insulating layer 46 on the uppermost insulating layer 54 are removed.

Figure 12:
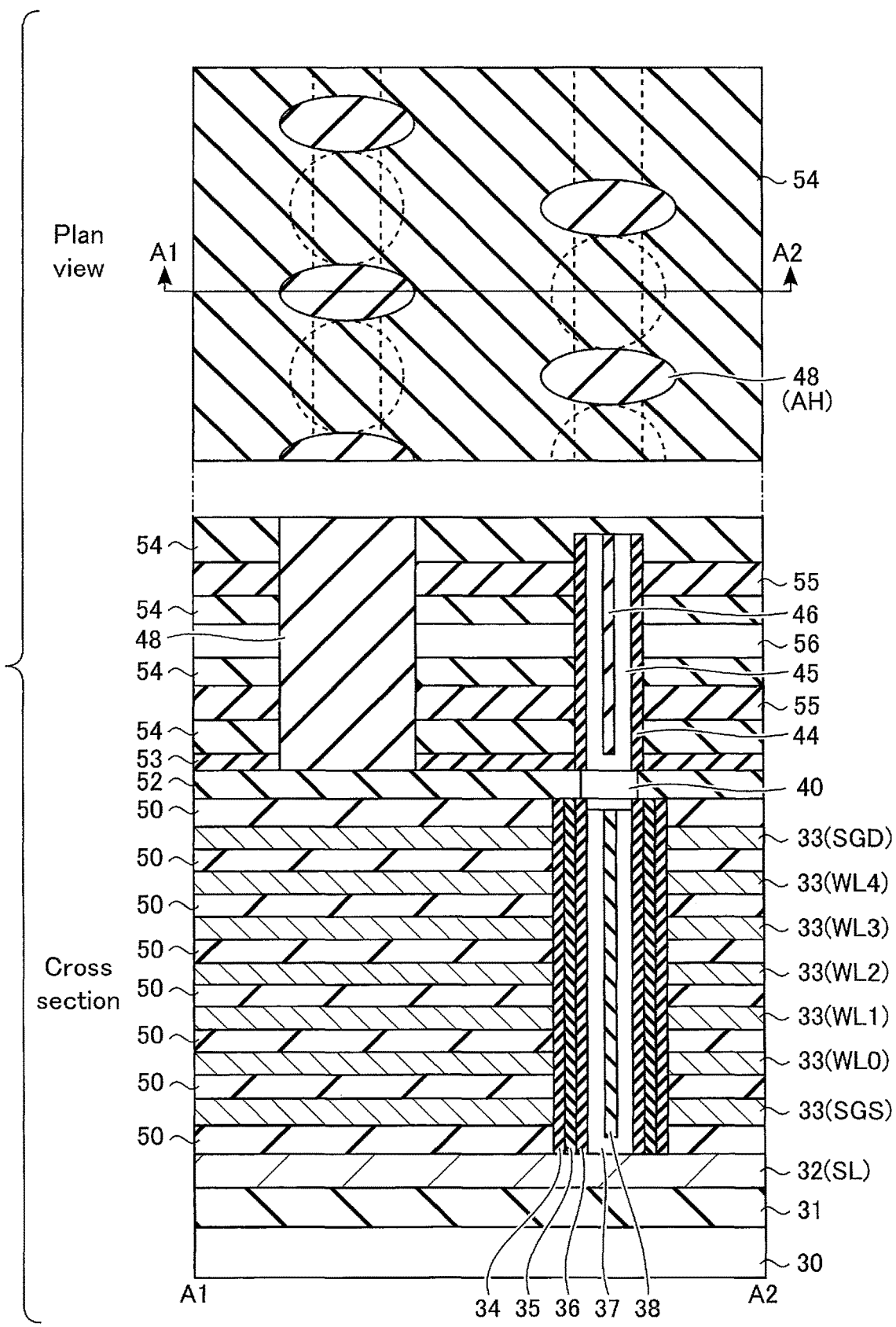

As illustrated in FIG. 12, the insulating layer 54 is formed to cover the upper surfaces of the insulating layer 44, the semiconductor layer 45, and the insulating layer 46 formed in the trench RT. Next, holes AH are formed so that the bottom surface reaches insulating layer 52 so as to separate trench RT, that is, insulating layer 44, semiconductor layer 45, and insulating layer 46, and then the inside is filled with an insulating layer 48.

As illustrated in FIG. 13, in the region where the cell source line CSL is formed, the hole RH where the bottom surface reaches the insulating layer 53 is formed.

As illustrated in FIG. 14, the semiconductor layer 56 exposed on the side surface of the hole RH is removed. Next, the insulating layer 44 on the side surface of the trench RT exposed by removing the semiconductor layer 56 is removed to expose the semiconductor layer 45.

As illustrated in FIG. 15, the conductive layer 57 is formed in the hole RH and the region from which the semiconductor layer 56 has been removed. The conductive layer 57 is in contact with the exposed side surface of the semiconductor layer 45. The conductive layer 57 is made of a conductive material. As the conductive layer 57, for example, an n-type semiconductor is used. For example, doped polysilicon doped with phosphorus (P) or arsenic (As) may be formed as an n-type semiconductor by CVD.

Figure 16:
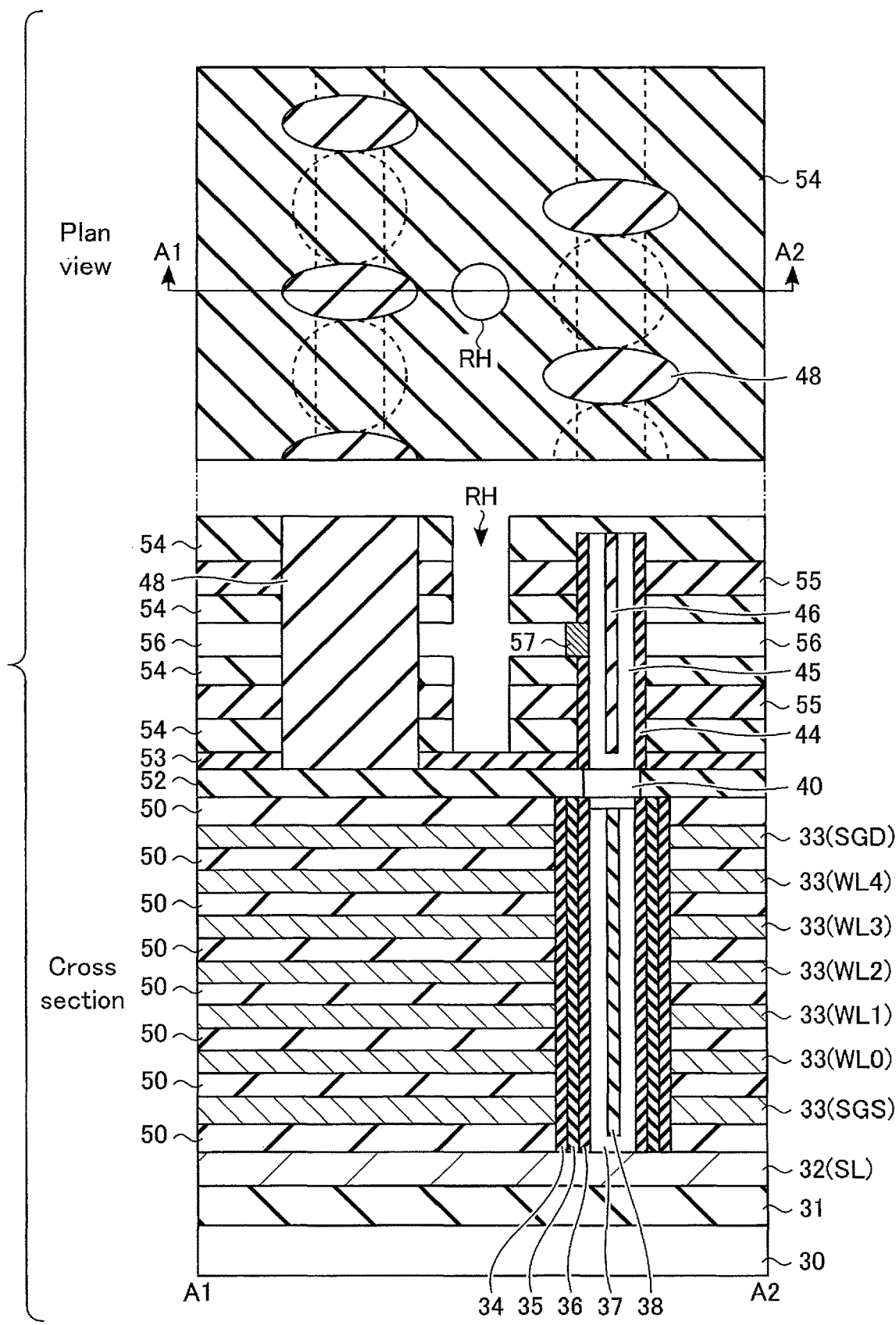

As illustrated in FIG. 16, the conductive layer 57 in the hole RH is etched. At this time, in the region from which the semiconductor layer 56 has been removed, the etching amount is adjusted so that the conductive layer 57 remains in a portion in contact with the semiconductor layer 45.

Figure 17:
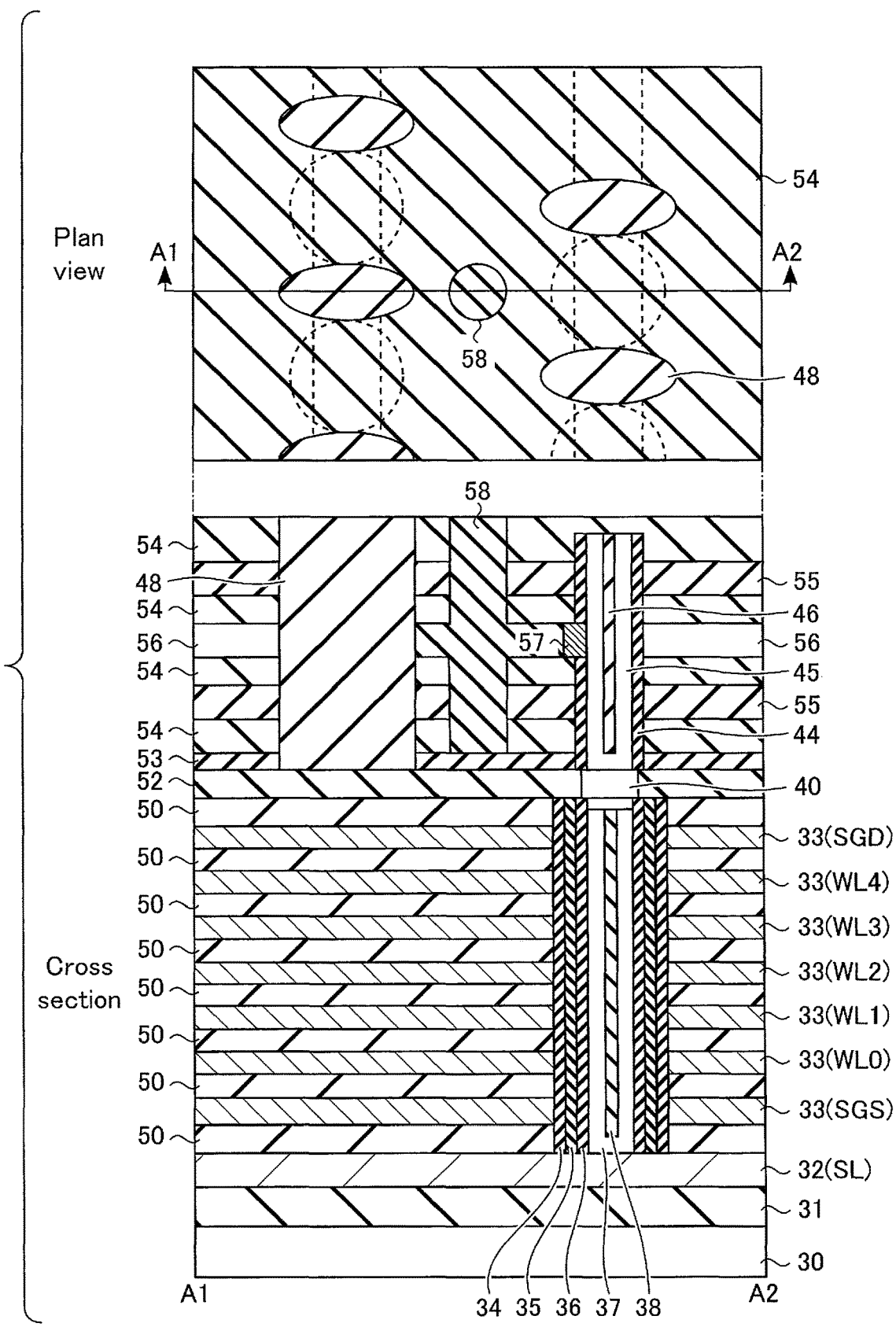

As illustrated in FIG. 17, the holes RH and the region from which the semiconductor layer 56 has been removed are filled with a sacrificial layer 58. For example, SiN is used as the sacrificial layer 58. It should be noted that the sacrificial layer 58 may not completely fill the hole RH and the region from which the semiconductor layer 56 has been removed, and may have a cavity inside.

Figure 18:
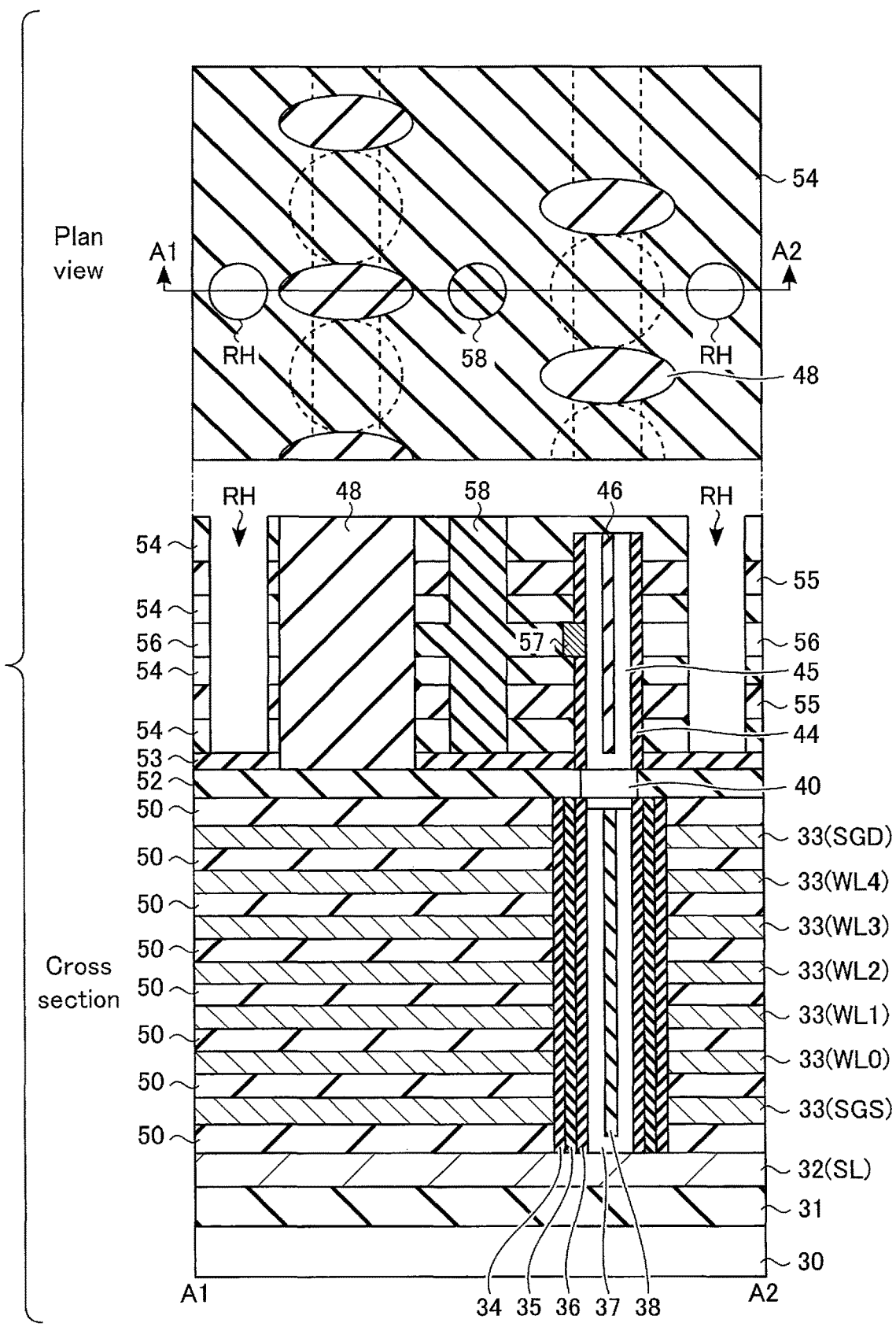

As illustrated in FIG. 18, in the region where selection gate lines SG0a, SG1a, and SG2a are formed, the holes RH in which the bottom surface reaches insulating layer 53 are formed.

Figure 19:
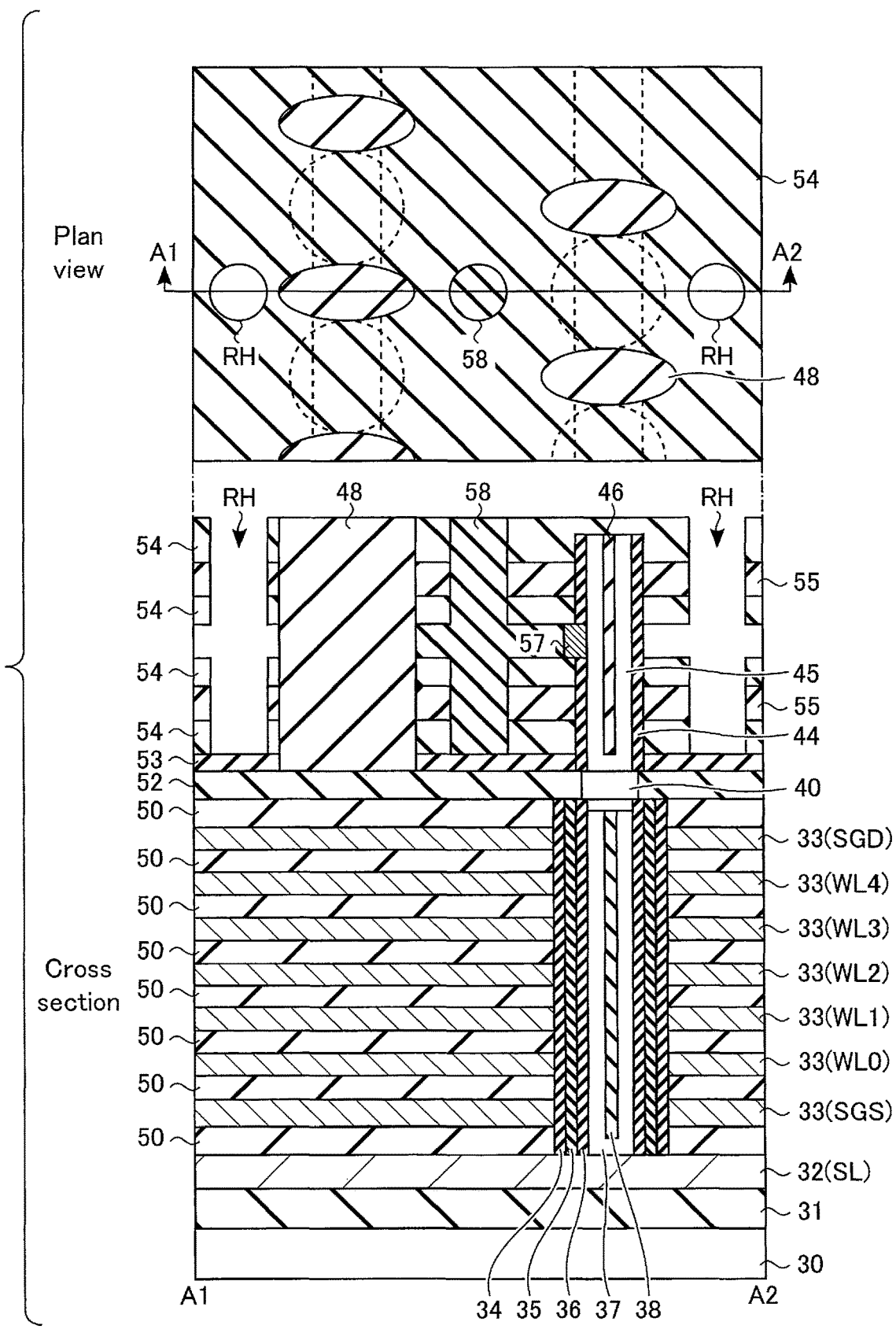

As illustrated in FIG. 19, the semiconductor layer 56 exposed on the side surfaces of the holes RH is removed.

Figure 20:
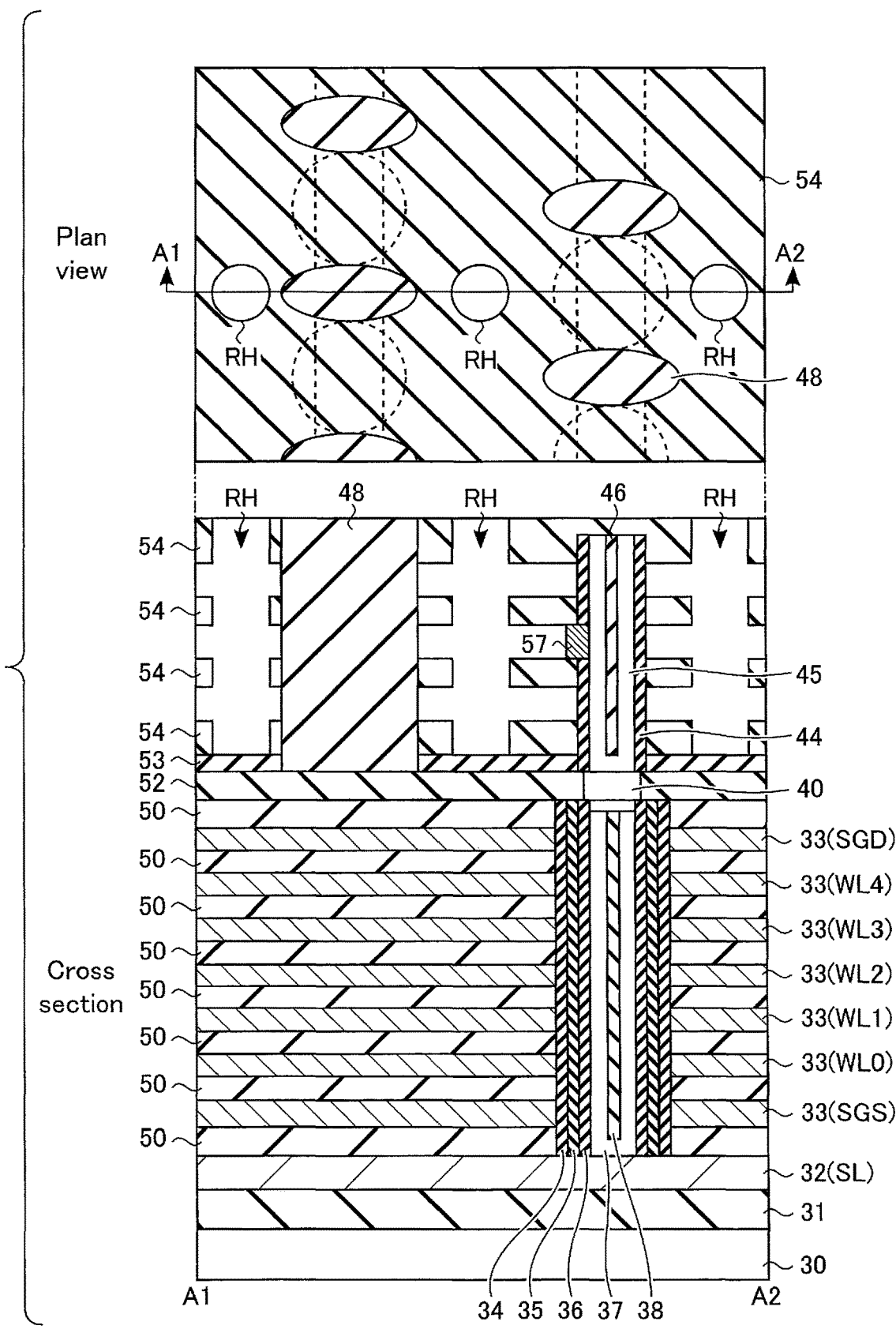

As illustrated in FIG. 20, the sacrificial layers 55 and 58 are removed by wet etching, for example.

As illustrated in FIG. 21, conductive layers 59 are formed in the holes RH and in the region from which the semiconductor layer 56 and the sacrificial layer 55 have been removed. The conductive layers 59 is made of a conductive material. For example, a layered structure of TiN and W is used as the conductive layers 59.

Figure 22:
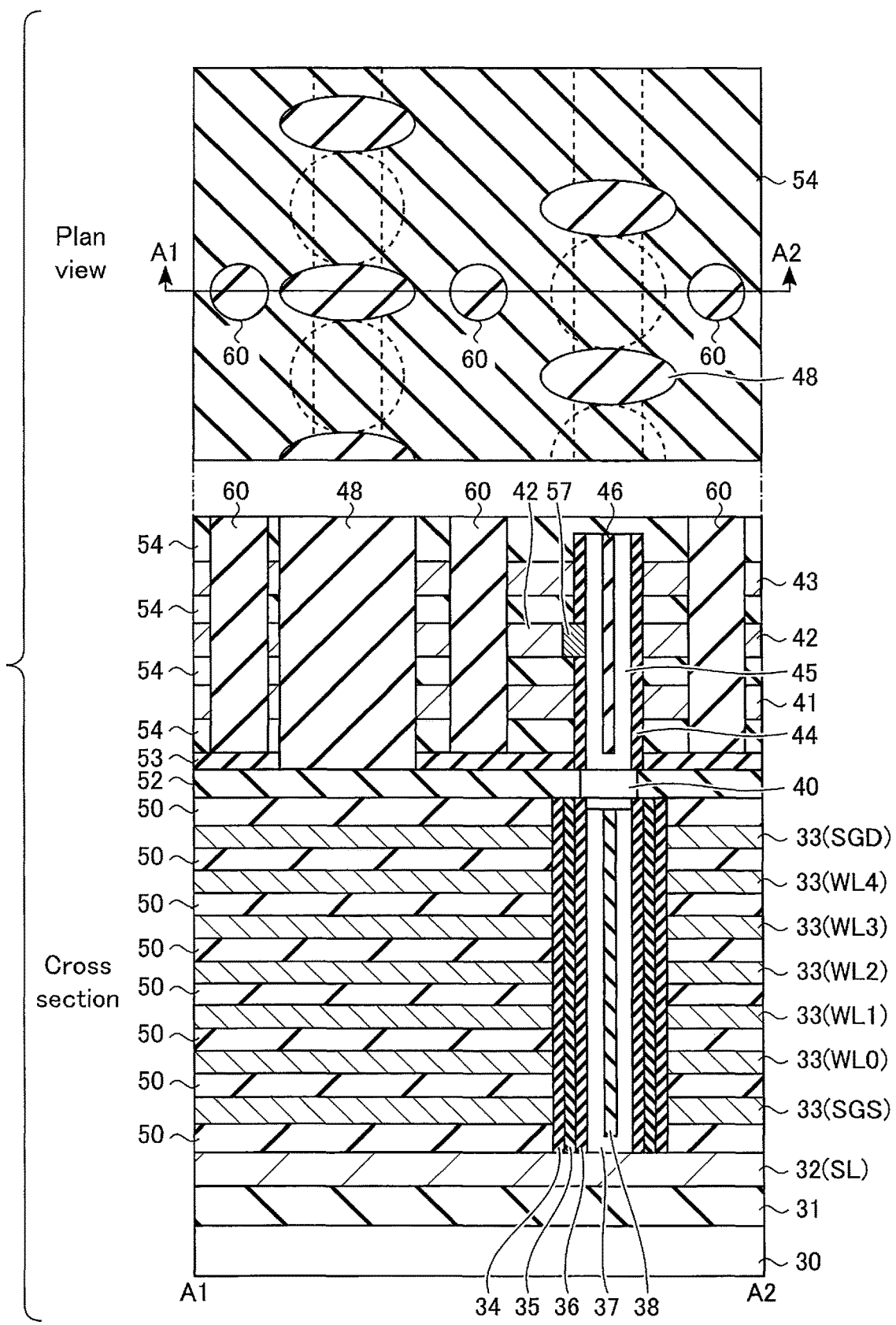

As illustrated in FIG. 22, the conductive layers 59 in the holes RH are removed, and the holes RH are filled with the insulating layers 60. For example, $SiO_2$ is used as the insulating layers 60. When the conductive layers 59 in the holes RH are removed, the etching amount is adjusted so as not to etch the conductive layers 59 in the region from which the semiconductor layer 56 and the sacrificial layer 55 have been removed. Accordingly, the conductive layers 59 are separated into three layers in the Z direction, and the interconnecting layers 41 to 43 are formed.

2.2 Second Example

Next, a second example will be described with reference to FIG. 23 to FIG. 31. The examples of FIG. 23 to FIG. 31 are a plan view of the readout circuit unit RCU and a cross-sectional view taken along a line A1-A2 of the plan view. In this example, a case where the readout circuit unit RCU is formed without using replacement will be described.

Figure 23:
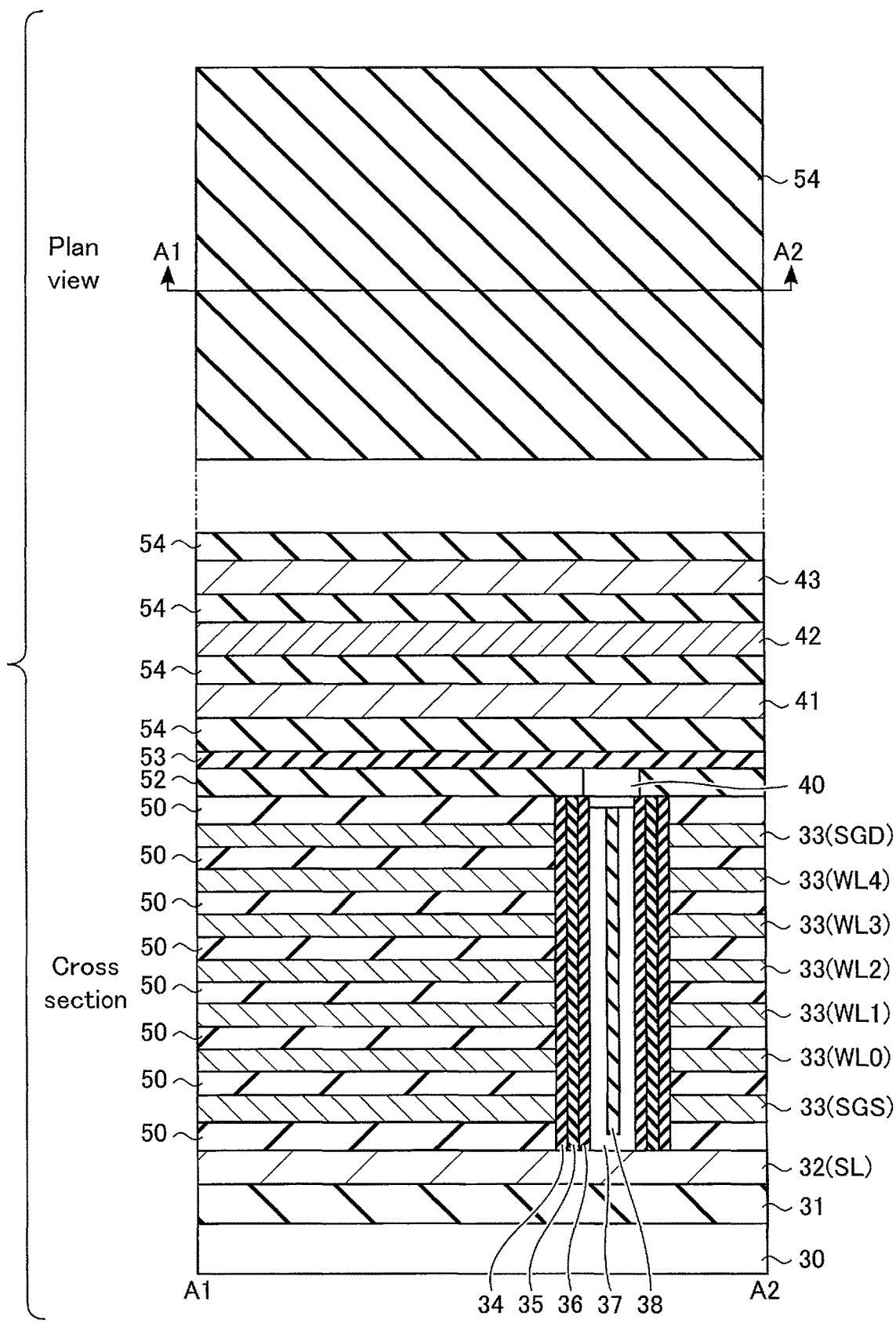

As illustrated in FIG. 23, the memory pillar MP, the interconnecting layers 33, and the semiconductor layer 40 are formed in the same manner as in FIGS. 7 to 9 of the first example.

Next, the insulating layer 53 is formed. In this example, SiN is used as the insulating layer 53, for example.

Next, an insulating layer 54, an interconnecting layer 41, an insulating layer 54, an interconnecting layer 42, an insulating layer 54, and an interconnecting layer 43 are sequentially layered on the insulating layer 53.

In the present example, conductive materials having different etching selectivity are used for the interconnecting layers 41 and 43 and the interconnecting layer 42. For example, metal materials may be used as the interconnecting layers 41 and 43, and a p-type semiconductor may be used. More specifically, for example, a layered structure of TiN and W may be used as the metal material. As the p-type semiconductor, for example, doped polysilicon doped with boron (B) may be formed by CVD. Also, for example, an n-type semiconductor is used as the interconnecting layer 42. For example, doped polysilicon doped with phosphorus (P) or arsenic (As) may be formed as an n-type semiconductor by CVD.

Figure 24:
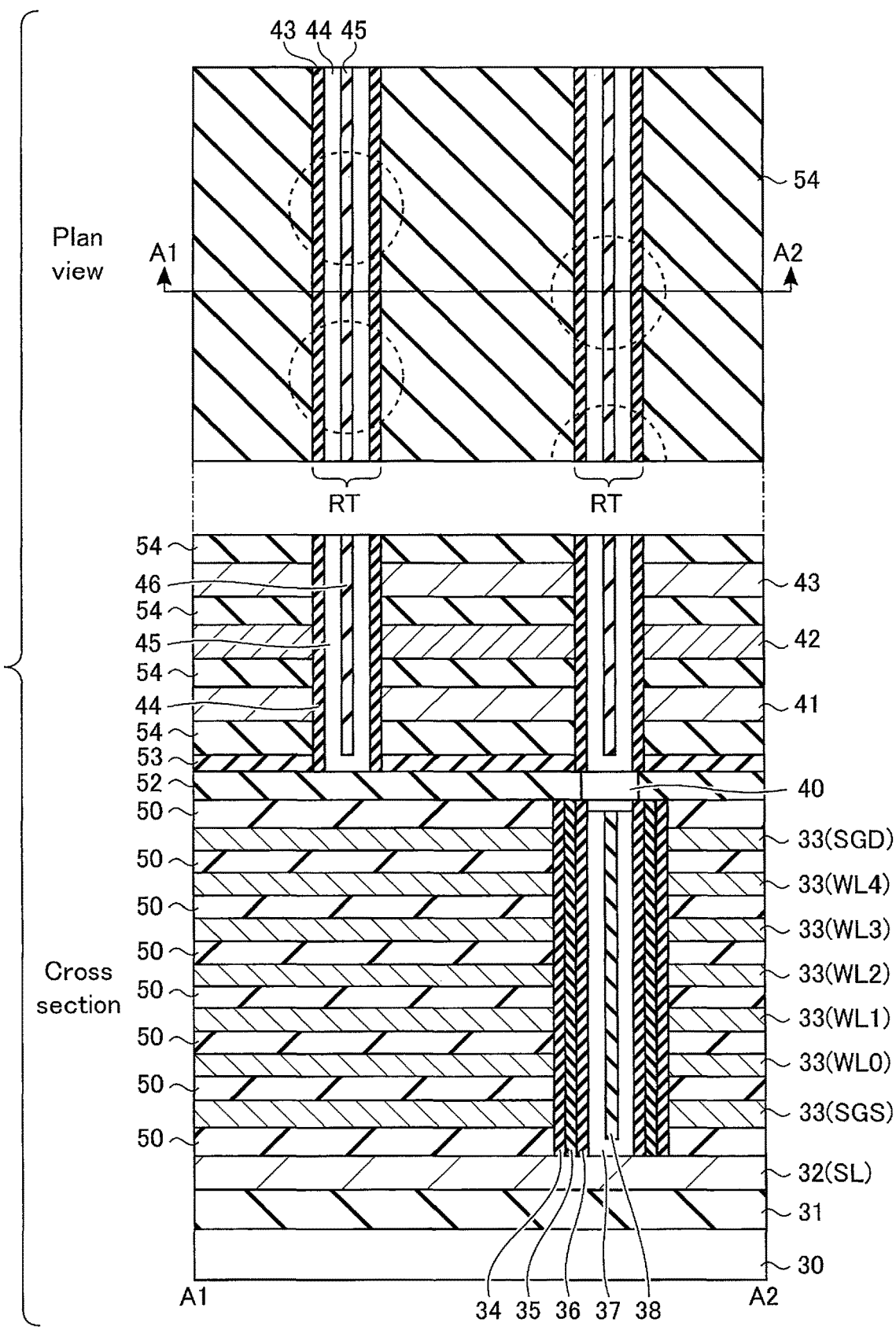

As illustrated in FIG. 24, after forming the trench RT in the same manner as in FIG. 11 of the first example, the insulating layer 44, the semiconductor layer 45, and the insulating layer 46 are formed in the trench RT.

Figure 25:
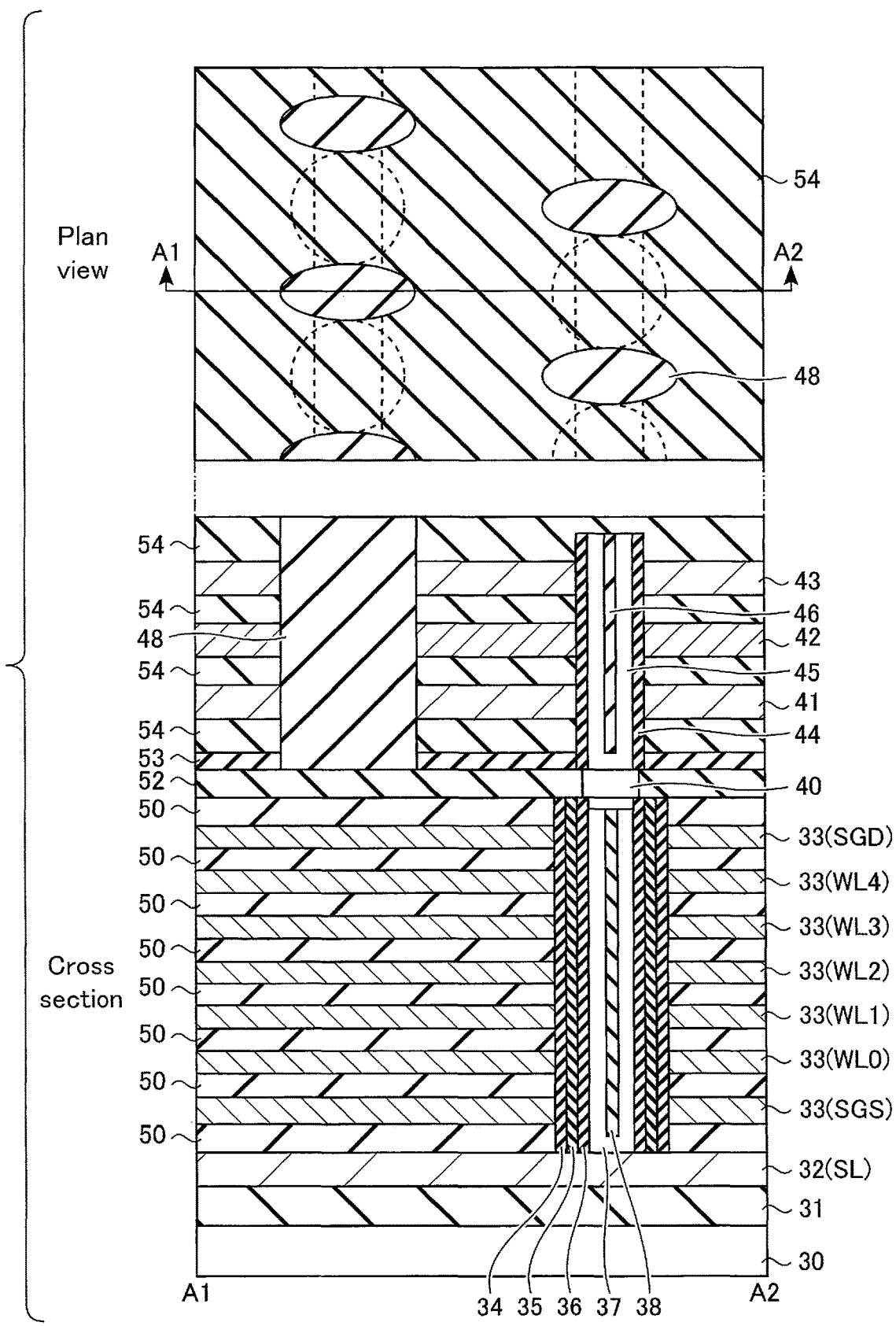

As illustrated in FIG. 25, the holes AH are formed and an interior is embedded by insulating layer 48 in the same manner as in the first example illustrated in FIG. 12.

Figure 26:
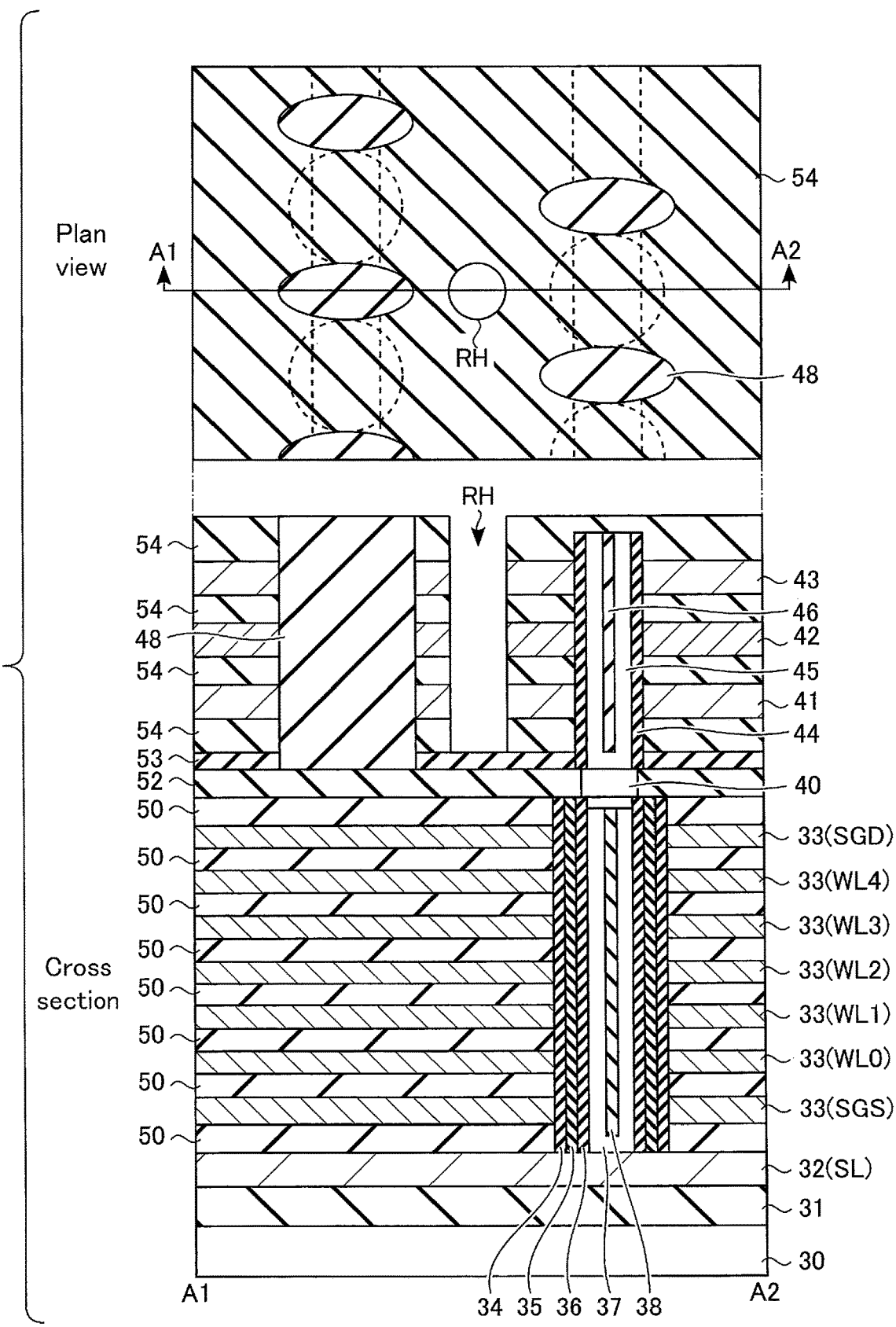

As illustrated in FIG. 26, in the region where the cell source line CSL is formed, the hole RH where the bottom surface reaches the insulating layer 53 is formed.

Figure 27:
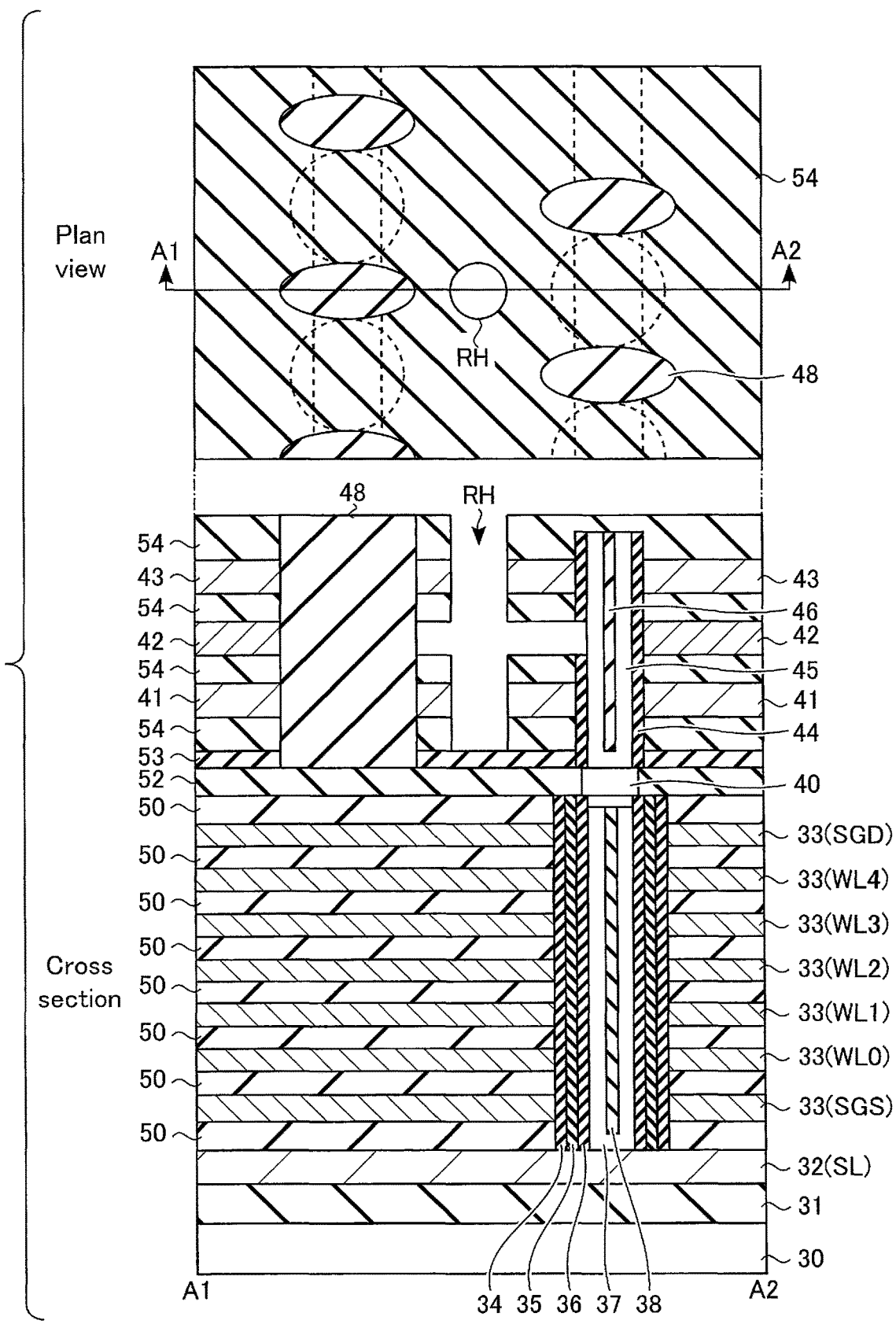

As illustrated in FIG. 27, the interconnecting layer 42 exposed on the side surface of the hole RH is removed. Next, the insulating layer 44 on the side surface of the trench RT exposed by removing the interconnecting layer 42 is removed to expose the semiconductor layer 45.

Figure 28:
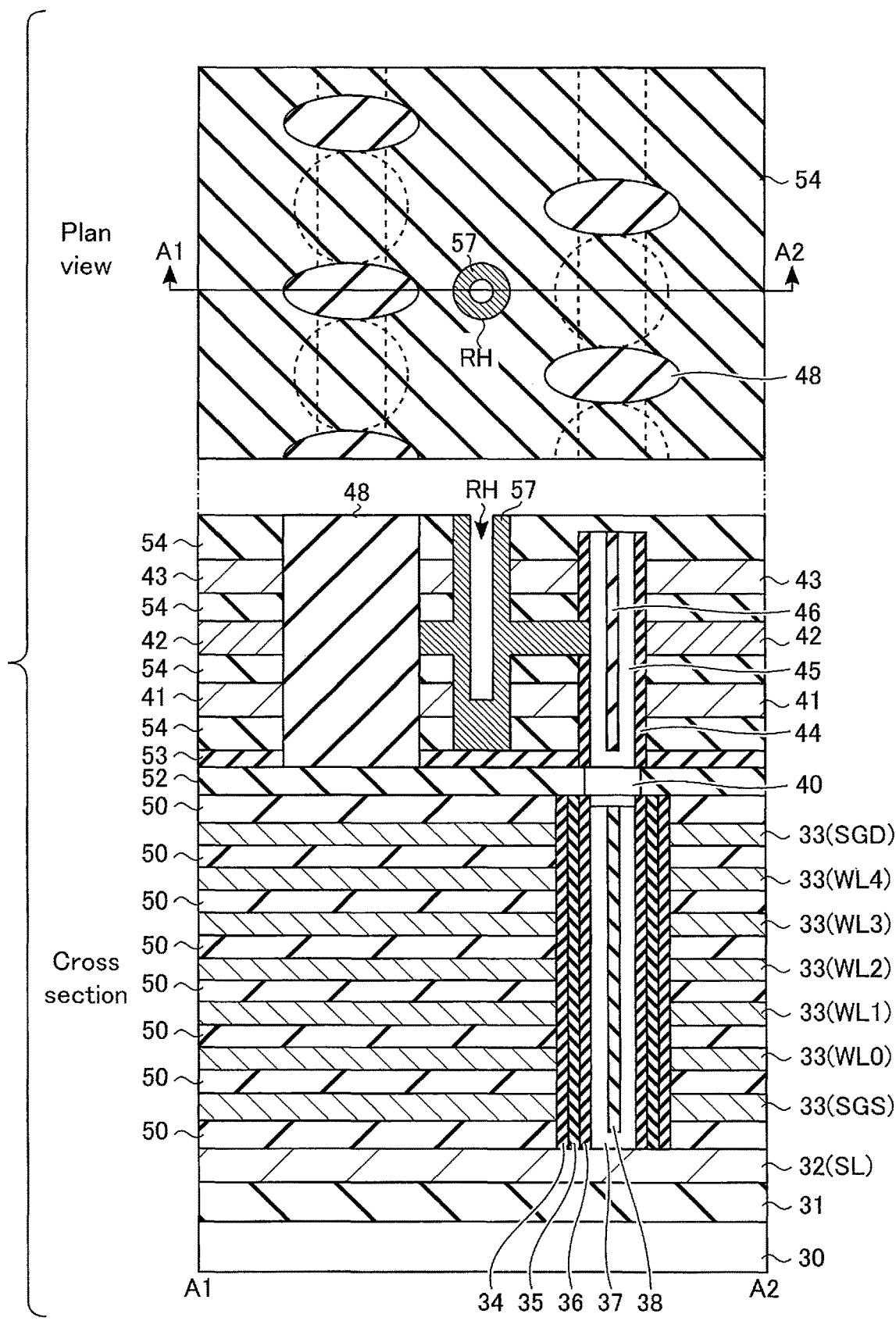

As illustrated in FIG. 28, the conductive layer 57 is formed in the hole RH and the region from which the interconnecting layer 42 has been removed. The conductive layer 57 is in contact with the exposed side surface of the semiconductor layer 45. As the conductive layer 57, for example, an n-type semiconductor is used.

As illustrated in FIG. 29, the conductive layer 57 in the hole RH is etched. At this time, in the region from which the semiconductor layer 56 has been removed, the etching amount is adjusted so that the conductive layer 57 remains in a portion in contact with the semiconductor layer 45.

Figure 30:
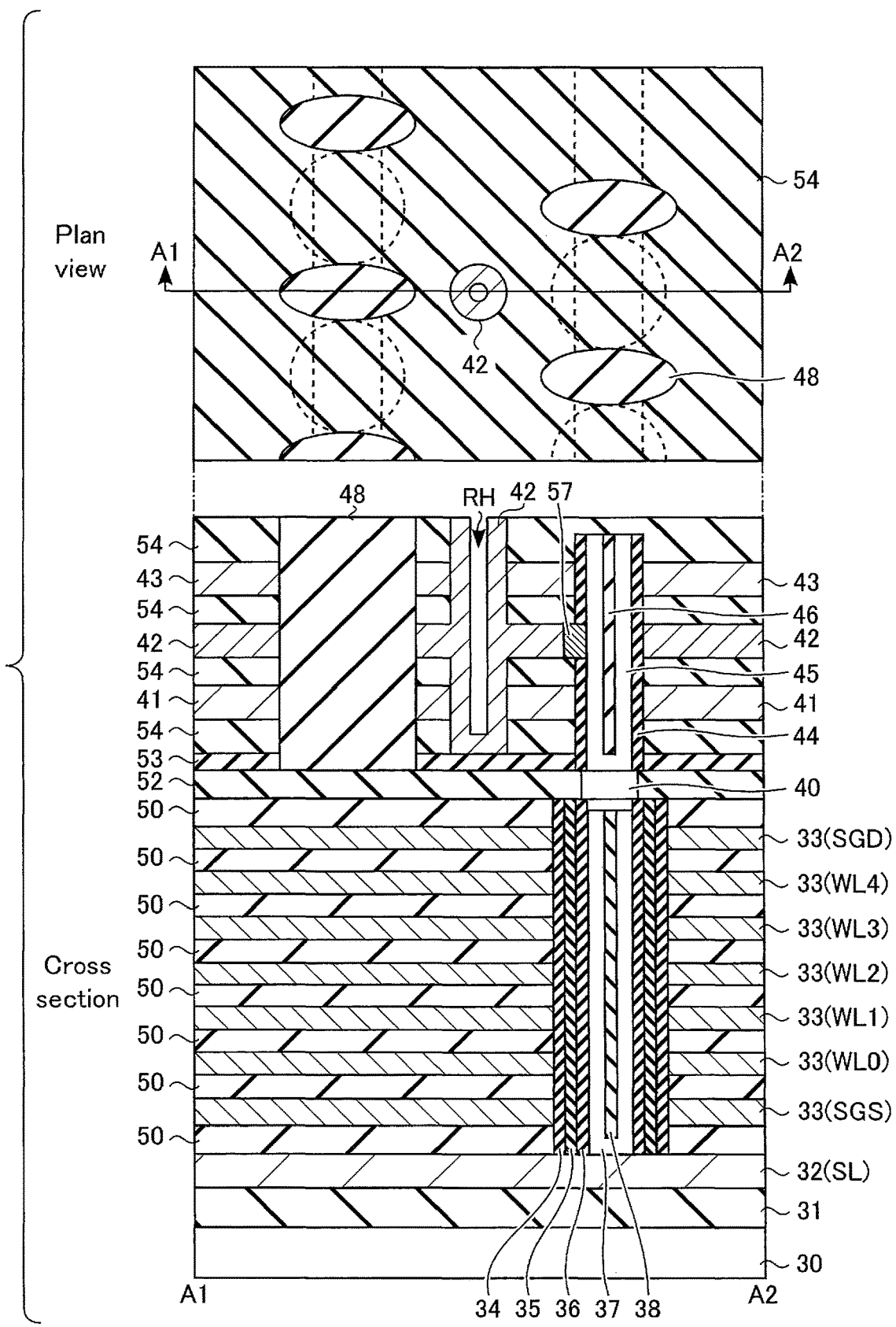

As illustrated in FIG. 30, the interconnecting layer 42 is formed in the hole RH and the region from which the interconnecting layer 42 has been removed.

Figure 31:
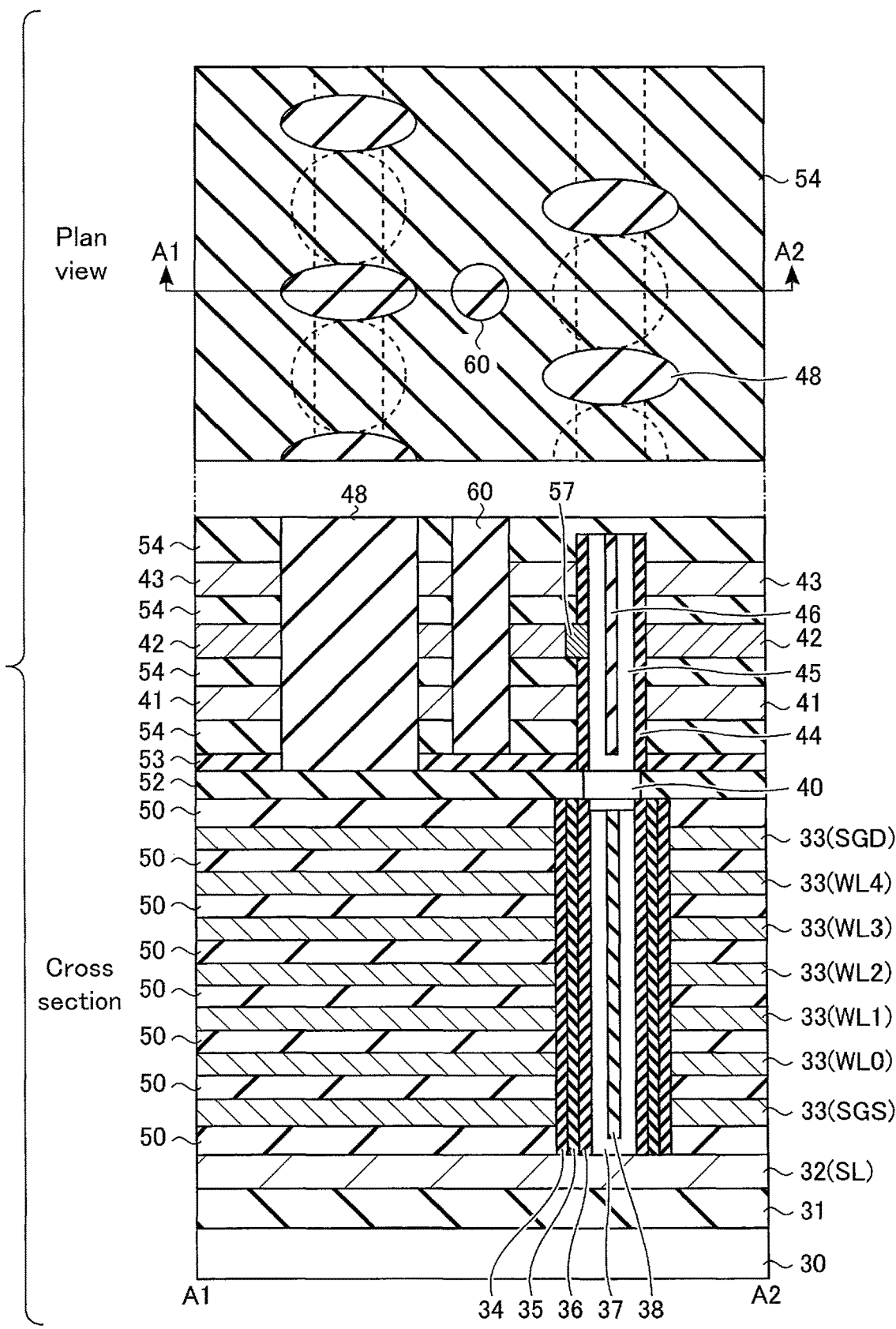

As illustrated in FIG. 31, the interconnecting layer 42 in the holes RH are removed, and the holes RH are filled with the insulating layers 60. For example, $SiO_2$ is used as the insulating layers 60.

2.3 Effects of Present Embodiment

The configuration according to the present embodiment can be applied to the first embodiment.

3. Third Embodiment

Next, a third embodiment will be described. In the third embodiment, coupled regions with the readout circuit unit RCU and the upper interconnecting layer provided in the memory cell array 18 will be described. Differences from the first and second embodiments will be mainly described below.

3.1 Planar Configuration of Readout Circuit Unit and Memory Cell Array

First, planar configurations of the readout circuit unit RCU and the memory cell array 18 will be described with reference to FIG. 32. It should be noted that in the example of FIG. 32, the insulating layers 50 and 52 to 54 described in the second embodiment are omitted.

Figure 32:
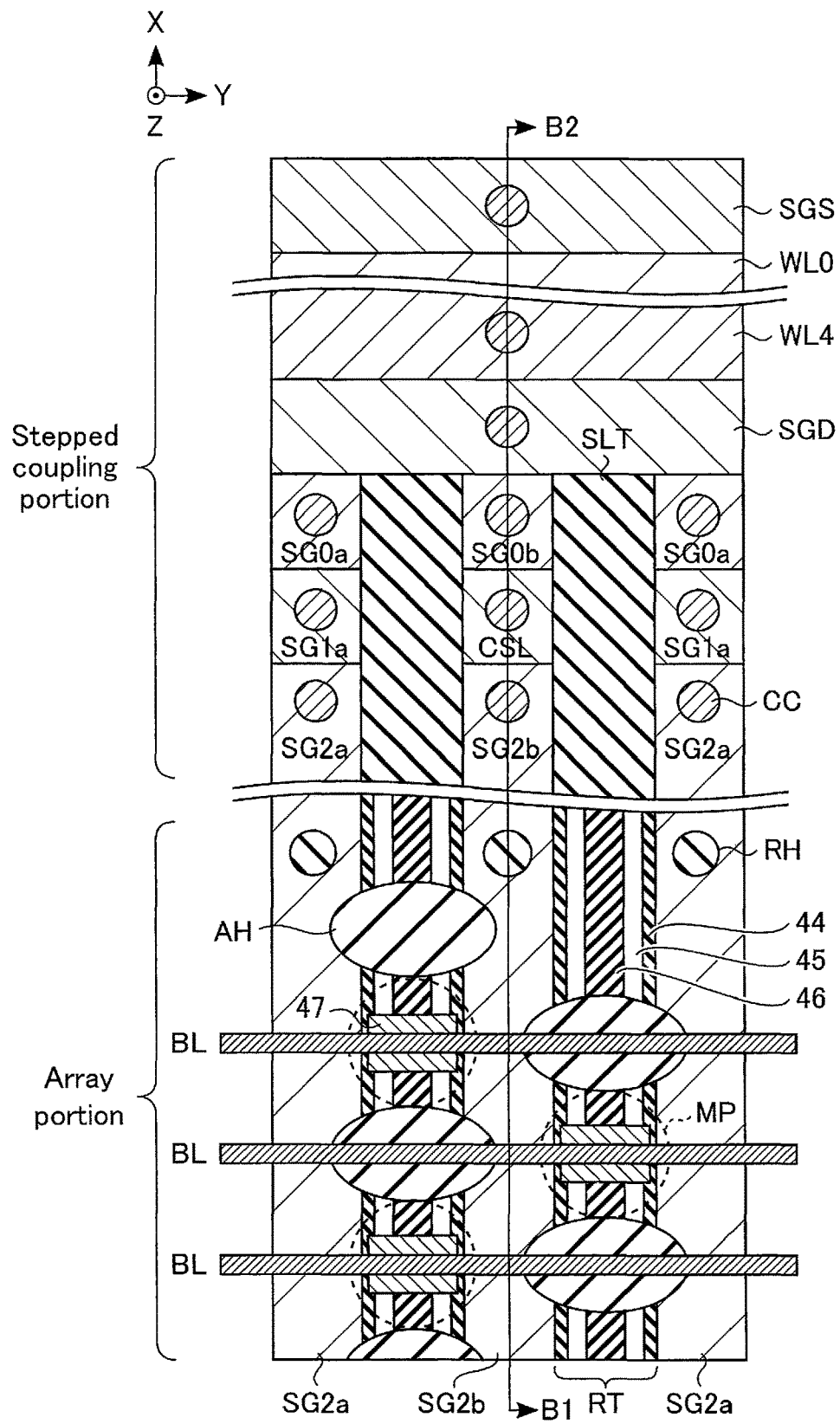
FIG. 32 is a plan view of a memory cell array and a readout circuit unit included in the semiconductor memory device according to a third embodiment.

As illustrated in FIG. 32, the readout circuit unit RCU and the memory cell array 18 include an array portion and a stepped coupling portion.

In the array portion, a plurality of the memory pillars MP and the readout circuit unit RCU are formed. A conductive layer 47 is formed on the readout circuit unit RCU, that is, on the semiconductor layer 45 and the insulating layer 46. For example, on the conductive layer 47, a bit line BL extending in the Y direction is formed.

The stepped coupling portion includes a plurality of contact plugs CC coupled to selection gate lines SG0a, SG1a, SG2a, SG0b, and SG2b and the cell source line CSL of the readout circuit unit RCU, and selection gate lines SGD and SGS and word lines WL0 to WL4 of the memory cell array 18. A interconnecting layer (not illustrated) is formed on the contact plug CC.

In the stepped coupling portion, the interconnecting layer 43 corresponding to the selection gate line SG2a of the readout circuit unit RCU, the interconnecting layer 42 corresponding to the selection gate line SG1a, and the interconnecting layer 41 corresponding to the selection gate line SG0a are drawn from the array portion in the X direction toward the stepped coupling portion in a staircase pattern. Further, the interconnecting layer 43 corresponding to the selection gate line SG2b, the interconnecting layer 42 corresponding to the cell source line CSL, and the interconnecting layer 41 corresponding to the gate line SG0b are drawn from the array portion in the X direction toward the stepped coupling portion in a staircase pattern so that the interconnecting layers 41 to 43 are adjacent to each other in the Y direction via the slit SLT configured to separate in the Y direction.

Further, in the memory cell array 18, the interconnecting layers 33 corresponding to the selection gate line SGD, the word lines WL4 to WL0, and the selection gate line SGS are drawn out from the array portion in the X direction toward the stepped coupling portion at a position farther from the array portion than the stepped coupling portion of the readout circuit unit RCU.

Each of the interconnecting layers 33 and 41 to 43 is coupled to the contact plug CC in a drawn end region.

Figure 33:
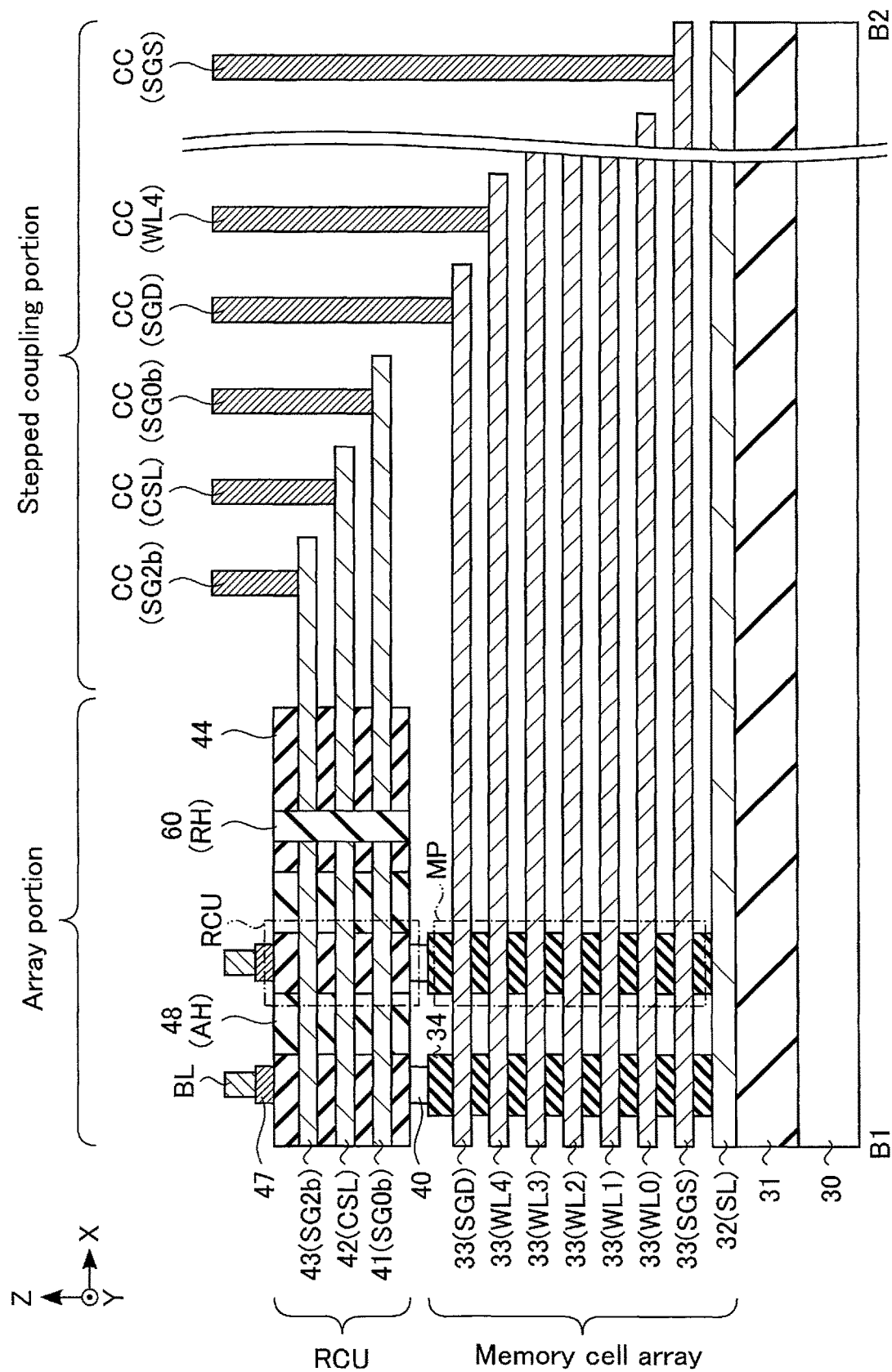
FIG. 33 is a cross-sectional view of the memory cell array and the readout circuit unit included in a semiconductor memory device according to the third embodiment.

3.2 Cross-Sectional Configuration of Readout Circuit Unit and Memory Cell Array Next, cross-sectional configurations of the readout circuit unit RCU and the memory cell array 18 will be described with reference to FIG. 33. FIG. 33 is a cross-sectional view taken along a line B1-B2 of FIG. 32 It should be noted that in the example of FIG. 33, the insulating layers 50 and 52 to 54 described in the second embodiment are omitted.

As illustrated in FIG. 33, seven interconnecting layers 33 and interconnecting layers 41 to 43 are layered above the interconnecting layer 32 apart from each other in the Z direction. The seven interconnecting layers 33 and the interconnecting layers 41 to 43 are drawn in the order of the interconnecting layer 43, the interconnecting layer 42, the interconnecting layer 41, and the seven interconnecting layers 33 in the X direction from the array portion to the stepped coupling portion. The contact plugs CC are provided on end regions of the interconnecting layers 33 and 41 to 43 drawn in the X direction.

3.3 Effects of Present Embodiment

The configuration according to the present embodiment can be applied to the first embodiment.

4. Fourth Embodiment

Next, a fourth embodiment will be described. In the fourth embodiment, a configuration of the readout circuit unit RCU having a latch function will be described. Points different from the first embodiment will be mainly described below.

4.1 Cross-Sectional Configuration of Readout Circuit Unit and Memory Cell Array First, an example of the cross-sectional configuration of the readout circuit unit RCU and the memory cell array 18 will be described with reference to FIG. 34. It should be noted that in the example of FIG. 34, a part of an interlayer insulating film is omitted.

Figure 34:
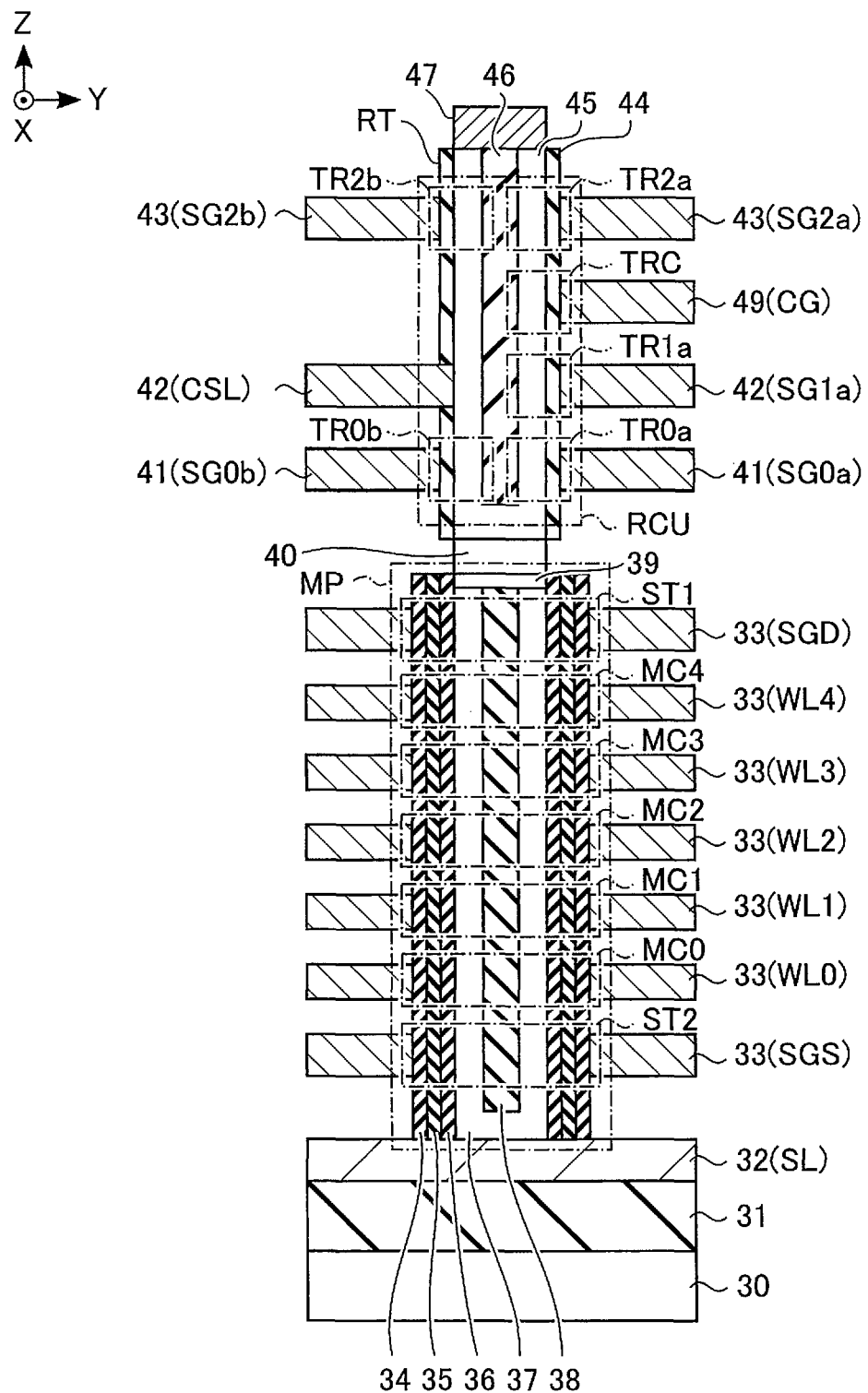
FIG. 34 is a cross-sectional view of a memory cell array and a readout circuit unit included in a semiconductor memory device according to a fourth embodiment.

As illustrated in FIG. 34, the configuration of the memory pillar MP is the same as that of FIG. 3 of the first embodiment.

The readout circuit unit RCU of the present embodiment includes, for example, six transistors TR (TR0a, TR1a, TR2a, TR0b, TR2b, and TRC). A different point from FIG. 3 is that a transistor TRC is provided between the transistors TR1a and TR2a.

The gate of the transistor TRC is coupled to a control gate line CG. The control gate line CG is coupled to the row decoder 19. An interconnecting layer 49 functioning as the control gate line CG is provided between the interconnecting layer 42 functioning as the selection gate line SG1a and the interconnecting layer 43 functioning as the selection gate line SG2a in the Z direction. The interconnecting layer 49 is made of a conductive material. For example, a semiconductor, a metal material, or the like is used as the interconnecting layer 49.

The other configuration of the readout circuit unit RCU is the same as that of FIG. 3 of the first embodiment.

4.2 Writing Operation

Figure 35:
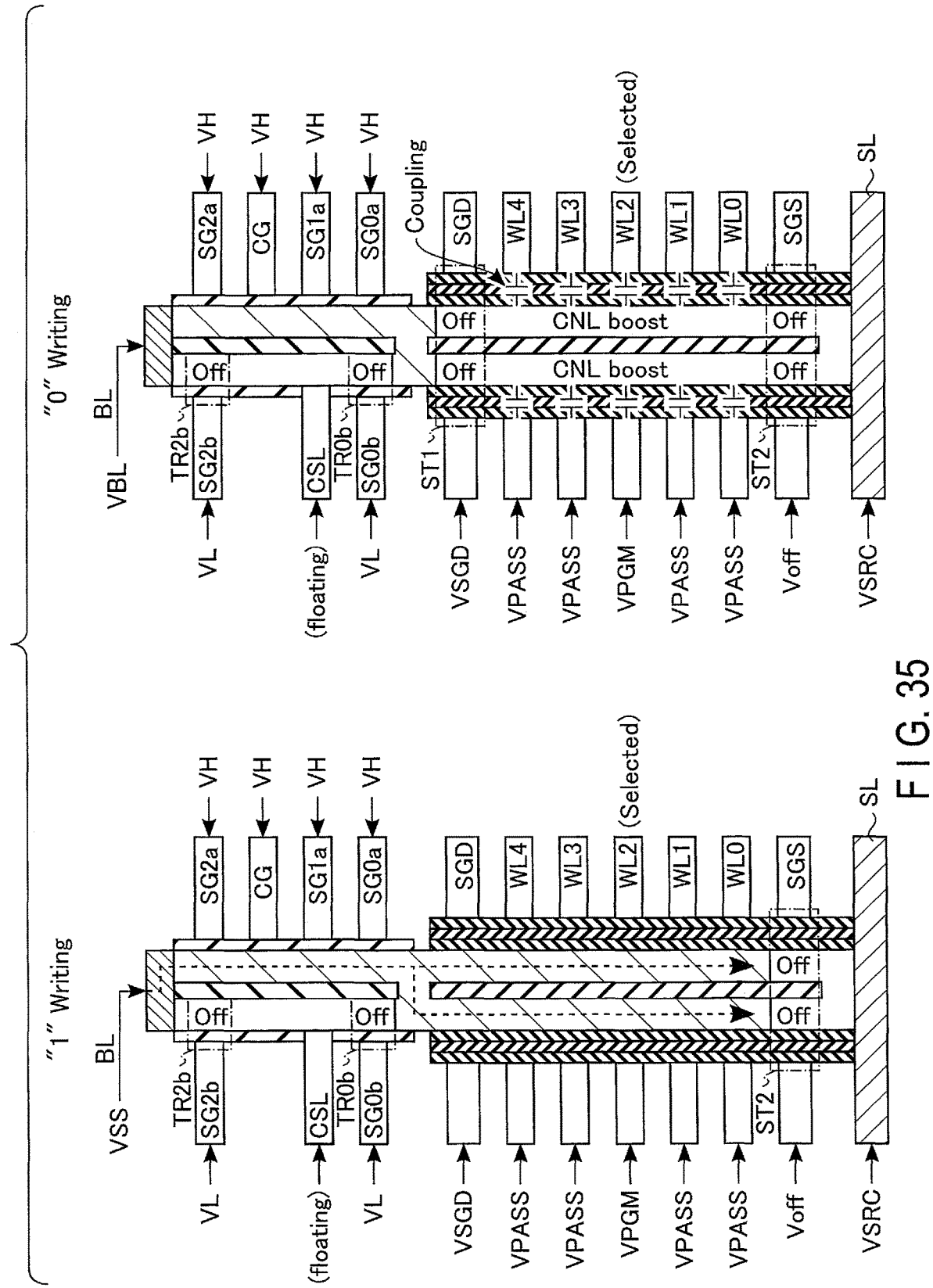
FIG. 35 is a diagram illustrating a writing operation of the semiconductor memory device according to the fourth embodiment.

Next, the writing operation will be described with reference to FIG. 35. FIG. 35 illustrates an example of the voltage of each interconnect during the writing operation.

As illustrated in FIG. 35, in the case of the writing operation, a voltage VH is applied to the selection gate lines SG0a, SG1a, and SG2a and the control gate line CG of the readout circuit unit RCU. Accordingly, the transistors TR0a, TR1a, TR2a, and TRC are turned ON, and the bit line BL and the memory pillar MP are electrically coupled. Further, a voltage VL is applied to selection gate lines SG0b and SG2b. Accordingly, the transistors TR0b and TR2b are turned into the OFF state. Therefore, cell source line CSL is not electrically coupled to bit line BL and memory pillar MP. For example, cell source line CSL is in a floating state.

For example, a ground voltage VSS is applied to the bit line BL corresponding to the "1" writing operation. Further, the voltage VBL is applied to the bit line BL corresponding to the "0" writing operation.

In the memory pillar MP, a voltage VSGD is applied to the selection gate line SGD. A voltage Voff is applied to the selection gate line SGS. Voltage VSRC is applied to source line SL.

In this state, a voltage VPGM is applied to the selected word line WL2, and a voltage VPASS is applied to non-selected word lines WL0, WL1, WL3 and WL4.

In the memory pillar MP corresponding to the "1" writing operation, the selection transistor ST1 is in the ON state. Therefore, charges are injected into the charge storage layer 35, and the threshold voltage of the memory cell transistor MC rises.

In the memory pillar MP corresponding to the "0" writing operation, the selection transistors ST1 and ST2 are in the OFF state. Therefore, since only little charges are injected into the charge storage layer 35, the threshold voltage of the memory cell transistor MC is maintained.

4.3 Reading Operation

Figure 36:
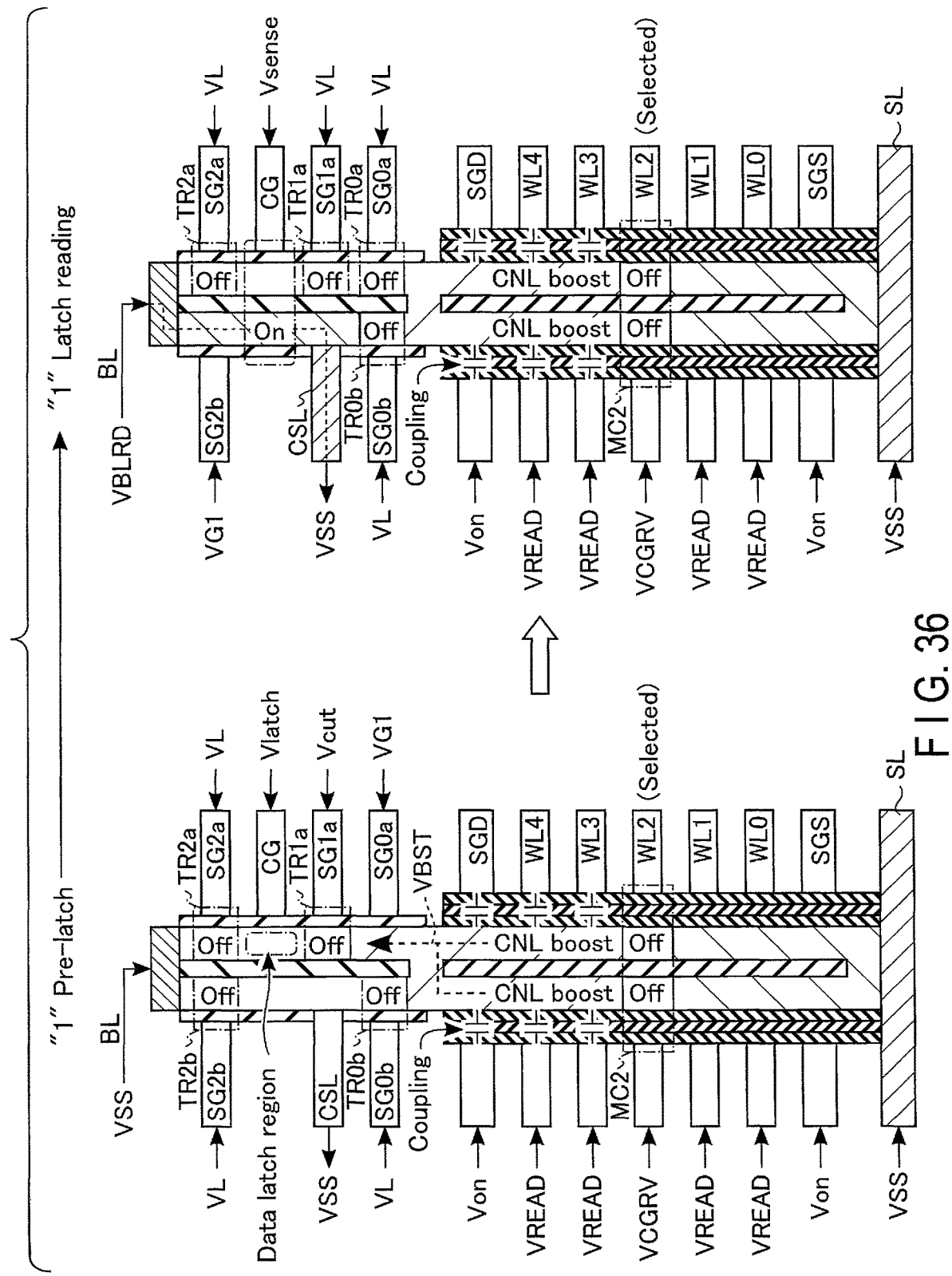
FIG. 36 illustrates a "1" reading operation of the semiconductor memory device according to the fourth embodiment.

Next, the reading operation will be described with reference to FIG. 36 and FIG. 37. FIG. 36 and FIG. 37 illustrate an example of the voltage of each interconnect during the reading operation. The reading operation in the present embodiment includes a pre-latch operation for latching data read from the memory cell transistor MC in the readout circuit unit RCU, and a latch reading operation for reading data from the readout circuit unit RCU. Hereinafter, when limiting the pre-latch operation and the latch reading operation corresponding to the "1" reading operation respectively, they are respectively referred to respectively as ""1" pre-latch operation" and ""1" latch reading operation", and when limiting the pre-latch operation and the latch reading operation corresponding to the "0" reading operation respectively, they are referred to respectively as ""0" pre-latch operation" and ""0" latch reading operation".

First, the "1" reading operation will be described.

As illustrated in FIG. 36, in the "1" pre-latch operation, the voltage VSS is applied to the bit line BL and the source line SL. In memory pillar MP, a voltage Von is applied to the selection gate lines SGD and SGS. Accordingly, the selection transistors ST1 and ST2 are turned ON. The read voltage VCGRV is applied to the selected word line WL2, and the voltage VREAD is applied to the non-selected word lines WL0, WL1, WL3 and WL4.

In the memory pillar MP corresponding to the "1" reading operation, the memory cell transistor MC2 is in the OFF state. Therefore, the voltage VBST is applied to the readout circuit unit RCU.

In this state, the voltage VL is applied to the selection gate lines SG0b, SG2a, and SG2b of the readout circuit unit RCU. Accordingly, the transistors TR0b, TR2a, and TR2b are turned into the OFF state. The voltage VSS, for example, is applied to the cell source line CSL. By turning the transistors TR0b, TR2a, and TR2b into the OFF state, the bit line BL, the memory pillar MP, and the cell source line CSL are not electrically coupled.

A voltage VG1 is applied to the selection gate line SG0a. The voltage VG1 is higher than the voltage VBST. Accordingly, the transistor TR0a is turned ON. A voltage Vcut is applied to the selection gate line SG1a. The voltage Vcut is a voltage which is lower than the voltage VG1 and turns the transistor TR1a to which the voltage VSS is applied into the ON state, and turns the transistor TR1a to which the voltage VBST is applied into the OFF state. Therefore, in the readout circuit unit RCU corresponding to the "1" reading operation, the transistor TR1a is turned into the OFF state. The voltage Vlatch is applied to the control gate line CG. For example, the voltage Vlatch is higher than the voltage Vcut and lower than the voltage VG1. The voltage Vlatch is a voltage for latching data (charge) in the channel region (data latch region) of transistor TRC.

In the readout circuit unit RCU corresponding to the "1" pre-latch operation, since the transistor TR1a is turned into the OFF state, the charge is not latched in the data latch region. Next, in the "1" latch reading operation, the voltage VBLRD is applied to the bit line BL, and the voltage VSS is applied to the source line. The same voltage as in the pre-latch operation is applied to the word lines WL and the selection gate lines SGD and SGS.

The voltage VL is applied to the selection gate lines SG0a, SG1a, TR2a, and SG0b of the readout circuit unit RCU. Accordingly, the transistors TR0a, TR1a, TR2a, and TR0b are turned into the OFF state. The voltage VG1 is applied to the selection gate line SG2b. Accordingly, the transistor TR2b is turned ON. The voltage VSS is applied to the cell source line CSL.

When the transistors TR1a and TR2a are in the OFF state, the transistor TRC can be regarded as a transistor in which the semiconductor layer 45 provided between the transistor TR1a and the transistor TR2a functions as a charge storage layer, and a channel is formed in the semiconductor layer 45 provided between the transistor TR2b and the cell source line CSL. Therefore, in accordance with the voltage of the control gate line CG, a channel is formed in the semiconductor layer 45 provided between the transistor TR2b and the cell source line CSL. In this state, a voltage Vsense is applied to control gate line CG. The voltage Vsense is higher than the voltage VSS and lower than the voltage Vcut. For example, in the "1" latch reading operation, since the charge is not trapped in the semiconductor layer 45 provided between transistors TR1a and the transistor TR2a (the threshold voltage of the transistor TRC is not increased), the transistor TRC is turned into the ON state. In other words, a channel is formed in the semiconductor layer 45 provided between the transistor TR2b and the cell source line CSL. Accordingly, the bit line BL and the cell source line CSL are electrically coupled, and a current flows from the bit line BL to the cell source line CSL.

Next, the "0" reading operation will be described.

As illustrated in FIG. 37, in the "0" pre-latch operation, the voltage applied to each interconnect is the same as in FIG. 36.

The memory cell transistor MC2 of the memory pillar MP corresponding to the "0" reading operation is turned ON. Therefore, the voltage VSS is applied to the readout circuit unit RCU from the source line SL.

Accordingly, the transistor TR1a of the readout circuit unit RCU is turned into the ON state. Therefore, the charge is latched in the data latch region of the transistor TRC.

Next, in the "0" latch reading operation, the voltage applied to each interconnect is the same as in FIG. 37.

In the readout circuit unit RCU, since the charge is trapped in the semiconductor layer 45 provided between the transistor TR1a and the transistor TR2a (the threshold voltage of the transistor TRC is increased), the transistor TRC is in the OFF state. In other words, a channel is not formed in the semiconductor layer 45 provided between the transistor TR2b and the cell source line CSL. Therefore, the bit line BL and cell source line CSL are not electrically coupled. Therefore, almost no current flows from the bit line BL to the cell source line CSL.

In the latch reading operation, the sense amplifier 21 reads data by detecting a current (or a change in voltage) flowing from the bit line BL to the cell source line CSL.

4.4 Effects of Present Embodiment

With the configuration according to the present embodiment, the same effects as that of the first embodiment can be obtained.

Furthermore, in the configuration according to the present embodiment, the reading operation is performed after the data (charge) is latched in the readout circuit unit RCU, so that the reading operation can be executed even if the voltage VBST is a relatively low voltage. Therefore, the reliability can be improved.

Furthermore, with the configuration according to the present embodiment, the charge can be held in the readout circuit unit RCU. Therefore, for example, even in the case where the voltage VBST decreases with time due to a leak of a channel or the like, erroneous reading can be suppressed.

5. Fifth Embodiment

Next, a fifth embodiment will be described. In the fifth embodiment, the configuration of a memory pillar MP different from the first to fourth embodiments will be described.

Differences from the first to fourth embodiments will be mainly described below.

5.1 Configuration

5.1.1 Circuit Configuration of Memory Cell Array

Next, an example of the circuit configuration of the memory cell array 18 according to the present embodiment will be described with reference to FIG. 38. The example of FIG. 38 illustrates the block BLK0, but the configuration of the other blocks BLK is also the same.

Figure 38:
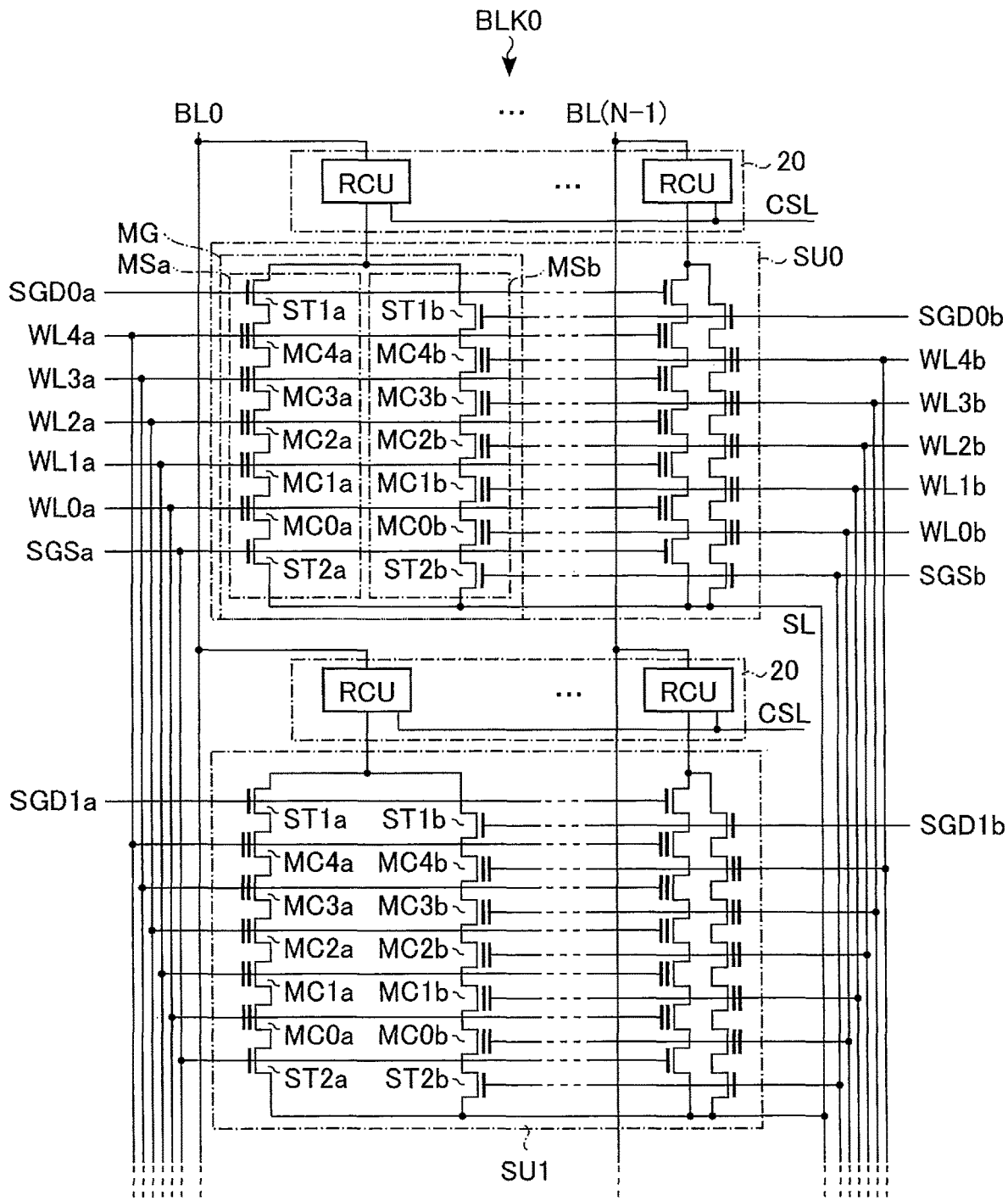
FIG. 38 is a circuit diagram of a memory cell array provided in a semiconductor memory device according to a fifth embodiment.

As illustrated in FIG. 38, the block BLK0 includes a plurality of string units SU. Each string unit SU includes a plurality of memory groups MG. Each memory group MG includes two memory strings MSa and MSb. Hereinafter, when the memory strings MSa and MSb do not have to be discriminated from each other, they are collectively referred to as "memory string MS".

Memory string MSa includes, for example, five memory cell transistors MCa0 to MCa4, and selection transistors ST1a and ST2a. In the same manner, the memory string MSb includes, for example, five memory cell transistors MC0b to MC4b, and selection transistors ST1b and STR2b. When the memory cell transistors MC0a to MC4a and MC0b to MC4b do not have to be discriminated from each other, they are collectively referred to as "memory cell transistors MC". Further, for example, when the memory cell transistors MC0a and MC0b do not have to be discriminated from each other, they are collectively referred to as a memory cell transistor MC0. The same applies to the other memory cell transistors MC. Furthermore, when the selection transistors ST1a and ST1b do not have to be discriminated from each other, they are hereinafter referred to as a selection transistor ST1. When the selection transistors ST2a and STR2b do not have to be discriminated from each other, it is described as a selection transistor ST2.

It should be noted that the memory cell transistor MC may be a MONOS type using an insulating film as the charge storage layer, or may be an FG type using a conductive layer as the charge storage layer. In the present embodiment, the FG type will be described below as an example. The number of memory cell transistors MC is not limited to five, and may be eight, sixteen, thirty-two, sixty-four, ninety-six, one-hundred twenty-eight, etc., and the number is not limited. Further, one or more selection transistors ST1 and ST2 may be provided in each of the memory string MS.

In the memory string MS, respective current paths are coupled in series to the selection transistor ST2, the memory cell transistors MC0 to MC4, and the selection transistor ST1 in this order. More specifically, in the memory string MSa, respective current paths of the selection transistor ST2a, the memory cell transistors MC0a to MC4a, and the selection transistor ST1a are coupled in series in this order. In the same manner, in the memory string MSb, respective current paths of the selection transistor ST2b, the memory cell transistors MC0b to MC4b, and the selection transistor ST1b are coupled in series in this order. The drain of the selection transistor ST1a and the drain of the selection transistor ST1b included in the memory group MG are commonly coupled to the readout circuit unit RCU. The plurality of bit lines BL are independently controlled by the sense amplifier 21. The source of the selection transistor ST2a and the source of the selection transistor ST2b included in each memory group MG in the block BLK are commonly coupled to the source line SL.

Control gates of the plurality of memory cell transistors MC0a to MC4a and MC0b to MC4b in the same block BLK are commonly coupled to word lines WL0a to WL4a and WL0b to WL4b provided for each block BLK. Hereinafter, when the word lines WL0a to WL4a and WL0b to WL4b do not have to be discriminated from each other, they are collectively referred to as "word lines WL". Further, for example, when the word lines WL0a and WL0b do not have to be discriminated from each other, they are collectively referred to as "word line WL0". The same applies to the other word lines WL1 to WL4. The word lines WL0 to WL4 are coupled to the row decoder 19.

The gates of the plurality of selection transistors ST1a in the same string unit SU are commonly coupled to the selection gate line SGDa, and the gates of the plurality of selection transistors ST1b are commonly coupled to the selection gate line SGDb. More specifically, the gates of the plurality of selection transistors ST1a in the string unit SU0 are commonly coupled to the selection gate line SGD0a, and the gates of the plurality of selection transistors ST1b are commonly coupled to the selection gate line SGD0b. In the same manner, the gates of the plurality of selection transistors ST1a in the string unit SU1 are commonly coupled to the selection gate line SGD1a, and the gates of the plurality of selection transistors ST1b are commonly coupled to the selection gate line SGDb1. The selection gate line SGD is coupled to the row decoder 19.

The gates of the plurality of selection transistors ST2a in the same block BLK are commonly coupled to the selection gate line SGSa, and the gates of the plurality of selection transistors ST2b are commonly coupled to the selection gate line SGSb. It should be noted that the selection gate lines SGSa and SGSb may be provided for each string unit SU.

The plurality of memory groups MG in the block BLK are coupled to different readout circuit units RCU. The plurality of readout circuit units RCU corresponding to one string unit SU are commonly coupled to, for example, a cell source line CSL. Further, the plurality of readout circuit units RCU corresponding to one string unit SU are coupled to different bit lines BL (BL0 to BL (N−1)). In other words, the plurality of memory groups MG in the string unit SU are coupled to different bit lines BL via different readout circuit units RCU. The bit lines BL are coupled to the sense amplifier 21. Further, one memory group MG of each string unit SU in the block BLK is commonly coupled to one bit line BL via the corresponding readout circuit unit RCU.

The sources of the selection transistors ST2a and ST2b in the plurality of blocks BLK are commonly coupled to the source line SL.

5.1.2 Cross-Sectional Configuration of Readout Circuit Unit and Memory Cell Array Next, an example of the cross-sectional configuration of readout circuit unit RCU and memory cell array 18 will be described with reference to FIG. 39. It should be noted that in the example of FIG. 39, a part of the interlayer insulating film is omitted.

As illustrated in FIG. 39, a configuration of the readout circuit unit RCU is the same as that of FIG. 3 of the first embodiment.

Next, the cross-sectional configuration of the memory cell array 18 will be described. In the present embodiment, the memory trench MT extending in the X direction is formed to separate the plurality of interconnecting layers 33 in the Y direction. In the example of FIG. 39, seven interconnecting layers 33 arranged on the right side of the drawing with respect to the memory trench MT function as the selection gate line SGSa, the word lines WL0a to WL4a, and the selection gate line SGDa. The seven interconnecting layers 33 arranged on the left side of the drawing with respect to the memory trench MT function as the selection gate line SGSb, the word lines WL0b to WL4b, and the selection gate line SGDb.

A plurality of block insulating films 64a and a plurality of charge storage layers 65a are formed between the memory trench MT and the interconnecting layers 33 functioning as the selection gate line SGSa, the word lines WL0a to WL4a, and the selection gate line SGDa. More specifically, in the XY plane, one side surface of the block insulating film 64a is in contact with any side surface of the interconnecting layer 33, and the other side surface of the block insulating film 64a is in contact with one side surface of the charge storage layer 65a. The other side surface of the charge storage layer 65a is in contact with the insulating layer 66 formed on the side surface of the memory trench MT in the XY plane. In the same manner, a plurality of block insulating films 64b and a plurality of charge storage layers 65b are formed between the memory trench MT and the interconnecting layer 33 which functions as the selection gate line SGSb, the word lines WL0b to WL4b, and the selection gate line SGDb.

An insulating layer 66 is formed on the side surface of the memory trench MT facing in the Y direction. Further, in the memory pillar MP, two semiconductor layers 67a and 67b are formed, extending in the Z direction, the side surfaces being in contact with the insulating layer 66, and the bottom surfaces being in contact with the interconnecting layer 32. Furthermore, an insulating layer 66 is formed between the two semiconductor layers 67a and 67b. The semiconductor layer 67a is a region in which the channels of the selection transistor ST2a, the memory cell transistors MC0a to MC4a, and the selection transistor ST1a are formed. Therefore, the semiconductor layer 67a functions as a signal line that couples current paths of the selection transistor ST2a, the memory cell transistors MC0a to MC4a, and the selection transistor ST1a. In the same manner, the semiconductor layer 67b is a region in which the channels of the selection transistor ST2b, the memory cell transistors MC0b to MC4b, and the selection transistor ST1b are formed. Therefore, the semiconductor layer 67b functions as a signal line that couples current paths of the selection transistor ST2b, the memory cell transistors MC0b to MC4b, and the selection transistor ST1b.

The insulating layer 66 provided between the semiconductor layer 67a and the charge storage layer 65a functions as a tunnel insulating film of the selection transistors ST1a and ST2b and the memory cell transistors MC0b to MC4b. In the same manner, the insulating layer 66 provided between the semiconductor layer 67b and the charge storage layer 65b functions as a tunnel insulating film of the selection transistors ST1b and ST2b and the memory cell transistors MC0b to MC4b.

An insulating material is used as the block insulating films 64a and 64b. The insulating material may be, for example, a layered structure of Hf (Si) Ox/SiO$_2$/Hf (Si) Ox using Hf and SiO$_2$, or may be SiO$_2$. Hf (Si) Ox may or may not contain Si in Hf Ox. For example, polysilicon is used as the charge storage layers 65a and 65b. It should be noted that the charge storage layers 65a and 65b may contain a metal such as TaN, TiN, W or Ru. For example, SiO$_2$ or SiON is used as the insulating layers 66. For example, polysilicon is used as the semiconductor layers 67a and 67b and the cap layer 69.

In the example of FIG. 39, the selection transistor ST2a, the memory cell transistors MC0a to MC4a, and the seven interconnecting layers 33 functioning as the selection transistor ST1a and the semiconductor layer 67a constitute a memory string MSa. More specifically, a region including interconnecting layer 33 functioning as selection gate line SGSa and semiconductor layer 67a constitutes the selection transistor ST2a. A region including the interconnecting layers 33 functioning respectively as the word lines WL0a to WL4a and the semiconductor layer 67a constitutes the memory cell transistors MC0a to MC4a, respectively. A region including interconnecting layer 33 functioning as the selection gate line SGDa and semiconductor layer 67a constitutes the selection transistor ST1a. In the same manner, the selection transistor ST2b, the memory cell transistors MC0b to MC4b, and the seven interconnecting layers 33 functioning as the selection transistor ST1b and the semiconductor layer 67b constitute a memory string MSb. More specifically, a region including interconnecting layer 33 functioning as selection gate line SGSb and semiconductor layer 67b constitutes the selection transistor ST2b. A region including the interconnecting layers 33 functioning respectively as the word lines WL0b to WL4b and the semiconductor layer 67b constitutes the memory cell transistors MC0b to MC4b, respectively. A region including interconnecting layer 33 functioning as the selection gate line SGDb and semiconductor layer 67b constitutes the selection transistor ST1b.

5.1.3 Planar Configuration of Readout Circuit Unit and Memory Cell Array

Next, planar configurations of the readout circuit unit RCU and the memory cell array 18 will be described with reference to FIG. 40. FIG. 40 illustrates the SG0 plane and the WL4 plane in the XY plane.

As illustrated in FIG. 40, the configuration on the SG0 plane is the same as FIG. 4 of the first embodiment.

Next, the WL4 plane will be described. The word lines WL4a (interconnecting layer 33) and the word lines WL4b (interconnecting layer 33) extending in the X direction are alternately arranged apart from each other in the Y direction. A memory trench MT extending in the X direction is formed between the word line WL4a and the word line WL4b. In the memory trench MT, the plurality of semiconductor layers 67a and 67b are disposed respectively in the X direction.

Also, the semiconductor layers 67a and 67b are disposed apart from each other in the Y direction. A charge storage layer 65a is formed in contact with the side surface of the memory trench MT facing the semiconductor layer 67a. Then, a block insulating film 64a is formed in contact with the charge storage layer 65a. In the same manner, the charge storage layer 65b is formed in contact with the side surface of the memory trench MT facing semiconductor layer 67b. Then, a block insulating film 64b is formed in contact with the charge storage layer 65b.

A region including the semiconductor layers 67a and 67b, the charge storage layers 65a and 65b, and the block insulating films 64a and 64b adjacent in the Y direction functions as one memory pillar MP. The one memory pillar MP corresponds to one memory group MG. A region including the interconnecting layer 33 functioning as the word line WL4a, the block insulating film 64a, the charge storage layer 65a, and the semiconductor layer 67a constitutes the memory cell transistor MC4a. In the same manner, a region including the interconnecting layer 33 functioning as the word line WL4b, the block insulating film 64b, the charge storage layer 65b, and the semiconductor layer 67b constitutes a memory cell transistor MC4b.

5.2 Writing Operation

Figure 41:
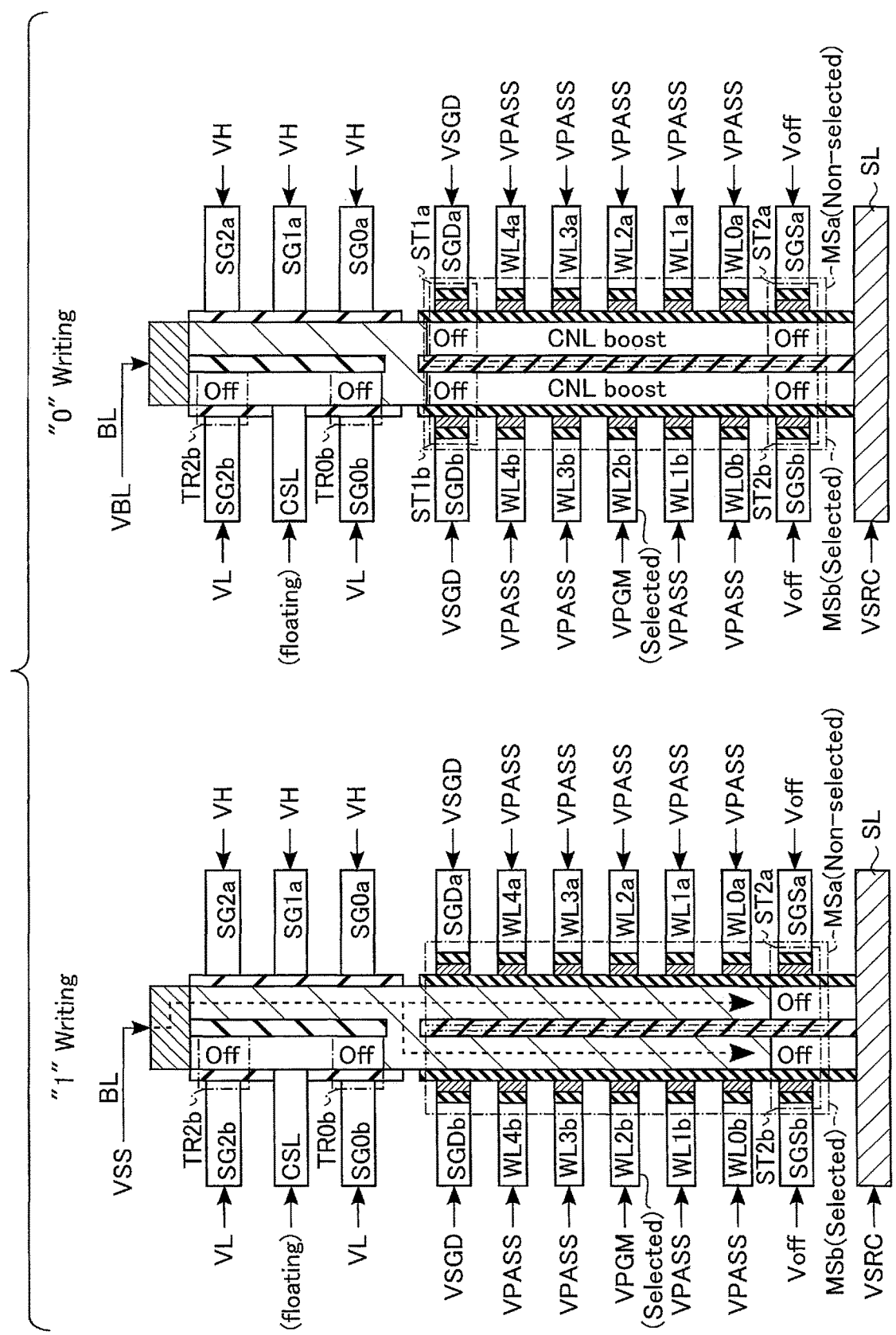
FIG. 41 is a diagram illustrating a writing operation of the semiconductor memory device according to the fifth embodiment.

Next, the writing operation will be described with reference to FIG. 41. FIG. 41 illustrates an example of the voltage of each interconnect during the writing operation.

As illustrated in FIG. 41, the voltages applied to the bit lines BL, the source lines SL, and each interconnect of the readout circuit unit RCU are the same as in FIG. 5 of the first embodiment.

In the memory pillar MP, voltage VSGD is applied to selection gate lines SGDa and SGDb. Voltage Voff is applied to selection gate lines SGSa and SGSb.

In this state, for example, when the word line WL2b is selected, a program voltage VPGM is applied to the selected word line WL2b, and the voltage VPASS is applied to non-selected word lines WL0b, WL1b, WL3b, WL4b, and WL0a to WL4a.

As a result, in the memory pillar MP corresponding to the "1" writing operation, charges are injected into the charge storage layer 35 corresponding to the memory cell transistor MC2b, and the threshold voltage of the memory cell transistor MC2b rises.

Further, in the memory pillar MP corresponding to the "0" writing operation, the selection transistors ST1a, ST1b, ST2a, and STR2b are in the cutoff state. Therefore, the channels of the memory strings MSa and MSb are in a floating state. As a result, almost no charge is injected into the charge storage layer 35 corresponding to the memory cell transistor MC2b. Therefore, the threshold voltage of the memory cell transistor MC2b is maintained.

5.3 Reading Operation

Figure 42:
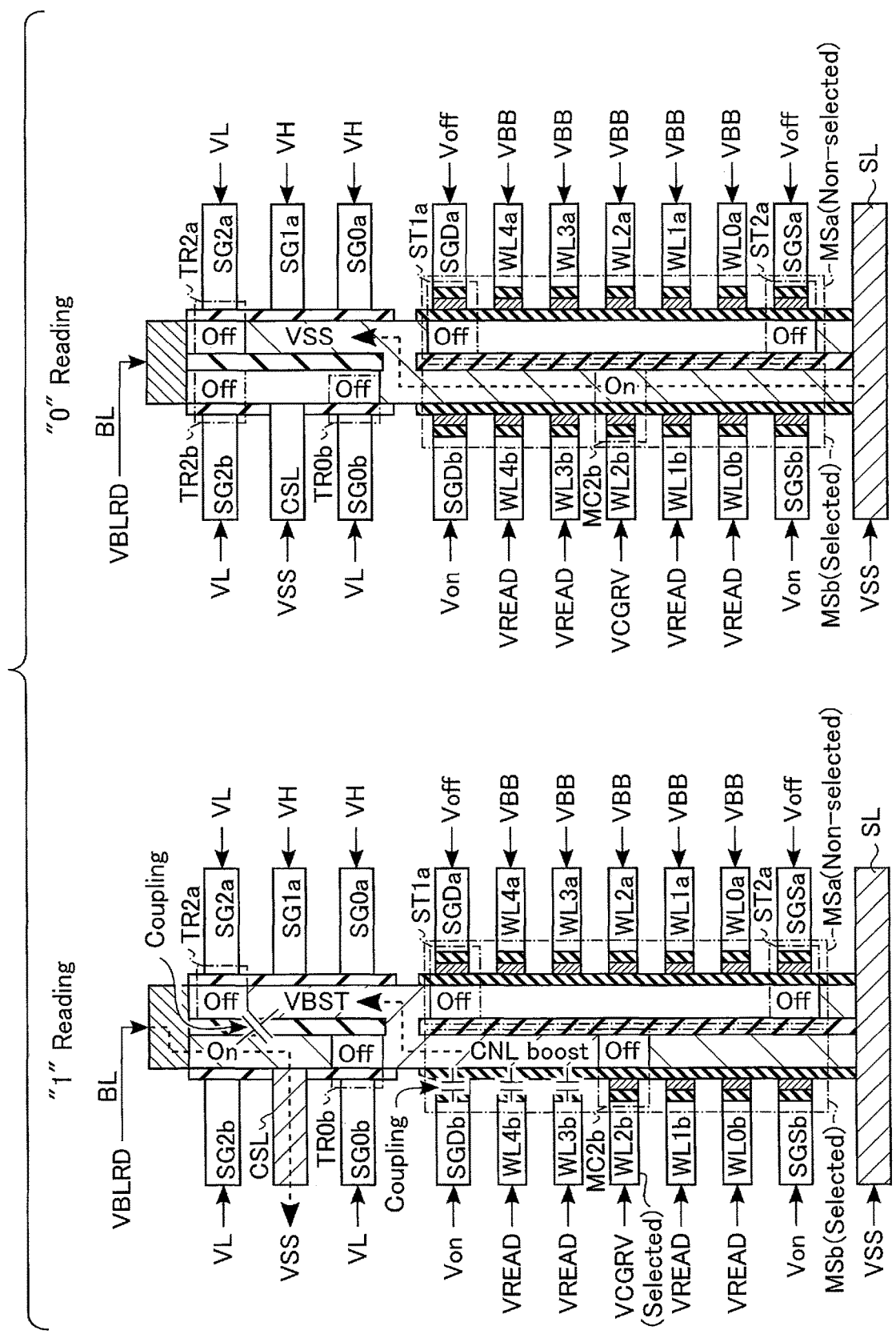
FIG. 42 is a diagram illustrating the reading operation of the semiconductor memory device according to a first example of the fifth embodiment.

Next, two examples of the reading operation will be described.
5.3.1 First Example
Next, a first example of the reading operation will be described with reference to FIG. 42. FIG. 42 illustrates an example of the voltage of each interconnect during the reading operation. A case where the memory cell transistor MC2b of the memory string MSb is selected will be described below.

As illustrated in FIG. 42, the voltages applied to the bit lines BL, the source lines SL, and each interconnect of the readout circuit unit RCU are the same as in FIG. 6 of the first embodiment.

In the selected memory string MSb in the memory pillar MP, the voltage Von is applied to the selection gate lines SGDb and SGSb. Accordingly, the selection transistors ST1b and STR2b are turned into the ON state. The read voltage VCGRV is applied to the selected word line WL2b, and the voltage VREAD is applied to the non-selected word lines WL0b, WL1b, WL3b and WL4b.

Further, voltage Voff is applied to the selection gate lines SGDa and SGSa of non-selected memory strings MSa. Accordingly, the selection transistors ST1a and ST2a are turned into the OFF state. As a result, the channel of the non-selected memory string MSa is brought into a floating state. For example, the negative voltage VBB is applied to the non-selected word lines WL0a to WL4a. The negative voltage VBB is a voltage that brings the memory cell transistor MC into the cutoff state regardless of the threshold voltage of the memory cell transistor MC.

In the memory pillar MP corresponding to the "1" reading operation, the memory cell transistor MC2b is turned into the OFF state. Therefore, the channel potentials of memory cell transistors MC3b and MC4b and selection transistor ST1b rise. In the readout circuit unit RCU, a voltage VBST caused by the rise of the channel potential is applied to the channel of the transistor TR1a. Then, capacitive coupling between the channel of the transistor TR1a and the channel of the transistor TR2b causes the voltage at the back gate of the transistor TR2b to rise, and the transistor TR2b is turned ON. As a result, bit line BL and cell source line CSL are electrically coupled, and a current flows from the bit line BL to cell source line CSL.

In the memory pillar MP corresponding to the "0" reading operation, the memory cell transistor MC2b is turned ON. Therefore, in the readout circuit unit RCU, the voltage VSS of the source line SL is applied to the channel of the transistor TR1a via the memory string MSb. In this case, the voltage of the back gate of the transistor TR2b does not rise, and the transistor TR2b is maintained in the OFF state. As a result, the bit line BL and cell source line CSL are not electrically coupled. In other words, no current flows from the bit line BL to the cell source line CSL.

Figure 43:
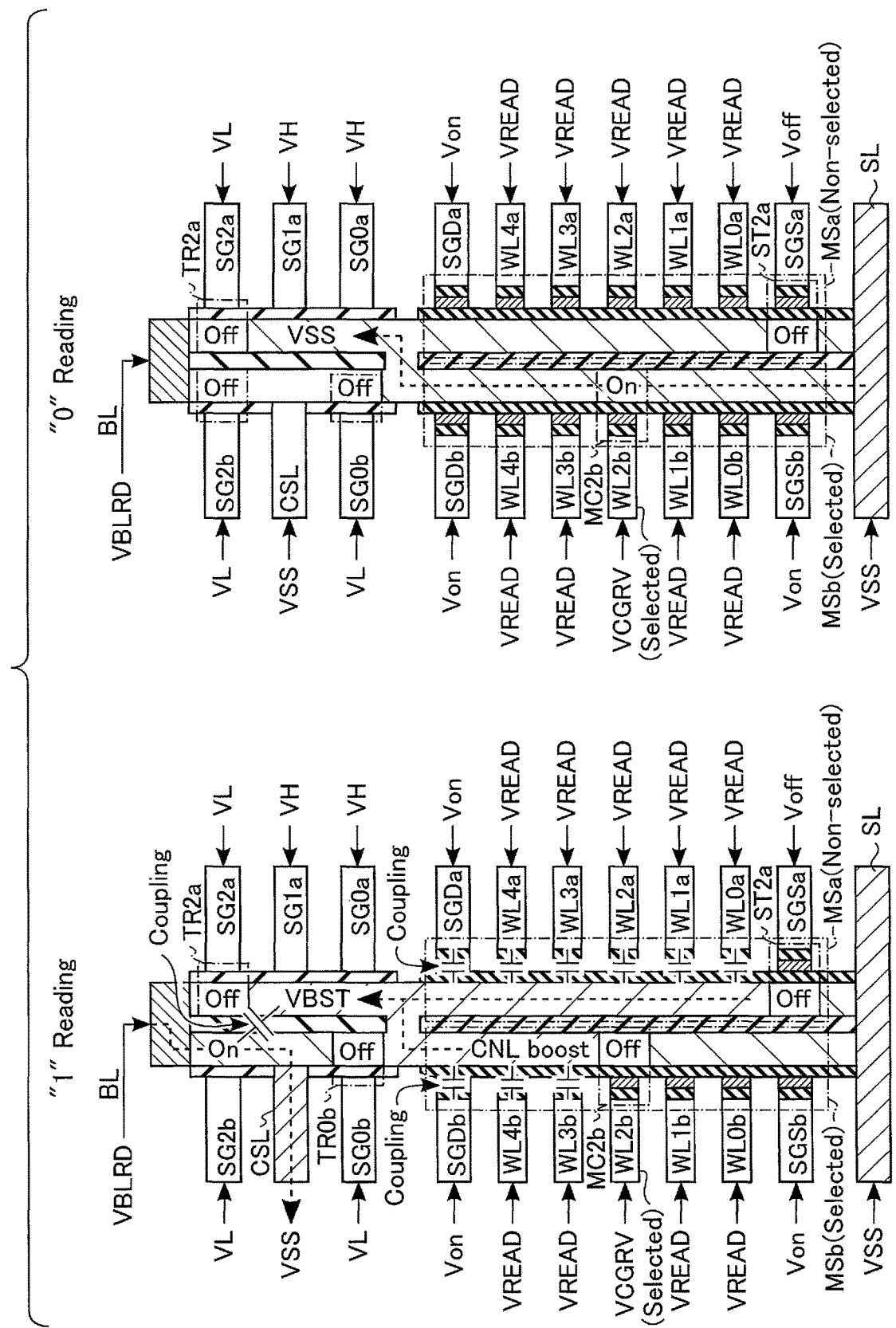
FIG. 43 is a diagram illustrating a reading operation of a semiconductor memory device according to a second example of the fifth embodiment.

5.3.2 Second Example
Next, a second example of the reading operation will be described with reference to FIG. 43. FIG. 43 illustrates an example of the voltage of each interconnect during the reading operation. Points different from the first example will be mainly described below.

As illustrated in FIG. 43, unlike the first example, the voltage Von is applied to the selection gate line SGDa of the non-selected memory string MSa, and the voltage VREAD is applied to the non-selected word lines WL0a to WL4a.

In the memory string MSb corresponding to the "1" reading operation, the memory cell transistor MC2b is turned into the OFF state. Therefore, the channel potentials of memory cell transistors MC3b and MC4b and selection transistor ST1b rise. Further, in the non-selected memory string MSa, the selection transistor ST2a is turned into the OFF state. Therefore, the channel potentials of memory cell transistors MC0a to MC4a and selection transistor ST1a rise. In the readout circuit unit RCU, the voltage VBST due to the above-mentioned increase of the channel potential is applied to the channel of the transistor TR1a. Then, capacitive coupling between the channel of the transistor TR1a and the channel of the transistor TR2b causes the voltage at the back gate of the transistor TR2b to rise, and the transistor TR2b is turned ON. As a result, bit line BL and cell source line CSL are electrically coupled, and a current flows from the bit line BL to cell source line CSL.

In the memory pillar MP corresponding to the "0" reading operation, the memory cell transistor MC2b is turned ON. Therefore, in the readout circuit unit RCU, the voltage VSS of the source line SL is applied to the channel of the transistor TR1a via the memory string MSb. In this case, the voltage of the back gate of the transistor TR2b does not rise, and the transistor TR2b is maintained in the OFF state. As a result, the bit line BL and cell source line CSL are not electrically coupled. In other words, no current flows from the bit line BL to the cell source line CSL.

5.4 Effects of Present Embodiment

With the configuration according to the present embodiment, the same effect as that of the first embodiment can be obtained.

Furthermore, with the configuration according to the second example of the present embodiment, the channel potential of the non-selected memory string MS can be raised in the "0" reading operation. Therefore, for example, when the selected memory cell transistor MC of the selected memory string MS is relatively close to the selection transistor ST1 and the voltage VBST cannot be sufficiently obtained, or even when an OFF current flows from the selected memory cell transistor MC to the source line SL side and thus the voltage VBST tends to decrease with time, the voltage VEST required for the reading operation in the readout circuit unit RCU can be obtained by the increase in the channel potential of the non-selected memory string MS.

It should be noted that the readout circuit unit RCU described in the fourth embodiment may be applied to the readout circuit unit RCU of the present embodiment.

Furthermore, although the case where the memory cell transistor MC is the FG type has been described in the present embodiment, it may be the MONOS type.

6. Sixth Embodiment

Next, a sixth embodiment will be described. In the sixth embodiment, the case where an oxide semiconductor memory is used will be described. Points different from the first to fifth embodiments will be mainly described.

6.1 Configuration

6.1.1 Cross-Sectional Configuration of Readout Circuit Unit and Memory Cell Array First, an example of the cross-sectional configuration of the readout circuit unit RCU and the memory cell array 18 will be described with reference to FIG. 44. It should be noted that in the example of FIG. 44, a part of the interlayer insulating film is omitted.

As illustrated in FIG. 44, a configuration of the readout circuit unit RCU is the same as that of FIG. 34 of the fourth embodiment. The readout circuit unit RCU is provided corresponding to the memory pillar MP. In the present embodiment, one memory pillar MP corresponds to one memory string MS.

Next, the cross-sectional configuration of the memory cell array 18 will be described. The memory string MS includes, for example, four memory cell transistors MC (MC0 to MC3), three cutoff transistors XG (XG0 to XG2), and a selection transistor ST1. It should be noted that the number of memory cell transistors MC and the cutoff transistors XG in the memory string MS may be selected as desired. For example, the number of cutoff transistors XG is one less than that of the memory cell transistors MC.

A plurality of the memory cell transistors MC and a plurality of the cutoff transistors XG are alternately layered in the Z direction, and the selection transistor ST1 is provided thereon. More specifically, the memory cell transistor MC0, the cutoff transistor XG0, the memory cell transistor MC1, the cutoff transistor XG1, the memory cell transistor MC2, the cutoff transistor XG2, the memory cell transistor MC3, and the selection transistor ST1 are sequentially stacked on the insulating layer 31, and their current paths are coupled in series. Then, the selection transistor ST1 is coupled to the corresponding readout circuit unit RCU via the semiconductor layer 40.

The cutoff transistor XG0 functions as a switch element for controlling charge transfer between the memory cell transistor MC0 and the memory cell transistor MC1. In the same manner, the cutoff transistor XG1 functions as a switch element for controlling transfer of charge between the memory cell transistor MC1 and the memory cell transistor MC2. The cutoff transistor XG2 functions as a switch element for controlling charge transfer between the memory cell transistor MC2 and the memory cell transistor MC3.

The gates of memory cell transistors MC0 to MC3 are coupled to word lines WL0 to WL3, respectively. The gates of cutoff transistors XG0 to XG2 are coupled to cutoff gate lines XL0 to XL2, respectively. Further, the gate of the selection transistor ST1 is coupled to the selection gate line SGD. The word lines WL0 to WL3, the cutoff gate lines XL0 to XL2, and the selection gate line SGD are coupled to row decoder 19.

The details of the cross-sectional configuration will be described below. An insulating layer 31 is formed on a semiconductor substrate 30. For example, $SiO_2$ is used as the insulating layers 31.

Above the insulating layer 31, eight interconnecting layers 70 that function respectively as the word line WL0, a cutoff gate line XL0, a word line WL1, a cutoff gate line XL1, a word line WL2, a cutoff gate line XL2, a word line WL3 and a selection gate line SGD are layered apart from each other in the Z direction. The interconnecting layers 70 extend in the X direction.

The interconnecting layers 70 are made of a conductive material. As the interconnecting layers 70, for example, the n-type semiconductor, the p-type semiconductor, or a metal material is used.

A memory pillar MP whose bottom surface reaches the insulating layer 31 through the eight interconnecting layers 70 is formed. The memory pillar MP according to the present embodiment includes the insulating layer 71, an oxide semiconductor layer 72, a core layer 73, and a cap layer 74.

More specifically, holes corresponding to the memory pillars MP are formed so that the bottom surfaces reach the insulating layer 31 through the interconnecting layers 70. An insulating layer 71 and an oxide semiconductor layer 72 are sequentially layered on side surfaces of the holes. The insulating layer 71 functions as a gate insulating film of the memory cell transistors MC0 to MC3, the cutoff transistors XG0 to XG2, and the selection transistor ST1. The oxide semiconductor layer 72 functions as a charge storing layer of the memory cell transistors MC0 to MC3. The oxide semiconductor layer 72 is a region where the channels of the memory cell transistors MC0 to MC4, the cutoff transistors XG0 to XG2, and the selection transistor ST1 are formed, and functions as current paths (signal lines) for transferring the charges to the charge storing layer.

The core layer 73 is formed with the side surface is in contact with the oxide semiconductor layer 72 and the bottom surface in contact with the insulating layer 31. On the oxide semiconductor layer 72 and the core layer 73, a cap layer 74 whose side surface is in contact with the insulating layer 71 is formed. It should be noted that the cap layer 74 may be omitted.

The material of the insulating layer 71 is selected, for example, from $SiO_2$, SiON, a high dielectric constant material (for example, aluminum oxide, hafnium oxide, or zirconium oxide). The insulating layer 71 may be a mixture film of these materials or a laminated film.

The material of the oxide semiconductor layer 72 is an oxide such as indium (In), gallium (Ga), zinc (Zn), tin (Sn), or a mixture (compound) of these oxides. For example, the material of the oxide semiconductor layer 72 is InGaZnO, InGaSnO, or the like. It should be noted that a material used for the oxide semiconductor layer 72 may be used for the cap layer 74.

For the core layer 73, $SiO_2$ is used, for example.

Memory cell transistors MC0 to MC3 are formed of memory pillars MP and four interconnecting layers 70 functioning as word lines WL0 to WL3, respectively. In the same manner, cutoff transistors XG0 to XG2 are formed of the memory pillars MP and the interconnecting layers 70 functioning as the cutoff gate lines XL0 to XL2, respectively. Further, the memory pillar MP and the interconnecting layer 70 functioning as the selection gate line SGD constitute the selection transistor ST1.

It should be noted that in the present embodiment, the source line SL is omitted. Further, in the memory pillar MP, the semiconductor layer functioning as a current path coupling the bit line BL and the source line SL is omitted.

6.1.2 Planar Configuration of Readout Circuit Unit and Memory Cell Array

Next, the planar configuration of readout circuit unit RCU and memory cell array 18 will be described with reference to FIG. 45. FIG. 45 illustrates the SG0 plane in the XY plane and the upper surface of the word line WL3 (hereinafter referred to as the "WL3 plane").

As illustrated in FIG. 45, the configuration on the SG0 plane is the same as FIG. 4 of the first embodiment.

Next, the WL3 plane will be described. A plurality of memory pillars MP penetrating through the word line WL3 (interconnecting layer 70) are staggered in two rows in the X direction. The insulating layer 71 and the oxide semiconductor layer 72 are sequentially layered on the side surface of the memory pillar MP, and the core layer 73 is formed inside the oxide semiconductor layer 72. In the example of FIG. 45, the region including the word line WL3 and the memory pillar MP constitute the memory cell transistor MC3.

6.2 Effects of Present Embodiment

With the configuration according to the present embodiment, the same effect as that of the first embodiment can be obtained.

Furthermore, with the configuration according to the present embodiment, the semiconductor memory device includes the memory pillar MP coupled to the readout circuit unit RCU having the latch function and including the oxide semiconductor layer 72. The oxide semiconductor layer 72 can be used as the charge storing layer of the memory cell transistor MC and a current path for transferring the charges stored in the charge storing layer of the to the readout circuit unit RCU.

7. Modifications, Etc.

A semiconductor memory device according to the above embodiment includes: a first interconnecting layer (33; WL) extending in a first direction (X direction); a first signal line (37) extending in a second direction (Z direction) intersecting the first direction and perpendicular to a substrate (30); a first memory cell (MC) that stores first information between the first interconnecting layer and the first signal line; a second interconnecting layer (SG0a) provided above the first interconnecting layer and extending in the first direction; a third interconnecting layer (SG1a) provided above the second interconnecting layer and extending in the first direction; a fourth interconnecting layer (SG2a) provided above the third interconnecting layer and extending in the first direction; a fifth interconnecting layer (SG0b) disposed apart from the second interconnecting layer in a third direction (Y direction) intersecting the first and second directions and extending in the first direction; a sixth interconnecting layer (CSL) disposed apart from the third interconnecting layer in the third direction and extending in the first direction; a seventh interconnecting layer (SG2b) disposed apart from the fourth interconnecting layer in the third direction and extending in the first direction; a second signal line (45) provided above the first signal line, coupled to the first signal line, disposed between the second interconnecting layer and the fifth interconnecting layer, between the third interconnecting layer and the sixth interconnecting layer, and between the fourth interconnecting layer and the seventh interconnecting layer, and extending in the second direction; a third signal line (45) provided above the first signal line signal line, coupled to the first and second signal lines and the sixth interconnecting layer, and disposed between the second signal line and the fifth interconnecting layer, between the second signal line and the sixth interconnecting layer, and between the second signal line and the seventh interconnecting layer, and extending in the second direction, a first transistor (TR0a) including the second interconnecting layer and the second signal line; a second transistor (TR1a) including the third interconnecting layer and the second signal line, a third transistor (TR2a) including the fourth interconnecting layer and the second signal line; a fourth transistor (TR0b) including the fifth interconnecting layer and the third signal line, and a fifth transistor (TR2b) including the seventh interconnecting layer and the third signal line.

By applying the above-described embodiment, the semiconductor memory device capable of improving the reliability can be provided.

The embodiment is not limited to the above-described embodiment, and various modifications are possible.

Further, the "coupling" in the above embodiment includes a state in which it is indirectly coupled with another something such as a transistor or a resistor interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first interconnecting layer extending in a first direction;
a first signal line extending in a second direction intersecting the first direction and perpendicular to a substrate;
a first memory cell that stores first information between the first interconnecting layer and the first signal line;
a second interconnecting layer provided above the first interconnecting layer and extending in the first direction;
a third interconnecting layer provided above the second interconnecting layer and extending in the first direction;
a fourth interconnecting layer provided above the third interconnecting layer and extending in the first direction;
a fifth interconnecting layer disposed apart from the second interconnecting layer in a third direction intersecting the first and second directions and extending in the first direction;
a sixth interconnecting layer disposed apart from the third interconnecting layer in the third direction and extending in the first direction;
a seventh interconnecting layer disposed apart from the fourth interconnecting layer in the third direction and extending in the first direction;
a second signal line provided above the first signal line, coupled to the first signal line, disposed between the second interconnecting layer and the fifth interconnecting layer, between the third interconnecting layer and the sixth interconnecting layer, and between the fourth interconnecting layer and the seventh interconnecting layer, and extending in the second direction;
a third signal line provided above the first signal line, coupled to the first and second signal lines and the sixth interconnecting layer, and disposed between the second signal line and the fifth interconnecting layer, between the second signal line and the sixth interconnecting layer, and between the second signal line and the seventh interconnecting layer, and extending in the second direction,
a first transistor including the second interconnecting layer and the second signal line;
a second transistor including the third interconnecting layer and the second signal line,
a third transistor including the fourth interconnecting layer and the second signal line;
a fourth transistor including the fifth interconnecting layer and the third signal line, and a fifth transistor including the seventh interconnecting layer and the third signal line.

2. The device according to claim 1, further comprising an eighth interconnecting layer provided between the third interconnecting layer and the fourth interconnecting layer in the second direction and extending in the first direction.

3. The device according to claim 1, further comprising:
a ninth interconnecting layer disposed apart from the first interconnecting layer in the third direction via the first signal line and extending in the first direction;
a fourth signal line provided between the first signal line and the ninth interconnecting layer, coupled to the second and third signal lines, and extending in the second direction;
a first insulating layer in contact with the first and fourth signal lines; and
a second memory cell that stores second information between the ninth interconnecting layer and the fourth signal line.

4. The device according to claim 1, further comprising:
a first conductive layer provided on the second and third signal lines;
a bit line coupled to the first conductive layer; and
a sense amplifier coupled to the bit line.

5. The device according to claim 1, wherein
the second and third signal lines are oxide semiconductors.

6. The device according to claim 1, wherein
in the writing operation, a first voltage is applied to the first interconnecting layer, a second voltage lower than the first voltage is applied to the second to fourth interconnecting layers, and a third voltage lower than the second voltage is applied to the fifth and seventh interconnecting layers.

7. The device according to claim 1, wherein
in the reading operation, a fourth voltage is applied to the first interconnecting layer, a fifth voltage higher than the fourth voltage is applied to the second and third interconnecting layers, and a sixth voltage lower than the fourth and fifth voltages is applied to the fourth, fifth and seventh interconnecting layers.

8. The device according to claim 3, wherein
in the writing operation, a seventh voltage is applied to the first interconnecting layer, an eighth voltage lower than the seventh voltage is applied to the second to fourth and ninth interconnecting layers, and a ninth voltage lower than the eighth voltage is applied to the fifth and seventh interconnecting layers.

9. The device according to claim 1, further comprising:
a charge storage layer provided between the first interconnecting layer and the first signal line;
a second insulating layer provided between the first interconnecting layer and the charge storage layer; and
a third insulating layer provided between the charge storage layer and the first signal line.

10. The device according to claim 2, further comprising:
a tenth interconnecting layer provided between the first interconnecting layer and the second interconnecting layer in the second direction and extending in the first direction;
an eleventh interconnecting layer provided between the tenth interconnecting layer and the second interconnecting layer in the second direction and extending in the first direction;
a twelfth interconnecting layer provided between the eleventh interconnecting layer and the second interconnecting layer in the second direction and extending in the first direction;
a transistor including the tenth interconnecting layer and the first signal line;
a third memory cell that stores third information between the eleventh interconnecting layer and the first signal line; and
a selection transistor including the twelfth interconnecting layer and the first signal line,
wherein the first signal line is an oxide semiconductor.

11. The device according to claim 10, wherein
in the writing operation, after the first information is stored in the first memory cell, the third information is stored in the third memory cell.

12. The device according to claim 10, wherein
in the reading operation, after the third information is read from the third memory cell, the first information of the first memory cell is transferred to the third memory cell, and the first information is read from the third memory cell.

13. A semiconductor memory device comprising:
a first interconnecting layer extending in a first direction;
a first signal line having one end coupled to a first conductive layer, and extending in a second direction intersecting the first direction and perpendicular to a substrate;
a first memory cell that stores first information between the first interconnecting layer and the first signal line;
a second signal line provided above the first signal line, having one end coupled to a second conductive layer, and the other end coupled to the first signal line, and extending in the second direction;
a third signal line provided above the first signal line, having one end coupled to the second conductive layer, and the other end coupled to the first signal line and the second signal line, and extending in the second direction;
a first insulating layer provided between the second signal line and the third signal line;
a second interconnecting layer provided above the first interconnecting layer and extending in the first direction;
a third interconnecting layer provided above the second interconnecting layer and extending in the first direction;
a fourth interconnecting layer provided above the third interconnecting layer and extending in the first direction;
a fifth interconnecting layer disposed apart from the second interconnecting layer in a third direction intersecting the first direction and the second direction, and extending in the first direction;
a sixth interconnecting layer disposed apart from the third interconnecting layer in the third direction, coupled to the third signal line, and extending in the first direction;
a seventh interconnecting layer disposed apart from the fourth interconnecting layer in the third direction and extending in the first direction;
a second insulating layer provided between the second signal line and the second interconnecting layer, between the second signal line and the third interconnecting layer, and between the second signal line and the fourth interconnecting layer;
a third insulating layer provided between the third signal line and the fifth interconnecting layer; and
a fourth insulating layer provided between the third signal line and the seventh interconnecting layer.

14. The device according to claim 13, further comprising an eighth interconnecting layer provided between the third interconnecting layer and the fourth interconnecting layer in the second direction and extending in the first direction, wherein
the second insulating layer is provided between the eighth interconnecting layer and the second signal line.

15. The device according to claim 13, further comprising:
a ninth interconnecting layer disposed apart from the first interconnecting layer in the third direction and extending in the first direction;
a fourth signal line provided between the first signal line and the ninth interconnecting layer, and having one end coupled to the second and third signal lines, and the other end coupled to the first conductive layer, and extending in the second direction,
a fifth insulating layer provided between the first signal line and the fourth signal line; and
a second memory cell that stores second information between the ninth interconnecting layer and the fourth signal line.

16. The device according to claim 13, further comprising a selection transistor provided between the first interconnecting layer and the second interconnecting layer.

17. The device according to claim 13, wherein
the second and third signal lines are oxide semiconductors.

18. The device according to claim 13, wherein
in the writing operation, a first voltage is applied to the first interconnecting layer, a second voltage lower than the first voltage is applied to the second to fourth interconnecting layers, and a third voltage lower than the second voltage is applied to the fifth and seventh interconnecting layers.

19. The device according to claim 13, wherein
in the reading operation, a fourth voltage is applied to the first interconnecting layer, a fifth voltage higher than the fourth voltage is applied to the second and third interconnecting layers, a sixth voltage lower than the fourth and fifth voltages is applied to the fourth, fifth and seventh interconnecting layers, a seventh voltage is applied to the second conductive layer, and an eighth voltage lower than the seventh voltage is applied to the first conductive layer.

20. The device according to claim 15, wherein
in the writing operation, a first voltage is applied to the first interconnecting layer, a second voltage lower than the first voltage is applied to the second to fourth and ninth interconnecting layers, and a third voltage lower than the second voltage is applied to the fifth and seventh interconnecting layers.

* * * * *